(12) United States Patent
Oikawa

(10) Patent No.: US 10,090,881 B2
(45) Date of Patent: Oct. 2, 2018

(54) SEMICONDUCTOR DEVICE

(71) Applicant: Renesas Electronics Corporation, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/298,563

(22) Filed: Oct. 20, 2016

(65) Prior Publication Data
US 2017/0141812 A1 May 18, 2017

(30) Foreign Application Priority Data

Nov. 13, 2015 (JP) .................................. 2015-223002
Feb. 19, 2016 (JP) .................................. 2016-030127

(51) Int. Cl.
H04B 1/10 (2006.01)
H04L 27/01 (2006.01)
H03H 7/30 (2006.01)
H03H 7/40 (2006.01)
H04B 3/18 (2006.01)
H01L 23/498 (2006.01)
H01L 25/10 (2006.01)
H03K 19/20 (2006.01)
H03K 5/159 (2006.01)
H04L 25/02 (2006.01)
(Continued)

(52) U.S. Cl.
CPC ......... *H04B 3/18* (2013.01); *H01L 23/49827* (2013.01); *H01L 23/49838* (2013.01); *H01L 25/105* (2013.01); *H03K 5/159* (2013.01); *H03K 19/20* (2013.01); *H04L 25/0264* (2013.01); *H04L 25/0288* (2013.01); *H04L 25/085* (2013.01); *H01L 23/3128* (2013.01); *H01L 23/49811* (2013.01); *H01L 2224/16145* (2013.01); *H01L 2224/16225* (2013.01); *H01L 2225/1058* (2013.01); *H01L 2924/15311* (2013.01); *H04B 2203/00* (2013.01)

(58) Field of Classification Search
USPC .............. 375/229–236, 240, 240.26–240.27, 375/240.29, 284, 285, 295, 346, 347, 348, 375/349, 350, 340, 343, 354, 358
See application file for complete search history.

(56) References Cited

U.S. PATENT DOCUMENTS 5,216,301 A * 6/1993 Gleeson ................. H03K 5/131
327/119
5,740,199 A * 4/1998 Sibigtroth ................ H04L 5/16
370/212
(Continued)

FOREIGN PATENT DOCUMENTS

EP          0539830 A2 *  5/1993   ......... G01R 31/2841
JP         02-072711 A     3/1990
JP        2004-297411 A   10/2004

*Primary Examiner* — Linda Wong
(74) *Attorney, Agent, or Firm* — Mattingly & Malur, PC

(57) ABSTRACT

The present invention provides a semiconductor device realizing suppression of increase in consumption power. A semiconductor device has a signal line, a reception buffer circuit which is coupled to an end of the signal line and to which a signal is supplied from the signal line, and a delay element which is wired-OR coupled to an end of the signal line and shapes waveform of a signal at the end of the signal line.

5 Claims, 41 Drawing Sheets

(51) Int. Cl.
    *H04L 25/08*     (2006.01)
    *H01L 23/31*     (2006.01)

(56) References Cited

U.S. PATENT DOCUMENTS

| | | | |
|---|---|---|---|
| 6,188,596 B1* | 2/2001 | Holst | G11C 5/025 365/230.03 |
| 6,285,723 B1* | 9/2001 | Yamada | G06F 1/04 327/229 |
| 6,674,308 B2* | 1/2004 | Henderson | G11C 15/04 326/104 |
| 8,490,598 B2* | 7/2013 | Qu | F02P 15/10 123/406.12 |
| 9,413,462 B2* | 8/2016 | Onaka | H04B 10/2918 |
| 9,705,505 B2* | 7/2017 | Satou | H03K 19/1774 |
| 2002/0093347 A1* | 7/2002 | Henderson | G11C 15/04 324/678 |
| 2002/0130716 A1* | 9/2002 | Larson | H03F 1/3229 330/151 |
| 2006/0023996 A1* | 2/2006 | Nakagawa | H04J 14/0206 385/24 |
| 2006/0233011 A1* | 10/2006 | Matsuoka | G11C 15/00 365/49.17 |
| 2007/0127404 A1* | 6/2007 | Best | H04J 3/02 370/314 |
| 2009/0067209 A1* | 3/2009 | Matsuoka | G11C 15/00 365/49.18 |
| 2009/0161270 A1* | 6/2009 | Beatty, Jr. | H02H 1/0015 361/42 |
| 2011/0110452 A1* | 5/2011 | Fukamachi | H01P 1/20336 375/267 |
| 2011/0187349 A1* | 8/2011 | Yamamoto | G01R 31/2822 324/119 |
| 2013/0265836 A1* | 10/2013 | Seningen | G11C 7/08 365/194 |
| 2014/0112508 A1* | 4/2014 | Ma | H04R 25/453 381/318 |

* cited by examiner

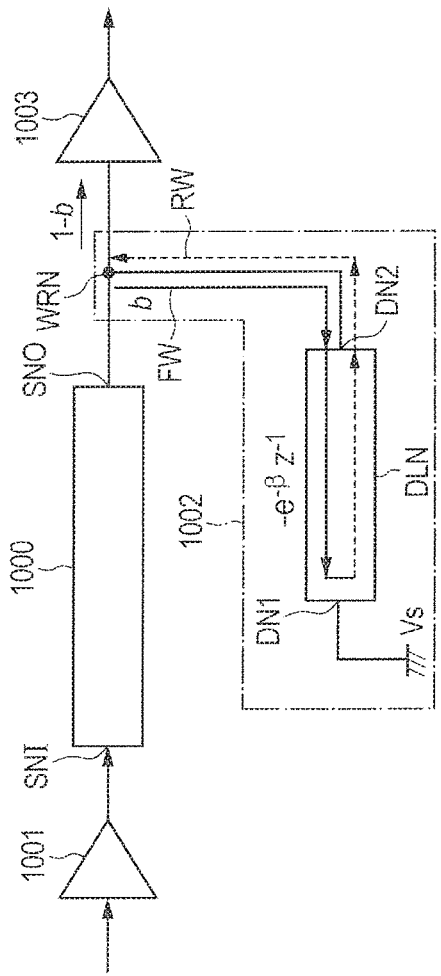
FIG. 1A
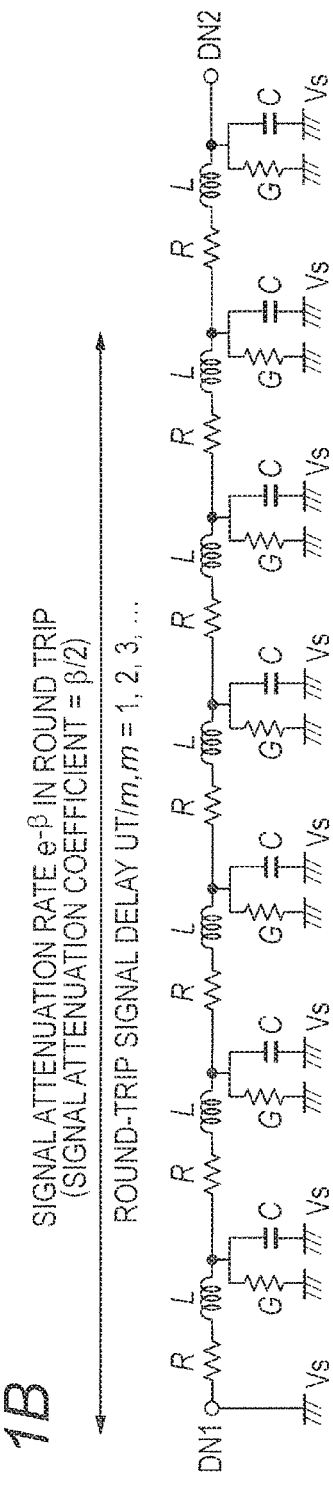
FIG. 1B
FIG. 1C
$$H(z) = \frac{1}{1 + \sum_{n=1}^{\infty} \frac{b}{1-b} e^{-n\beta} z^{-n}} ; z = e^{-s \cdot (UT/m)} \; m = 1, 2, 3, \ldots \quad \cdots \text{EQUATION (1)}$$

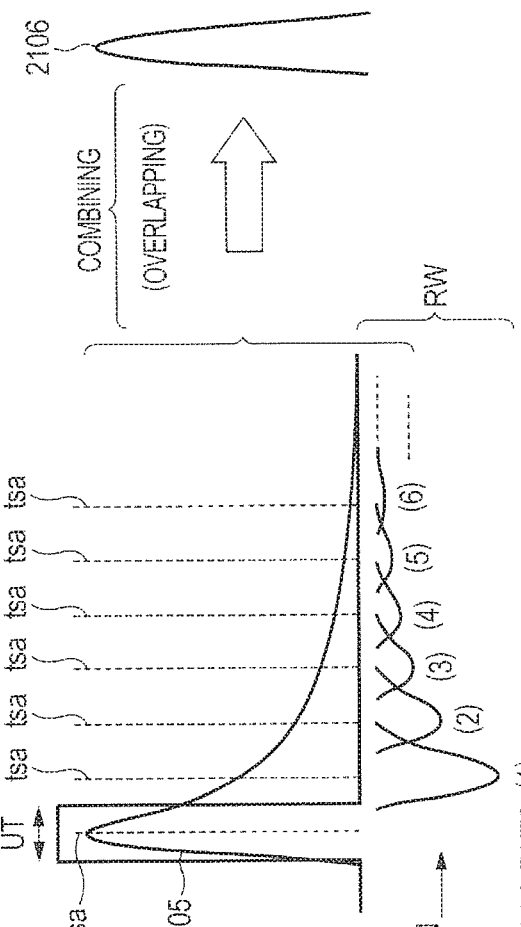
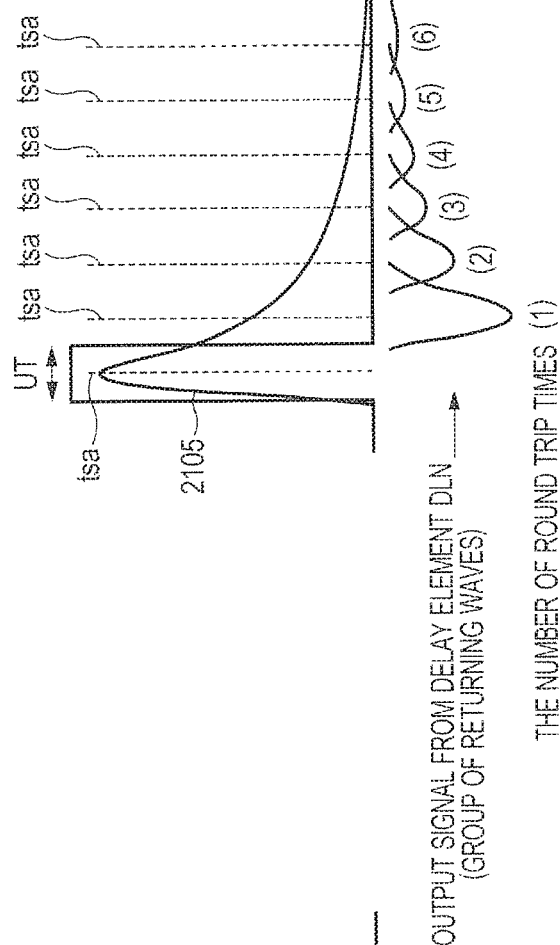

FIG. 3

$$H(z) = \frac{1-b}{(1-b)+be^{-\beta}z^{-1}+be^{-2\beta}z^{-2}+\cdots} = \frac{1}{1+\sum_{n=1}^{\infty}(\frac{b}{1-b}e^{-n\beta})z^{-n}};$$

$$b = b_0(1+ce^{-n\gamma}); \quad z = e^{-s\cdot(UT/m)} \quad \cdots\cdots \text{EQUATION (2)}$$

$$S(z) = \sum_{n=0}^{\infty} h_n z^{-n} = h_0\left[1+\sum_{n=1}^{\infty}\left\{ae^{-n\alpha_1}+(1-a)e^{-n\alpha_2}\right\}z^{-n}\right] \quad \cdots\cdots \text{EQUATION (3)}$$

$$H_{total}(z) = H(z)S(z) = S(z)H(z) \approx h_0 \frac{1+\sum_{n=1}^{\infty}(ae^{-n\alpha_1}+(1-a)e^{-n\alpha_2})z^{-n}}{1+\sum_{n=1}^{\infty}\left\{b_0 e^{-n\beta}+b_0 ce^{-n(\beta+\gamma)}\right\}z^{-n}} \quad \cdots\cdots \text{EQUATION (4)}$$

$$H_{total}(z) \approx h_0 \quad \cdots\cdots \text{EQUATION (5)}$$

$$b_0 = a, \quad c = \frac{1-a}{a}, \quad \beta = \alpha_1, \quad \beta+\gamma = \alpha_2 \quad \cdots\cdots \text{EQUATION (6)}$$

$$b = \left|\frac{Z_c - Z_0}{Z_c + Z_0}\right|; \quad Z_c = \sqrt{L/C} \quad \cdots\cdots \text{EQUATION (7)}$$

FIG. 5A

FUNCTION BLOCK CORRESPONDENCE TABLE

| DIGITAL FILTER CIRCUIT 2102 | DIGITAL FILTER 1002 |
|---|---|
| n-TH MULTIPLICATION CIRCUIT | LOSS IN DELAY ELEMENT AFTER n TIMES OF ROUND TRIPS |
| n-TH DELAY CIRCUIT | DELAY IN DELAY ELEMENT AFTER n TIMES OF ROUND TRIPS |
| ADDITION CIRCUIT | WIRED-OR-COUPLING TO SIGNAL LINE AND PREDETERMINED VOLTAGE COUPLING (PHASE INVERSION) |

FIG. 5B

FUNCTION COMPARISON TABLE

| | DIGITAL FILTER CIRCUIT 2102 | DIGITAL FILTER 1002 |
|---|---|---|
| THE NUMBER OF MULTIPLICATION CIRCUITS | FINITE NUMBER | INFINITE NUMBER |
| THE NUMBER OF DELAY CIRCUITS | FINITE NUMBER | INFINITE NUMBER |
| SAMPLING CYCLE | UT | ARBITRARY |
| DEGREE OF FREEDOM OF MULTIPLIER COEFFICIENT | ARBITRARY | ONLY MONOTONIC DECREASE |

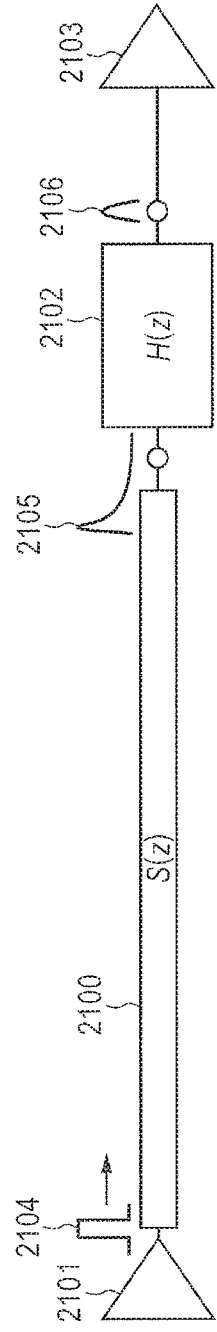
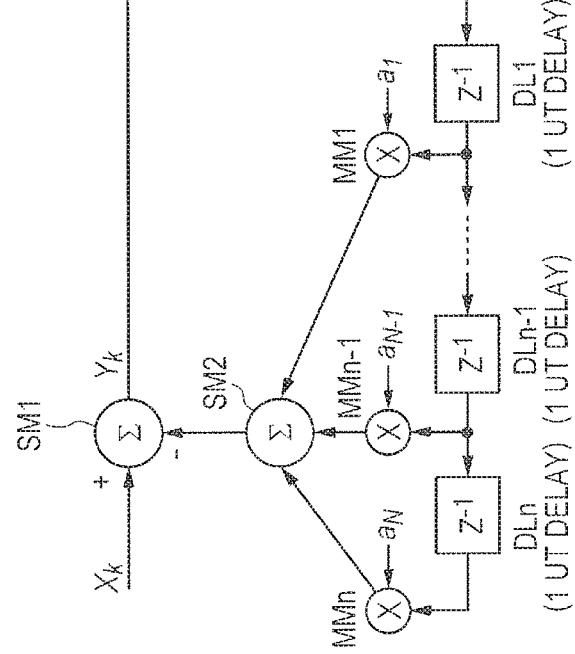
FIG. 21A
FIG. 21B

FIG. 22

$$S(z) = \sum_{k=0}^{\infty} h_k z^{-n}$$ ····· EQUATION (8)

$$H(z) = \frac{1}{1 + a_1 z^{-1} + a_2 z^{-2} + a_3 z^{-3} \cdots} = \frac{1}{1 + \sum_{k=1}^{N} a_k z^{-n}}$$ ····· EQUATION (9)

$$z = e^{-s \cdot UT}$$ ····· EQUATION (10)

$$H_{total}(z) = S(z)H(z) = h_0 \frac{1 + \sum_{k=1}^{\infty} (h_k / h_0) z^{-n}}{1 + \sum_{k=1}^{N} a_k z^{-n}}$$ ····· EQUATION (11)

$$a_k = h_k / h_0$$ ····· EQUATION (12)

$$H_{total}(z) \approx h_0$$ ····· EQUATION (13)

FIG. 23
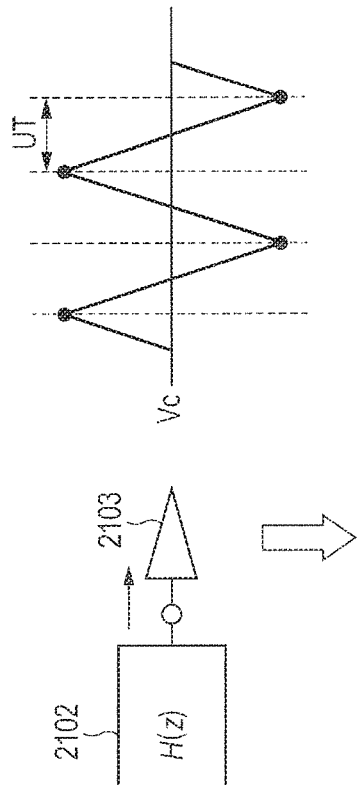
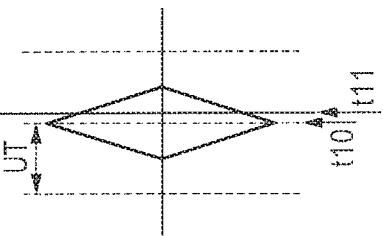

$$Z_{DF} = 2Z_{SE} \quad \cdots \cdots \quad \text{EQUATION (14)}$$

$$1/(2N \times UT) \sim m/(2UT) \quad \cdots \cdots \quad \text{EQUATION (15)}$$

$$\Delta t / \tau \quad \cdots \cdots \quad \text{EQUATION (16)}$$

SEMICONDUCTOR DEVICE

CROSS-REFERENCE TO RELATED APPLICATIONS

The disclosure of Japanese Patent Application No. 2016-030127 filed on Feb. 19, 2016 and No. 2015-223002 filed on Nov. 13, 2015 including the specification, drawings and abstract is incorporated herein by reference in its entirety.

BACKGROUND

The present invention relates to a semiconductor device and relates to, for example, a semiconductor device having a signal line transmitting a high-speed signal and a semiconductor device having a plurality of semiconductor chips mounted over a print substrate and transmitting a high-speed signal among the semiconductor chips via signal lines of the print substrate.

A semiconductor device capable of transmitting or receiving a high-speed signal, for example, a signal whose transfer speed is 25 Gbps or higher is demanded. For example, in the case of transmitting/receiving signals between semiconductor devices, the signals are transmitting/received by using a serial communication system capable of reducing the influence caused by a timing deviation among the signals received and also suppressing increase in the number of terminals. In this case, for example, the semiconductor device is provided with a so-called SerDes (Serializer-Deserializer) circuit. A parallel signal formed by a process in the semiconductor device is converted to a high-speed signal (serial signal) of 25 Gbps or higher by the SerDes circuit and the high-speed signal is transmitted from the semiconductor device. The high-speed signal of 25 Gbps or higher received by the semiconductor device is converted to, for example, a parallel signal by the SerDes circuit, and a process on the parallel signal obtained by the conversion is performed in the semiconductor device.

The semiconductor device as described above is used for, for example, network control. In the case of using the semiconductor device for network control, a semiconductor device having the SerDes circuit and a semiconductor device as a component of a volatile memory are mounted on an interposer which is mounted on a print substrate. The semiconductor device having the SerDes circuit transmits/receives a high-speed signal of 25 Gbps or higher via a signal line formed in the print substrate. For example, the semiconductor device having the SerDes circuit controls the semiconductor device as a component of the volatile memory on the basis of the received high-speed signal, writes data, converts data read from the semiconductor device as a component of the volatile memory to a high-speed signal (serial signal), and transmits the high-speed signal to another semiconductor device and/or an electronic device via the signal line in the print substrate.

Since the high-speed signal is transmitted/received via the signal line, a distortion occurs in the signal waveform. To shape the distorted waveform, for example, an analog filter circuit formed by a passive element was used. In recent years, to improve the reception performance, in place of the analog filter circuit, a digital filter circuit formed by an active element such as a transistor is used.

Patent literature 1 describes a technique related to a digital filter circuit. Patent literature 2 describes a technique related to a signal line.

RELATED ART LITERATURE

Patent Literature

Patent Literature 1: Japanese Unexamined Patent Application Publication No. Hei 2 (1990)-72711
Patent Literature 2: Japanese Unexamined Patent Application Publication No. 2004-297411

SUMMARY

By using a digital filter circuit in place of an analog filter circuit, reception performance can be largely improved. However, when the transmission speed of a signal increases to 32 Gbps and 54 Gbps, accordingly, the digital filter circuit has to be operated at clock frequency of 32 GHz and 54 GHz.

The difficulty level of designing the digital filter circuit which operates at high clock frequency becomes high. Not only the difficulty level of designing but also a problem that consumption power increases due to high-speed operation occurs.

Patent literature 1 discloses a technique related to a digital filter circuit. It is assumed that the digital filter circuit described in the patent literature 1 is formed by an active element. Consequently, in the case of processing a high-speed signal, consumption power of the digital filter circuit increases. Patent literature 2 discloses a technique related to a signal line. However, a technique of shaping deterioration of a waveform which occurs due to propagation in a signal line is not described.

The other problems and novel features will become apparent from the description of the specification and appended drawings.

To facilitate understanding of the problem, first, a technique examined by the inventors of the present invention prior to the present invention will be described.
Examination by Inventors FIGS. 21A and 21B are explanatory diagrams illustrating a technique examined by the inventors of the present invention prior to the present invention. Illustrated in FIG. 21A are a signal line 2100, a transmission buffer circuit 2101, a digital filter circuit 2102, and a reception buffer circuit 2103. From the transmission buffer circuit 2101, signals are supplied in series to the signal line 2100. The signal from the transmission buffer circuit 2101 is supplied to the digital filter circuit 2102 (transmitted) via the signal line 2100, and an output from the digital filter circuit 2102 is supplied to the reception buffer circuit 2103.

The digital filter circuit 2102 and the reception buffer circuit 2103 are included in an SerDes circuit provided for a first semiconductor device and comprised of a plurality of active elements. The transmission buffer circuit 2101 is included in an SerDes circuit provided for a second semiconductor device and comprised of a plurality of active elements. An example of the active element is a transistor. The signal line 2100 is configured by a signal line formed on a print substrate on which the first and second semiconductor devices are mounted. With the configuration, a signal generated by the second semiconductor device is output from the transmission buffer circuit 2101 to the signal line 2100, a signal from the signal line 2100 is supplied to the reception buffer circuit 2103 via the digital filter circuit 2102 in the first semiconductor device, and a signal output from the reception buffer circuit 2103 is processed in the first semiconductor device.

Since there is a loss in the signal line 2100, when a signal is transmitted in the signal line 2100, degradation occurs in the waveform of the signal (signal waveform).

In FIG. 21A, 2104 indicates a transmission waveform output from the transmission buffer circuit 2101 to the signal line 2100. In FIG. 21A, 2105 indicates a filter input waveform which is input from the signal line 2100 to the digital filter circuit 2102, and 2106 indicates a filter output waveform which is output from the digital filter circuit 2102. For explanation, FIG. 21A illustrates the case where an impulse signal whose voltage changes in an impulse state is output as the transmission waveform 2104. In FIG. 21A, the horizontal axis of each of the transmission waveform 2104, the filter input waveform 2105, and the filter output waveform 2106 indicates time, and the vertical axis indicates voltage.

When the transmission waveform 2104 whose voltage changes in an impulse state is input to one of the ends of the signal line 2100, due to a loss in the signal line 2100, degradation occurs in the filter input waveform which is output from the other end of the signal line 2100. In the example illustrated in FIG. 21A, the transmission waveform 2104 has an impulse-state waveform and, on the other hand, the filter input waveform 2105 is a waveform of voltage which rises steeply and, after that, gradually decreases.

By properly setting the characteristics of the digital filter circuit 2102, changes in the signal waveform in the signal line 2100 can be equalized, and the restored (shaped) signal waveforms can be output as the filter output waveform 2106 from the digital filter circuit 2102. By the above, the filter output waveform 2106 can be made a waveform approximated to the transmission waveform 2104. From the viewpoint of equalization, the digital filter circuit 2102 can be regarded as an equalizer.

FIG. 21B is a block diagram illustrating the configuration of the digital filter circuit 2102. The digital filter circuit 2102 has addition circuits SM1 and SM2, multiplication circuits MM1 to MMn, and delay circuits DL1 to DLn. The addition circuits SM1 and SM2, the multiplication circuits MM1 to MMn, and the delay circuits DL1 to DLn are comprised of active elements such as transistors.

The addition circuit SM1 performs subtraction between the filter input waveform 2105 and the output of the addition circuit SM2, outputs the result of the subtraction as the filter output waveform 2106, and supplies it to the delay circuit DL1. The delay circuits DL1 to DLn are coupled in series and each of delay circuits delays for predetermined time (delay time) and, after that, supplies the delayed signal to the delay circuit in the next stage. Outputs of the delay circuits DL1 to DLn are supplied to corresponding multiplication circuits MM1 to MMn, respectively. The multiplication circuits MM1 to MMn perform multiplication between corresponding coefficients $a_1$ to $a_N$ and the corresponding delay circuits DL1 to DLn and supply the addition results to the addition circuit SM2. The addition circuit SM2 adds the outputs of the multiplication circuits MM1 to MMn and supplies the result of addition to the addition circuit SM1.

Delay time in each of the delay circuits DL1 to DLn corresponds to time of one data width interval (UT delay). On the other hand, a signal output from the transmission buffer circuit 2101 to the signal line 2100 changes in cycles according to the transmission speed of a signal which is transmitted. The time of one data width interval is proportional to the cycle of the transmission speed of the signal. Consequently, the voltage of the filter output waveform 2106 which was output in the past is multiplied with the coefficients $a_1$ to $a_N$ and the resultant is subtracted from the filter input waveform 2105. Therefore, by setting proper coefficients $a_1$ to $a_N$, the filter output waveform output from the digital filter circuit 2102 can be shaped to a proper waveform. In FIG. 21B, $X_k$ indicates a digital value of the filter input waveform, and $Y_k$ indicates a digital value of the filter output waveform.

To equalize degradations in the signal waveforms in the signal line 2100, the digital filter circuit 2102 has a transfer function (inverse transfer function) inverse to the transfer function of the signal line 2100. That is, it is set so that when the transfer function of the signal line 2100 and the transfer function (inverse transfer function) of the digital filter circuit 2102 are multiplied, a constant is derived.

First, when the transfer function of the signal line 2100 is expressed in Z transformation notation, the transfer function S(z) of the signal line 2100 can be expressed as the equation (8) in FIG. 22. $h_k$ indicates impulse response of the signal line 2100. Next, when the transfer function H(z) of the digital filter circuit 2102 is expressed in Z transformation notation, it can be expressed as the equation (9) in FIG. 22, and the Z transformation code z can be expressed as the equation (10) in FIG. 22. UT expresses time in one data width interval.

When the transfer function S(z) of the signal line 2100 and the transfer function H(z) of the digital filter circuit 2102 are multiplied, a multiplied transfer function $H_{total}(z)$ is expressed as the equation (11) in FIG. 22. When the coefficient $a_k$ is replaced as expressed by the equation (12) in FIG. 22, the transfer function $H_{total}(z)$ is expressed as the equation (13) in FIG. 22. That is, the transfer function $H_{total}(z)$ becomes a constant, the waveform deteriorated by the loss in the signal line 2100 is restored by the digital filter circuit 2102, and the shaped filter output waveform 2106 can be obtained. The coefficient $a_k$ corresponds to coefficients $a_1$ to $a_N$ supplied to the multiplication circuits MM1 to MMn illustrated in FIG. 21B. When a proper value of the coefficient $a_k$ is obtained in some way, the signal waveform deteriorated through the signal line can be restored by numerical operation. In the equation (13), the multiplied transfer function $H_{total}(z)$ is an approximation equal sign and coupled to a constant $h_o$. To make is a complete equal sign (=), the number of multiplication circuits MM1 to MMn illustrated in FIG. 21B has to be an infinite.

It is, however, impossible to make the number of multiplication circuits MM1 to MMn infinite. By increasing the number of multiplication circuits, power consumption increases and the area occupied by the digital filter circuit 2102 is also enlarged. Consequently, the number of multiplication circuits MM1 to MMn is determined within the range of the allowable consumption power and the occupied area.

In the case of the digital filter circuit 2102, it is requested to select any of the following two options. Option 1) The number of arithmetic circuits and delay circuits configuring the digital filter circuit are decreased to reduce consumption power. In the case of selecting the option 1, waveform reproduction precision is suppressed.

Option 2) The number of arithmetic circuits and delay circuits configuring the digital filter circuit are increased to make the waveform reproduction precision high. In the case of selecting the option 2, increase in power consumption and the occupied area occurs. That is, it is difficult to satisfy both reduction in consumption power (occupied area) and improvement of the waveform reproduction precision. Also in the case of selecting the option 1), the clock signal operating the arithmetic circuit and the delay circuit becomes high frequency, so that the consumption power increases.

In the case of using the digital filter circuit 2102, there are restrictions by not only the consumption power and occupied area but also the sampling theorem. FIG. 23 is a diagram for explaining the restrictions by the sampling theorem. In the case of performing a numerical operation by the digital filter circuit 2102, the waveforms of a signal have to be discretized every data width interval UT. That is, it is requested to sample the waveform in the sampling cycle corresponding to the time of the one data width interval UT.

In FIG. 23, the filter input waveform 2105 is indicated in the upper left part, the digital filter circuit 2102 and the reception buffer circuit 2103 are illustrated in the upper center part, and the filter output waveform 2106 is illustrated in the upper right part. In FIG. 23, the horizontal axis of each of the filter input waveform 2105 and the filter output waveform 2106 indicates time, and the vertical axis indicates voltage. It is assumed here that the voltage of each of the filter input waveform 2105 and the filter output waveform 2106 changes in the vertical directions with respect to predetermined voltage Vc as a reference voltage.

In the lower center part in FIG. 23, the change in the voltage at the input terminal of the reception buffer circuit 2103 is illustrated as an eye pattern (eye-diagram). The horizontal axis of the eye pattern indicates time, and the vertical axis indicates voltage. The eye pattern is generated by overlapping filter output waveforms supplied to the input terminal of the reception buffer circuit 2103 when the same filter input waveform is repeatedly supplied to the digital filter circuit 2102.

FIG. 23 illustrates, for explanation, the case where the transfer function H(z) of the digital filter circuit 2102 is 1. In each of the filter input waveform 2105, the filter output waveform 2106, and the eye pattern, UT indicates time of one data width interval, and broken lines indicate sampling timings. The case where the sampling cycle as the interval between the sampling timings is the same as the time of one data width interval is illustrated.

In the digital filter circuit 2103, prior to the arithmetic process, the filter input waveform 2105 is sampled at the sampling timings indicated by the broken lines, and the arithmetic process is performed on discrete data obtained by the sampling. Consequently, even if the filter input waveform 2105 has a waveform close to a trapezoid shape, the filter output waveform after passing through the digital filter circuit 2102 becomes a polygonal-line waveform as illustrated in FIG. 23. The eye pattern at the input terminal of the reception buffer circuit 2103 becomes a rhomboid-shaped pattern obtained by overlapping the polygonal line waveforms. When the eye pattern becomes the rhomboid shape, if the timing of fetching the voltage at the input terminal by the reception buffer circuit 2103 deviates, the reception level decreases. For example, in the eye pattern in FIG. 23, when the fetch timing deviates from time t10 to t11, the reception level of the reception buffer circuit 2103 largely decreases.

By increasing the sampling frequency to, for example, several times and also increasing the clock signal which operates the arithmetic circuit and the delay circuit configuring the digital filter circuit 2102 to several times, the filter output waveform 2106 closer to the filter input waveform 2105 can be generated. Even if the fetch timing deviates, large decrease in the reception level can be prevented. However, since the frequency of the clock signal which operates the arithmetic circuit and the delay circuit configuring the digital filter circuit 2102 becomes higher, the consumption power of the digital filter circuit 2102 increases. In addition, when the clock frequency becomes higher, timing design of the delay circuit and the like becomes harder.

Means for Solving the Problems

A semiconductor device according to an embodiment has a signal line, a first circuit which is coupled to an end of the signal line and to/from which a signal is supplied from/to the signal line, and a delay element which is wired-OR coupled to an end of the signal line and shapes the waveform of a signal at the end of the signal line.

A part of a signal from the signal line or a signal to the signal line is transmitted to the delay element at the wired-OR coupled end. In the delay element, a returning wave based on the part of the signal supplied is transmitted to the wired-OR coupled end. By the operation, the waveform of the signal from the signal line or the signal to the signal line is shaped by the returning wave. Since the waveform of a signal is shaped by the delay element as a passive element, even the transmission speed of a signal passing through the signal line becomes higher, increase in consumption power at the time of shaping the waveform of the signal can be suppressed. Therefore, the semiconductor device realizing suppression of increase in consumption power can be provided.

According to the embodiment, the semiconductor device realizing suppression of increase in consumption power can be provided.

BRIEF DESCRIPTION OF THE DRAWINGS

FIGS. 1A to 1C are diagrams illustrating a basic configuration of a digital filter according to a first embodiment.

FIGS. 2A to 2C are waveforms illustrating the operation of the digital filter according to the first embodiment.

FIG. 3 is a diagram for explaining the digital filter according to the first embodiment.

FIGS. 5A and 5B are tables comparing the digital filter according to the first embodiment and a digital filter circuit configured by an active element.

FIGS. 21A and 21B are explanatory diagrams illustrating a technique examined by the inventors of the present invention.

FIG. 22 is a diagram for explaining the technique examined by the inventors of the present invention.

FIG. 23 is a diagram for explaining the technique examined by the inventors of the present invention.

DETAILED DESCRIPTION

Figure 4:
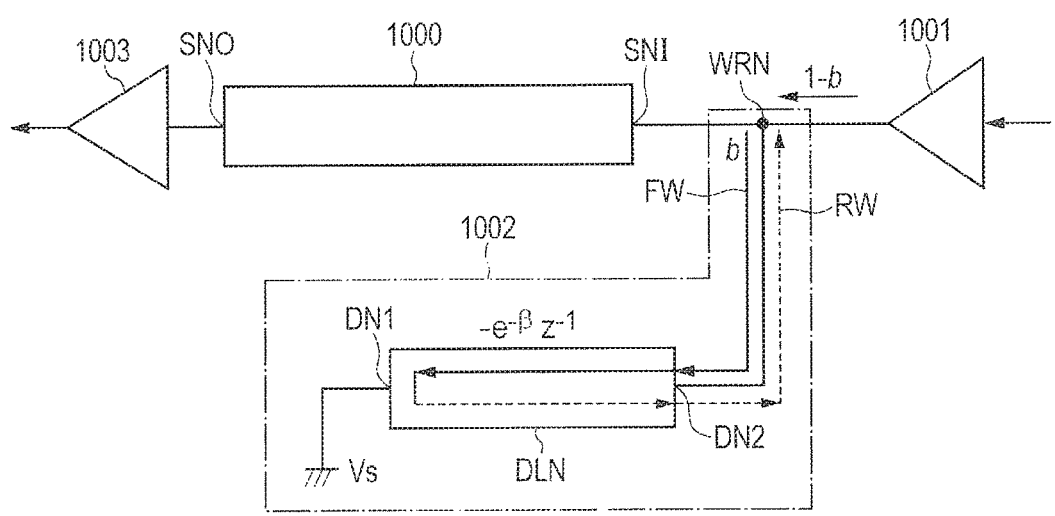
FIG. 4 is a block diagram illustrating a configuration that the digital filter according to the first embodiment is coupled to a transmission buffer circuit.

Hereinafter, embodiments of the present invention will be described in detail with reference to the drawings. In all of the drawings for explaining the embodiments, in principle, the same reference numerals are designated to the same parts and repetitive description will not be given.

First Embodiment

Basic Configuration of Digital Filter

First, the basic configuration of a digital filter provided in a semiconductor device according to a first embodiment will be described. The semiconductor device having therein the digital filter will be described specifically later.

FIGS. 1A to 1C are diagrams illustrating a basic configuration of the digital filter according to the first embodiment. FIG. 1A is a block diagram illustrating the configuration of the digital filter, FIG. 1B is an equivalent circuit diagram of the digital filter of FIG. 1A, and FIG. 1C is a diagram of the transfer function of the digital filter illustrated in FIG. 1A.

In FIG. 1A, 1000 denotes a signal line (signal transmission path). It is assumed that the signal line 1000 has a pair of ends in FIG. 1A. In the diagram, SNO denotes one of ends of the signal line 1000 and SNI denotes the other end of the signal line 1000. Illustrated in FIG. 1A are a transmission buffer circuit (second circuit) 1001, a digital filter 1002, and a reception buffer circuit (first circuit) 1003.

As will be specifically described later, the semiconductor device according to the first embodiment has a print substrate, a plurality of interposers mounted on the print substrate, and semiconductor chips mounted on the interposers. Since the semiconductor device has a plurality of semiconductor chips mounted on the print substrate, it can be also regarded as an electronic device (including so-called SIP and MCM). However, in the specification, when it is unnecessary to clarify, a device including a print substrate, interposers, and semiconductor chips will be also called a semiconductor device. Similarly, in the present specification, when it is unnecessary to clarify, a device having interposers and semiconductor chips mounted on the interposers will be also called a semiconductor device. Further, in the specification, when it is unnecessary to clarify, a semiconductor chip will be also called a semiconductor device.

As will be specifically described later, the reception buffer circuit 1003 illustrated in FIG. 1A is formed in a first semiconductor chip mounted on a first interposer, and the transmission buffer circuit 1001 is formed in a second chip mounted on a second interposer different from the first interposer. The first and second interposers are mounted on the same print substrate. The signal line 1000 illustrated in FIG. 1A expresses a signal wire electrically coupling the transmission buffer circuit 1001 formed in the second semiconductor chip and the reception buffer circuit 1003 formed in the first semiconductor chip. The signal wire includes, for example, a signal wire (wiring pattern) formed in the print substrate.

The digital filter 1002 has a delay element DLN having a pair of ends DN1 and DN2. The delay element DLN is comprised of a delay wire (signal wire) having a predetermined length, and a pair of ends of the signal wire corresponds to the pair of ends DN1 and DN2. The end DN2 of the delay element DLN is wired-OR-coupled to an end SNO of the signal line 1000. Specifically, at a node WRN, the end DN2 of the delay element DLN and the end SNO of the signal line 1000 are electrically coupled. The node WRN is electrically coupled to the input terminal (input node) of the reception buffer circuit 1003. The other end DN1 of the delay element DLN is electrically coupled to predetermined voltage Vs. In FIG. 1A, the predetermined voltage Vs is ground voltage of the circuit.

The transmission buffer circuit 1001 receives a serial signal to be transmitted and supplies it to an end SNI as one of ends of the signal line 1000. The supplied serial signal passes through the signal line 1000 and reaches the end SNO of the signal line 1000. The signal reached the end SNO of the signal line 1000 is distributed to the reception buffer circuit 1003 and the digital filter 1002. The ratio of distribution is indicated as a distribution ratio "b" of the signal. The signal of the distribution ratio "b" in signals at the end SNO of the signal line 1000 is input (supplied) as an input signal FW to the end DN2 of the delay element DLN. The remaining signal, that is, a signal 1-b is supplied to the input terminal of the reception buffer circuit 1003.

Since the other end DN1 of the delay element DLN in the digital filter 1002 is coupled to the predetermined voltage Vs (ground voltage of the circuit), the impedance of the other end DN1 of the delay element DLN is smaller than that of the end DN2 of the delay element DLN. Consequently, the input signal FW input to the end DN2 of the delay element DLN returns on the side of the other end DN1, and a returning signal indicated by a broken line is output as an output signal RW from the end DN2 of the delay element DLN to the wired-OR-coupling part (node WRN). Since the delay element DLN has a loss, the output signal RW output from the end DN2 attenuates as compared with the input signal FW input to the end DN2. The output signal RW is delayed from the input signal FW. Since the end DN2 of the delay element DLN which is wired-OR-coupled in the node WRN is an end at which a signal is input and output, the end DN2 can be regarded as an input/output end or an input/output terminal.

FIG. 1B is an equivalent circuit diagram of the delay element DLN illustrated in FIG. 1A. The delay element DLN is expressed by a distributed constant circuit. Although not limited, each of a plurality of distributed constant circuits is expressed as a π-type distributed constant circuit, and the π-type distributed constant circuit is comprised of an inductance L, a resistance R, a capacitance C, and a conductance G. The equivalent circuit of the delay element DLN is expressed so that a plurality of inductances L and a plurality of resistors R are coupled in series between the ends DN2 and DN1, and a plurality of conductances G and capacitances C are coupled in parallel between the delay element DLN and the predetermined voltage Vs (the ground voltage of the circuit).

In the equivalent circuit illustrated in FIG. 1B, as described above, the delay element DLN has a loss due to the influence of the inductance L, the resistance R, the capacitance C and so on, and the output signal RW attenuates as compared with the input signal FW. When the attenuation coefficient of the signal (signal attenuation coefficient) is set as $\beta/2$, the signal attenuation coefficient of a period in which a signal is input to the end DN2 is output from the end DN2 (round-trip signal attenuation coefficient) in the delay element DLN is expressed as $e^{-\beta}$. Since a round trip of a signal is considered, the attenuation coefficient of a round trip is expressed as $\beta/2 \times 2 = \beta$. On the other hand, delay time required for a signal to make a round trip (round-trip delay time) is determined by the ratio UT/m between the data width interval UT and a coefficient "m". In this case, the coefficient "m" is an integer 1, 2, 3, . . . . In FIG. 1A, the signal making a round trip in the delay element DLN is drawn as the input signal FW and the output signal (returning wave) RW.

The output signal RW output from the end DN2 of the delay element DLN is combined with a signal from the signal line 1000 at the node WRN by the wired-OR coupling. Since the output signal RW is a returning wave in the combination, it works so as to decrease the absolute value of the signal from the signal line 1000. Since the round-trip delay time of the signal in the delay element DLN is a fraction of an integer of one data width interval UT, the absolute value of the signal from the signal line 1000 is adjusted so as to decrease by one or plural returning waves from the delay element DLN. If the round-trip delay time is not a fraction of the integer of the one data width interval UT, it is considered that the returning wave from the delay element DLN works on the signal from the signal line 1000 so as to increase the absolute value at the node WRN and the signal from the signal line 1000 deteriorates.

When the end DN1 of the delay element DLN is in the floating state, the impedance in the end DN1 becomes higher than that in the end DN2, and the output signal RW output from the end DN2 of the delay element DLN comes to have a traveling wave. As a result, it may happen that the traveling wave is combined with the signal from the signal line 1000 in the node WRN and a signal supplied to the input terminal of the reception buffer circuit 1003 becomes a deteriorated signal. Consequently, in the first embodiment, the end DN1 of the delay element DLN is coupled to the predetermined voltage Vs.

The time of the round-trip signal delay UT/m is determined so as to be a fraction of an integer of the one data width interval UT in consideration of the length of the delay element DLN, that is, the distance between the ends DN1 and DN2 and width, thickness, material, and the like of the delay wire configuring the delay element DLN.

FIG. 1C is a diagram illustrating the transfer function of the delay element DLN. In FIG. 1C, the equation (1) expresses the transfer function H(z) of the delay element DLN in Z transformation notation. In the equation (1), s indicates Laplace coefficient. As described above, "b" indicates the distribution ratio of the signal, UT indicates one data width interval, and m expresses an integer.

Operation of Digital Filter

Next, the operation of the digital filter 1002 illustrated in FIG. 1A will be described. FIGS. 2A to 2C are waveform charts illustrating the operation of the digital filter 1002. The horizontal axis of each of the diagrams indicates time, and the vertical axis indicates voltage. FIG. 2A indicates the transmission waveform 2104 supplied from the transmission buffer circuit 1001 (FIG. 1A) to the end SNI of the signal line 1000 (FIG. 1A). FIGS. 2B and 2C indicate the waveforms of the signal in the part (node WRN) which is wired-OR coupled. FIG. 2B indicates combination of the filter input waveform 2105 from the signal line 1000 and the waveform of the output signal RW from the delay element DLN realized by the wired-OR coupling in the node WRN. FIG. 2C indicates the filter output waveform 2106 formed by the coupling in FIG. 2B. Since the signal at the node WRN is supplied to the input terminal of the reception buffer circuit 1003, it can be regarded that FIG. 2C illustrates the waveform of the input signal or reception signal of the reception buffer circuit 1003.

A serial signal according to a predetermined transmission speed is supplied to the transmission buffer circuit 1001, and a transmission signal corresponding to the supplied serial signal is supplied to the end SNI of the signal line 1000. To facilitate explanation, the transmission waveform 2104 whose voltage changes in an impulse state is input to the end SNI of the signal line 1000.

The transmission wavelength 2104 input to the end SNI of the signal line 1000 is transmitted to the end SNO of the signal line 1000. Since the signal line 1000 has a loss, a waveform deteriorated from the transmission waveform 2104 is generated as the filter input wavelength 2105. Since the transmission waveform 2104 changes in an impulse shape, as illustrated in FIG. 2B, the filter input waveform 2105 output from the transmission line 1000 has a shape that the voltage rises steeply and gradually decreases. A part of the output signal (filter input waveform 2105) from the signal line 1000 is input to the end DN2 of the delay element DLN in the node WRN. As described with reference to FIG. 1A, a part of the supplied output signal (filter input waveform 2105) is output to the node WNR as an attenuated returning wave after the round-trip delay time in the delay element DLN.

That is, after the round-trip delay time, the output signal RW from the delay element DLN is transmitted to the part of the wired-OR-coupling. Since the waveform at this time is a returning wave, it is a waveform whose phase is inverted from that of the output signal (filter input waveform 2105), and the value of the output signal is a value attenuated from the output signal (filter input waveform 2105). In the wired-OR-coupling part, that is, the node WNR, the output signal (filter input waveform 2105) and the output signal RW (waveform of the returning wave) from the delay element DLN are combined. In FIG. 2B, the output signal RW generated by a round trip in the delay element is indicated by the reference numeral (1). The round trip is generated infinite number of times. In FIG. 2B, as an example, the output signals RW generated by second to sixth round trips are indicated by reference numerals (2) to (6). As attenuation occurs each time a signal makes a round trip in the delay element DLN, the value of the output signal RW generated by a round trip gradually decreases.

It is desirable to provide the wired-OR-coupling part, that is, the node WNR near the input terminal of the reception buffer circuit 1003. The reason is as follows. An impedance exists also between the node WNR and the input terminal of the reception buffer circuit 1003. When the node WNR and the input terminal of the reception buffer circuit 1003 are apart, the impedance increases and it becomes undesirable when the value of the impedance is considered. The resistance R or conductance G per unit length of the delay element DLN is larger than the resistance or conductance per unit length of the signal line 1000.

Since the filter input waveform 2105 at the node NRN and the waveform of the output signal RW (for example, the waveforms of the reference numerals (1) to (6)) are combined by wired-OR-coupling, the waveforms are overlapped. As a result, the filter output waveform 2106 supplied to the input terminal of the reception buffer circuit 1003 has a shape similar to the transmission waveform 2104 as illustrated in FIG. 2C. As a result, the filter output waveform 2106 supplied to the input terminal of the reception buffer circuit 1003 comes to have a shape similar to the transmission waveform 2104 as illustrated in FIG. 2C. That is, the waveform is restored (shaped).

The operation of the delay element DLN will be described more briefly as follows. A part of a filter input signal (filter input waveform 2105) sent from the signal line 1000 is input to the end DN2 of the delay element DLN. However, as there is no exit, the part returns to the end DN2 (input terminal). At this time, the resistance or conductance per unit length of the delay element DLN is made larger than that of the signal line 1000, and the end DN1 of the delay element DLN is pinned to the predetermined voltage Vs such as the ground voltage of the circuit. By the operation, the phase as illustrated by the reference numeral (1) in FIG. 2B (the polarity using the predetermined voltage Vs as a reference) is inverted, and the attenuated signal returns to the wired-OR-coupling part (node WRN). Since the impedance of the wired-OR-coupling part (node WRN) and that of the end DN1 of the delay element DLN are different, the signal once input from the signal line 1000 to the delay element DLN repeats returning in the delay element DLN, the output signal RW attenuated indicated by the reference numerals (2) to (6) or the like returns to the wired-OR-coupling part and is combined with the filter input waveform 2105.

The filter input waveform 2105 passed though the signal line 1000 has a shape which is trailed from the impulse-shaped waveform (rectangular waveform) as illustrated in FIG. 2B and is combined with the group of waveforms (waveforms indicated by the reference numerals (1) to (6) and the like) of the output signal RW generated by the delay element DLN, thereby eliminating the tail part to reconstruct a signal waveform close to the original rectangular wave.

In FIG. 2B, UT indicates one data width interval as described above. Time tsa indicates the timings at which the output signal RW from the delay element DLN becomes a peak. Consequently, it can be regarded that time between adjacent times tsa corresponds to round-trip delay time in the delay element DLN. Since FIGS. 2A to 2C illustrate the case where the coefficient "m" described with reference to FIGS. 1A to 1C is 1, the time between the adjacent times tsa is the same as the time of one data width interval UT.

By increasing the coefficient "m" described with reference to FIGS. 1A to 1C in integers, the number of round trips in the delay element DLN in predetermined time can be increased. That is, the number of waveforms of the output signal RW of the delay element DLN combined with the filter input waveform 2105 can be increased in predetermined time, and the filter output waveform 2106 supplied to the input terminal of the reception buffer circuit 1003 can be made closer to the transmission waveform 2104. The coefficient "m" is preferably, for example, about four.

As described with reference to FIGS. 2A to 2C, in the case of performing a process by the digital filter circuit 2102, the filter input waveform 2105 from the signal line 2100 is sampled and a process is performed by the arithmetic circuit. In this case, the times tsa illustrated in FIG. 2B can be regarded as sampling timings of sampling the filter input waveform 2105, and an arithmetic operation by the arithmetic circuit is performed on digital values obtained by the sampling using the time between the adjacent times tsa as the sampling cycle.

In the first embodiment, the digital filter is configured by the delay element DLN formed by the delay wire as the passive element. Consequently, a signal waveform in which deterioration occurs due to transmission through the signal line 1000 can be restored (shaped) while reducing power consumption. When the time tsa illustrated in FIG. 2B is considered as a sampling timing, the digital filter according to the first embodiment can be regarded as equivalently infinite number of arithmetic circuits in arbitrary sampling cycles. While reducing the consumption power, the signal waveform can be restored (shaped) with high precision.

Although not illustrated in FIG. 1A, each of the signal line 1000 and the delay element DLN is disposed so as to be parallel to a voltage wire to which predetermined voltage is supplied. The end DN1 of the delay element DLN is coupled to the voltage wire disposed in parallel to the delay element DLN. A signal loss per unit length in the delay element DLN and a voltage wire disposed in parallel to the delay element DLN is set larger than that per unit length of the signal line.

Next, the digital filter 1002 illustrated in FIG. 1A will be described using the transfer function in the Z transformation notation. As illustrated in FIG. 21B, the digital filter circuit 2102 is comprised of an active element. On the other hand, as illustrated in FIG. 1A, the digital filter 1002 according to the first embodiment is comprised of a passive element. Also even in the filter comprised of the passive element, digital computation is performed on the transfer function as will be described later. Consequently, in the present specification, although the filter is comprised of the passive element, it is called a digital filter.

FIG. 3 is a diagram for explaining the digital filter according to the first embodiment. In a manner similar to the above description, the round-trip delay time of the delay element DLN is expressed as UT/m. In this case, the coefficient "m" is an integer 1, 2, 3, 4 . . . . The round-trip signal attenuation rate of the delay element DLN is expressed as $e^{-\beta}$.

The transfer function H(z) of the digital filter 1002 is expressed by the equation (2) in FIG. 3. In this case, "b" indicates the distribution ratio of the signal and $b_0$, c, and γ indicate variables. On the other hand, the transfer function S(z) of the signal line 1000 is expressed by the equation (3) in FIG. 3. In the equation (3), $h_0$ and "a" indicate variables. The deterioration factors of deteriorating signals propagating through the signal line 1000 are a skin effect and a dielectric loss. In the equation (3), $\alpha_1$ indicates a loss by the skin effect and $\alpha_2$ indicates the dielectric loss.

The total transfer function $H_{total}(z)$ obtained by multiplying the transfer function of the signal line 1000 and the transfer function of the digital filter 1002 is expressed by the equation (4) in FIG. 3. From the equation (4), a condition that the transfer function $H_{total}(z)$ becomes a constant $h_0$ which is substantially constant as expressed by the equation (5) in FIG. 3 exists. For example, by making a setting as expressed by the equation (6) in FIG. 3, the constant $h_0$ which is substantially constant is obtained. That is, by using the digital filter 1002, the signal line 1000 can be equalized.

In the equation (4), H(z)S(z) expresses the case where the digital filter 1002 is provided on the side of the transmission buffer circuit 1001, and S(z)H(z) expresses the case where the digital filter 1002 is provided on the side of the reception buffer circuit 1003. That is, the digital filter 1002 may be coupled near the input terminal of the reception buffer circuit 1003 or near the output terminal of the transmission buffer circuit 1001.

FIG. 4 is a block diagram illustrating a configuration in the case of coupling the digital filter 1002 to the output terminal of the transmission buffer circuit 1001. FIG. 4 is similar to FIG. 1A and the different point is that the digital filter 1002 is coupled to the output terminal of the transmission buffer circuit 1001. Specifically, a predetermined part of a signal wire coupling the output terminal of the transmission buffer circuit 1001 and the end SNI of the signal line 1000 is the node WRN, and the end DN2 of the delay element DLN as a component of the digital filter 1002 is wired-OR-coupled to the node WRN.

In this case, the waveform of a signal in the node WRN is deformed (adjusted) in advance by an output signal (returning wave) from the digital filter 1002 so that the waveform of a signal output from the end SNO of the signal line 1000 is shaped to a waveform similar to the transmission waveform output from the output terminal of the transmission buffer circuit 1001. Since the operation of the digital filter 1002 is similar to that described with reference to FIGS. 1A to 10 to FIG. 3, the description will not be repeated.

FIGS. 5A and 5B are tables of comparison between the digital filter 2102 and the digital filter 1002. FIG. 5A illustrates comparison in the functional blocks and FIG. 5B illustrates comparison in functions.

As illustrated in FIG. 21B, the digital filter circuit 2102 is comprised of function blocks such as the multiplication circuits MM1 to MMn, the addition circuits SM1 and SM2, and the delay circuits DL1 to DLn. In the digital filter 1002 according to the first embodiment, the function blocks are replaced by physical coupling of physical amounts and the ends of the delay element DLN. Specifically, as illustrated in FIG. 5A, the "n-th multiplication circuit" in the digital filter circuit 2102 is replaced by "loss in delay element after n times of round trips" in the digital filter 1002, and the "n-th delay circuit" is replaced by "delay in delay element after n times of round trips". Further, "addition circuit" in the digital filter circuit 2102 is replaced by "wired-OR-coupling to signal line and predetermined voltage coupling (phase inversion)" in the digital filter 1002.

FIG. 5B illustrates the case of comparing the functions between the digital filter circuit 2102 and the digital filter 1002 according to the first embodiment. Specifically, in the digital filter circuit 2102, only "finite number" of multiplication circuits can be provided in reality. In contrast, in the digital filter 1002, the function of a multiplication circuit is realized by a loss of the delay element, so that "infinite number" of equivalent multiplication circuits can be provided. Similarly, in the digital filter circuit 2102, only "finite number" of delay circuits can be provided in reality. In contrast, in the digital filter 1002, the function of a delay circuit is realized by a delay of the delay element DLN, so that "infinite number" of equivalent delay circuits can be provided.

Further, in a sampling cycle of sampling a signal transmitted in the signal line is one data width interval "UT" in the digital filter circuit 2012 and, in contrast, an equivalent sampling cycle in the digital filter 1002 is "arbitrary". The equivalent sampling cycle corresponds to the round-trip delay time UT/m. Although the equivalent sampling cycle is "arbitrary", desirably, it is set to round-trip delay time (equivalent sampling cycle) determined by the coefficient "m" of an integer.

The degree of freedom of multiplier coefficients $a_1$ to $a_N$ (FIG. 21) supplied to the multiplication circuits configuring the digital filter circuit 2102 can be "arbitrarily" determined in the digital filter circuit 2102. In the digital filter 1002, as an equivalent multiplier coefficient is realized by attenuation of the delay element DLN, the degree of freedom of the multiplier coefficient is "only monotonic decrease". However, for example, by amplifying a signal supplied to the input terminal of the reception buffer circuit 1003, a signal at an arbitrary voltage level can be output from the reception buffer circuit 1003.

In the digital filter 1002 according to the first embodiment, the multiplier coefficient is "only monotonic decrease" as written in FIG. 5B. It is consequently desirable to amplify the waveform of a reconstructed (shaped) signal in the reception buffer circuit 1003 and the like.

As described above, in the digital filter 1002 according to the first embodiment, in a manner similar to the digital filter circuit 2102 illustrated in FIG. 21, the signal line 1000 can be equalized, and consumption power can be reduced. The number of equivalent multiplication circuits is infinite and time resolution of the digital filter can be made many times of that of the digital filter circuit 2102. Therefore, large reduction of consumption power and improvement in signal waveform decoding precision can be realized.

General Configuration of Semiconductor Device

Figure 6:
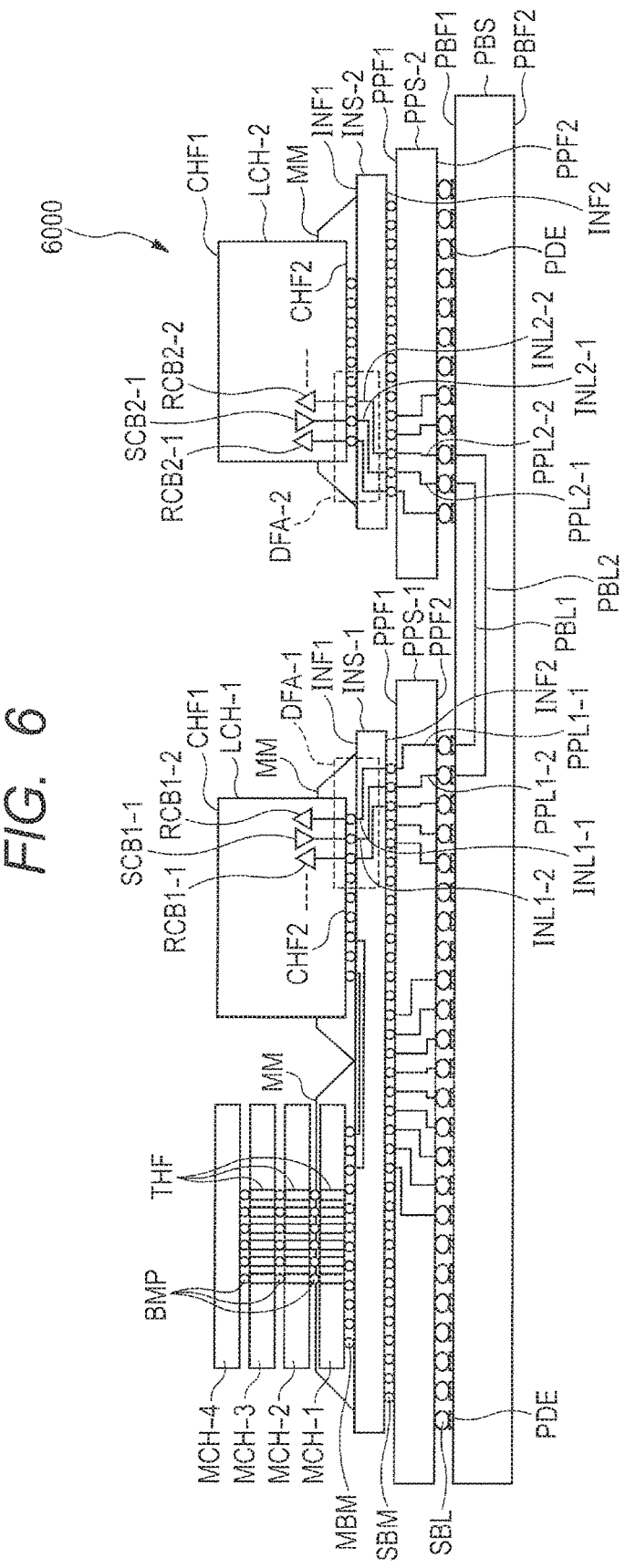
FIG. 6 is a cross section illustrating a section of a semiconductor device according to the first embodiment.

Next, the general configuration of the semiconductor device according to the first embodiment will be described. In the semiconductor device described here, the digital filter 1002 described in FIG. 1 is incorporated. FIG. 6 is a cross section illustrating a section of a semiconductor device 6000 according to the first embodiment. The semiconductor device 6000 has a print substrate PBS, a plurality of package substrates mounted over the print substrate PBS, and a plurality of interposers mounted over the package substrates. Further, over each of the interposers, a semiconductor chip is mounted. Consequently, the semiconductor device 6000 according to the first embodiment can be regarded as an electronic device having a plurality of semiconductor chips.

To facilitate description, in FIG. 6, two package substrates PPS-1 and PPS-2 mounted over the print substrate PBS are illustrated. The interposer mounted over the package substrate PPS-1 is indicated as reference numeral INS-1, and the interposer mounted over the package substrate PPS-2 is indicated as reference numeral INS-2.

FIG. 6 illustrates the case where, although not limited, a plurality of semiconductor chips MCH-1 to MCH-4 (third semiconductor chips) and LCH-1 (first semiconductor chip) are mounted over the first interposer INS-1 (first interposer), and one semiconductor chip LCH-2 (second semiconductor chip) is mounted over the interposer INS-2 (second interposer). Obviously, the number of semiconductor chips mounted over each of the interposers and the like is an example and the present invention is not limited to the number. In the semiconductor device 6000 according to the first embodiment, the semiconductor chips MCH-1 to MCH-4 as a part of the semiconductor chips mounted over the interposer INS-1 are stacked stereoscopically (three-dimensionally) and the semiconductor chip LCH-1 as a part of the semiconductor chips is mounted flatly (two-dimensionally). Specifically, in the top view of the interposer INS-1, the semiconductor chips MCH-1 to MCH-4 are disposed so as to overlap one another in a predetermined first region in the interposer INS-1, and the semiconductor chip LCH-1 is disposed in a predetermined second region different from the predetermined first region in which the semiconductor chips MCH-1 to MCH-4 are disposed.

Each of the semiconductor chips MCH-1 to MCH-4 is, for example, a memory semiconductor chip storing information, and the semiconductor chip LCH-1 is a logic semiconductor chip performing transmission/reception of information, control, and the like on the memory semiconductor chips MCH-1 to MCH-4. The logic semiconductor chip LCH-1 can be also stereoscopically stacked over the interposer INS-1. For example, although the memory semiconductor chips MCH-1 to MCH-4 may be stacked over the logic semiconductor chip LCH-1, since each of the semiconductor chips generates heat, as illustrated in FIG. 6, it is desirably to stereoscopically stack only the memory semiconductor chips MCH-1 to MCH-4 and mount the logic semiconductor chip in the second region different from the memory semiconductor chips MCH-1 to MCH-4.

The print substrate PBS has a first main surface PBF1 and a second main surface PBF2 opposed to the first main surface PBF1 and further has, between the first and second main surfaces PBF1 and PBF2, a plurality of conductive layers and a plurality of insulating layers alternately sandwiched. The plurality of conductive layers are stacked while sandwiching the insulating layers so as to be electrically separated. On the first main surface PBF1 of the print substrate PBS, a plurality of ball electrodes PDE are formed. In FIG. 6, to avoid the drawing from becoming complicated, the reference characters PDE are designated only to the rightmost ball electrode and the leftmost ball electrode. The ball electrodes formed over the first main surface PBF1 of the print substrate PBS, for example, two ball electrodes are electrically coupled to each other via a predetermined wiring pattern formed by the conductive layer in the print substrate PBS. In FIG. 6, as an example of wiring patterns formed by the conductive layers in the print substrate PBS, wiring patterns (signal wires) PBL1 and PBL2 are illustrated.

The package substrate PPS-1 also has a first main surface PPF1 and a second main surface PPF2 opposed to the first main surface PPF1 and has a plurality of conductive layers and a plurality of insulating layers sandwiched between the first and second main surfaces PPF1 and PPF2. The plurality of conductive layers are stacked while sandwiching the insulating layers. On the first main surface PPF1 of the package substrate PPS-1, a plurality of bump electrodes (not illustrated) are formed. On the second main surface PPF2 of the package substrate PPS-1, a plurality of ball electrodes (not illustrated) are formed. The density of the bump electrodes formed on the first main surface PPF1 is set to be higher than that of the ball electrodes formed on the second main surface PPF2. A desired wiring pattern is formed by the conductive layers sandwiched between the first and second main surfaces PPF1 and PPF2. By the formed wiring pattern, for example, the bump electrode formed on the first main surface PPF1 and the ball electrode formed on the second main surface PPF2 are electrically coupled. FIG. 6 illustrates an example of the wiring patterns formed by the conductive layers sandwiched between the first and second main surfaces PPF1 and PPF2, and a part of the patterns are drawn as wiring patterns (signal wires) PPL1-1 and PPL1-2.

The interposer INS-1 also has a first main surface INF1 and a second main surface INF2 opposed to the first main surface INF1 and has a plurality of conductive layers and a plurality of insulating layers sandwiched between the first and second main surfaces INF1 and INF2. The plurality of conductive layers are stacked while sandwiching the insulating layers. On the first main surface INF1 of the interposer INS-1, a plurality of microbump electrodes (not illustrated) are formed. On the second main surface INF2 of the interposer INS-1, a plurality of bump electrodes (not illustrated) are formed. The density of the microbump electrodes formed on the first main surface INF1 is set to be higher than that of the bump electrodes formed on the second main surface INF2.

Desired wiring patterns are formed by the conductive layers sandwiched between the first and second main surfaces INF1 and INF2. By a formed desired first wiring pattern, for example, the microbump electrode formed on the first main surface INF1 and the bump electrode formed on the second main surface INF2 are electrically coupled. By a formed desired second wiring pattern, the microbump electrodes formed on the first main surface INF1 are electrically coupled. FIG. 6 illustrates an example of the first wiring pattern electrically coupling the microbump electrode and the bump electrode and the second wiring pattern electrically coupling the microbump electrodes. The first wiring patterns each coupling a predetermined microbump electrode and a bump electrode in the first wiring patterns are drawn as wiring patterns (signal wires) INL1-1 and INL1-2.

A plurality of microbump electrodes (not illustrated) are formed over the main surface of the memory semiconductor chip MCH-1, each of the memory semiconductor chips MCH-2 to MCH-4 has a plurality of electrodes (not illustrated) in its main surface, and each of the electrodes of the memory semiconductor chips MCH-2 to MCH-4 is electrically coupled to the microbump electrode of the memory semiconductor chip MCH-1 via a through hole THF. Consequently, an internal circuit block in each of the memory semiconductor chips MCH-1 to MCH-4 is electrically coupled to the microbump electrode of the memory semiconductor chip MCH-1.

The logic semiconductor chip LCH-1 has a first main surface CHF1 and a second main surface CHF2 opposed to the first main surface CHF1. The logic semiconductor chip LCH-1 has an SerDes circuit. Although the SerDes has a plurality of transmission buffer circuits and a plurality of reception buffer circuits, in FIG. 6, one transmission buffer circuit is illustrated with reference numerals SCB1-1 and two reception buffer circuits are illustrated with reference numerals RCB1-1 and RCB1-2. Over the second main surface CHF2 of the logic semiconductor chip LCH-1, a plurality of microbump electrodes (not illustrated) are formed. To the microbump electrodes, a circuit block in the logic semiconductor chip LCH-1 is electrically coupled. FIG. 6 illustrates a state where one transmission buffer circuit SCB1-1 and two reception buffer circuits RCB1-1 and RCB1-2 are coupled to the microbump electrodes.

The memory semiconductor chip MCH-1 and the logic semiconductor chip LCH-1 are mounted so that the main surface of the memory semiconductor chip MCH-1 and the second main surface CHF2 of the interposer INS-1 are opposed to the first main surface INF1 of the interposer INS-1. At this time, the memory semiconductor chips MCH-2 to MCH-4 are mounted so as to be stacked stereoscopically over the memory semiconductor chip MCH-1.

The microbump electrodes formed over the main surface of the memory semiconductor chip MCH-1 and the microbump electrodes formed over the second main surface CHF2 of the logic semiconductor chip LCH-1 are electrically coupled to the microbump electrodes formed over the first main surface INF1 of the opposed interposer INS-1 by microbumps MBM.

The interposer INS-1 is mounted over the package substrate PPS-1 so that the second main surface INF2 is opposed to the first main surface PPF1 of the package substrate PPS-1. At this time, the bump electrodes formed over the first main surface PPF1 of the package substrate PPS-1 and the bump electrodes formed over the second main surface INF2 of the interposer INS-1 are electrically coupled by bumps SBM. The package substrate PPS-1 is mounted over the print substrate PBS so that the second main surface PPF2 is opposed to the first main surface PBF1 of the print substrate PBS. At this time, the ball electrodes formed over the second main surface PPF2 of the package substrate PPS-1 and the ball electrodes formed over the first main surface PBF1 of the print substrate PBS are electrically coupled by balls SBL.

By the plurality of microbumps, the memory semiconductor chips MCH-1 to MCH-4 and the logic semiconductor chip LCH-1 are coupled to corresponding microbump electrodes in the interposer INS-1. In FIG. 6, to avoid the drawing from becoming complicated, the reference characters MBM are designated only to the leftmost microbump in the plurality of microbumps. By the plurality of bumps, the interposer INS-1 is coupled to corresponding bump electrodes in the package substrate PPS-1. In FIG. 6, to avoid the drawing from becoming complicated, the reference characters SBM are designated only to the leftmost bump in the plurality of bumps. Similarly, by the plurality of balls, the package substrate PPS-1 is coupled to corresponding ball electrodes in the board PBS. In FIG. 6, to avoid the drawing from becoming complicated, the reference characters SBL are designated only to the leftmost ball in the plurality of balls.

When the print substrate PBS is seen from its first main surface PBF1 side, in the first region in the print substrate PBS, as described above, the package substrate PPS-1, the interposer INS-1, and the semiconductor chips (the memory semiconductor chips MCH-1 to MCH-4 and the logic semiconductor chip LCH-1) are mounted in order. Similarly, when the print substrate PBS is seen from its first main surface PBF1 side, in the second region in the print substrate PBS, the package substrate PPS-2, the interposer INS-2, and the logic semiconductor chip LCH-2 are mounted in order. The first and second regions are regions apart from each other in the print substrate PBS when viewed from the first main surface PFB1 side.

The package substrate PPS-2 has a configuration similar to that of the package substrate PPS-1. The package substrate PPS-2 is mounted so that its second main surface PPF2 is opposed to the first main surface PBF1, and ball electrodes formed over the second main surface PPF2 of the package substrate PPS-2 are electrically coupled to the corresponding ball electrodes PDE in the first main surface PBF1 of the print substrate PBS by balls. The interposer INS-2 is mounted so that its second main surface INF2 is opposed to the first main surface PPF1 of the package substrate PPS-2, and bump electrodes (not illustrated) formed over the second main surface INF2 of the interposer INS-2 are electrically coupled to corresponding bump electrodes in the first main surface PPF1 of the package substrate PPS-2 by bumps. Further, the logic semiconductor chip LCH-2 is mounted so that its second main surface CHF2 is opposed to the first main surface INF1 of the interposer INS-2, and microbump electrodes formed over the second main surface of the logic semiconductor chip LCH-2 are electrically coupled to corresponding microbump electrodes in the first main surface INF1 of the interposer INS-2 by microbumps.

Like the package substrate PPS-1, the package substrate PPS-2 has a plurality of conductive layers and a plurality of insulating layers alternately stacked. In FIG. 6, a part of a wiring pattern formed by the conductive layers in the package substrate PPS-2 is illustrated. In FIG. 6, reference numerals PPL2-1 and PPL2-2 are designated to a part of the wiring pattern (signal wire). Like the interposer INS-1, the interposer INS-2 also has a plurality of conductive layers and a plurality of insulting layers alternately stacked. In FIG. 6, a part of a wiring pattern formed by the conductive layers in the interposer INS-2 is illustrated. In FIG. 6, reference numerals INL2-1 and INL2-2 are designated to a part of the wiring pattern (signal wire).

The logic semiconductor chip LCH-2 has a SerDes circuit and the SerDes has a plurality of transmission buffer circuits and a plurality of reception buffer circuits. The transmission buffer circuits and the reception buffer circuits are electrically coupled to microbumps formed over the second main surface CHF2 of the logic semiconductor chip LCH-2. In FIG. 6, one transmission buffer circuit in the plurality of transmission buffer circuits of the SerDes circuit in the logic semiconductor chip LCH-2 is illustrated with reference numerals SCB2-1 and two reception buffer circuits in the plurality of reception buffer circuits are illustrated with reference numerals RCB2-1 and RCB2-2.

In the SerDes circuit in the logic semiconductor chip LCH-2, a serial signal is supplied from the transmission buffer circuit SCB2-1 via a first signal line to the reception buffer circuit RCB1-2 in the SerDes circuit in the logic semiconductor chip LCH-1. A serial signal is supplied from the transmission buffer circuit SCB1-1 in the SerDes circuit in the logic semiconductor chip LCH-1 to the reception buffer circuit RCB2-2 in the SerDes circuit in the logic semiconductor chip LCH-2 via a second signal line. In such a manner, high-speed transmission/reception of the serial signal can be performed between the logic semiconductor chips LCH-2 and LCH-1. For example, the memory semiconductor chips MCH-1 to MCH-4 can be accessed at high speed from the logic semiconductor chip LCH-2.

The reception buffer circuits RCB1-1 and RCB2-1 in the logic semiconductor chips LCH-1 and LCH-2 are, for example, coupled to a not-illustrated semiconductor chip via a not-illustrated signal line and used to receive a high-speed serial signal.

The transmission buffer circuit SCB2-1 and the reception buffer circuit RCB2-1 are electrically coupled via wiring patterns INL1-1 and INL2-1 in the interposers INS-1 and INS-2, wiring patterns PPL1-1 and PPL2-1 in the package substrates PPS-1 and PPS-2, and the wiring pattern PBL1 in the print substrate PBS. Similarly, the transmission buffer circuit SCB1-2 and the reception buffer circuit RCB2-2 are electrically coupled via wiring patterns INL1-2 and INL2-2 in the interposers INS-1 and INS-2, wiring patterns PPL1-2 and PPL2-2 in the package substrates PPS-1 and PPS-2, and the wiring pattern PBL2 in the print substrate PBS.

That is, a first signal line is comprised of the wiring patterns INL1-1, INL2-1, PPL1-1, PPL2-1, and PBL1 coupled in series between the output terminal of the transmission buffer circuit SCB2-1 and the input terminal of the reception buffer circuit RCB1-2. A second signal line is comprised of the wiring patterns INL1-2, INL2-2, PPL1-2, PPL2-2, and PBL2 coupled in series between the output terminal of the transmission buffer circuit SCB1-1 and the input terminal of the reception buffer circuit RCB2-2.

In the first embodiment, the wire width of the wiring pattern (for example, INL1-1, INL2-1, or the like) in the interposers INS-1 and INS-2 is narrower than that of the wiring pattern (for example, PPL1-1, PPL2-1, or the like) in the package substrates PPS-1 and PPS-2 and the wiring pattern (for example, PBL1 or the like) in the print substrate PBS. That is, the signal density in the interposers INS-1 and INS-2 can be made higher than that of the package substrate and the print substrate. Consequently, for example, like the interposer INS-1, the semiconductor chips mounted on the same interposer can be easily coupled by a wiring pattern in the interposer.

The wire width of the wiring pattern in the print substrate PBS is thicker than that of the wiring pattern in the package substrates PPS-1 and PPS-2. According to the wire width of the wiring pattern, the size of an electrode coupled to the wiring pattern changes. Consequently, the size of a ball electrode formed over the first main surface PBF1 in the print substrate PBS is larger than that of a microbump electrode coupled by a microbump. In the first embodiment, the size of a bump electrode formed over the first main surface PPF1 of the package substrates PPS-1 and PPS-2 is set to the size between the microbump electrode and the ball electrode. Therefore, the electrodes can be disposed at high density in a state where the wire width of the wiring pattern of the print substrate PBS, that of the package substrates PPS-1 and PPS-2, and that of the interposers INS-1 and INS-2 are in descending order.

In this case, the size of the microbump MBM, that of the bump SBM, and that of the ball SBL are in ascending order. The microbump MBM, the bump SBM, and the ball SBL are deformed at the time of electrically coupling the electrodes. Consequently, it may be understood that the comparison of the sizes is in a state before the electrodes are coupled.

In the first embodiment, the memory semiconductor chips MCH-1 to MCH-4 are disposed three-dimensionally and the logic semiconductor chip LCH-1 is disposed two-dimensionally. Consequently, it can be also understood that the semiconductor device 6000 illustrated in FIG. 6 is a so-called 2.5-D semiconductor device. The SerDes circuit described in FIG. 6 is, although not limited, a SerDes circuit having transfer speed of 56 Gbps.

The interposers INS-1 and INS-2 are, although not limited, silicon interposers. For example, the interposers INS-1 and INS-2 may be interposers using a glass substrate or an organic substrate.

In FIG. 6, regions DFA-1 and DFA-2 surrounded by broken lines indicate regions in which the digital filter described with reference to FIG. 1 and the like is formed. In FIG. 6, MM indicates an insulator part covering the coupling part of the semiconductor chip and the interposer.

Structure of Digital Filter

Figure 7:
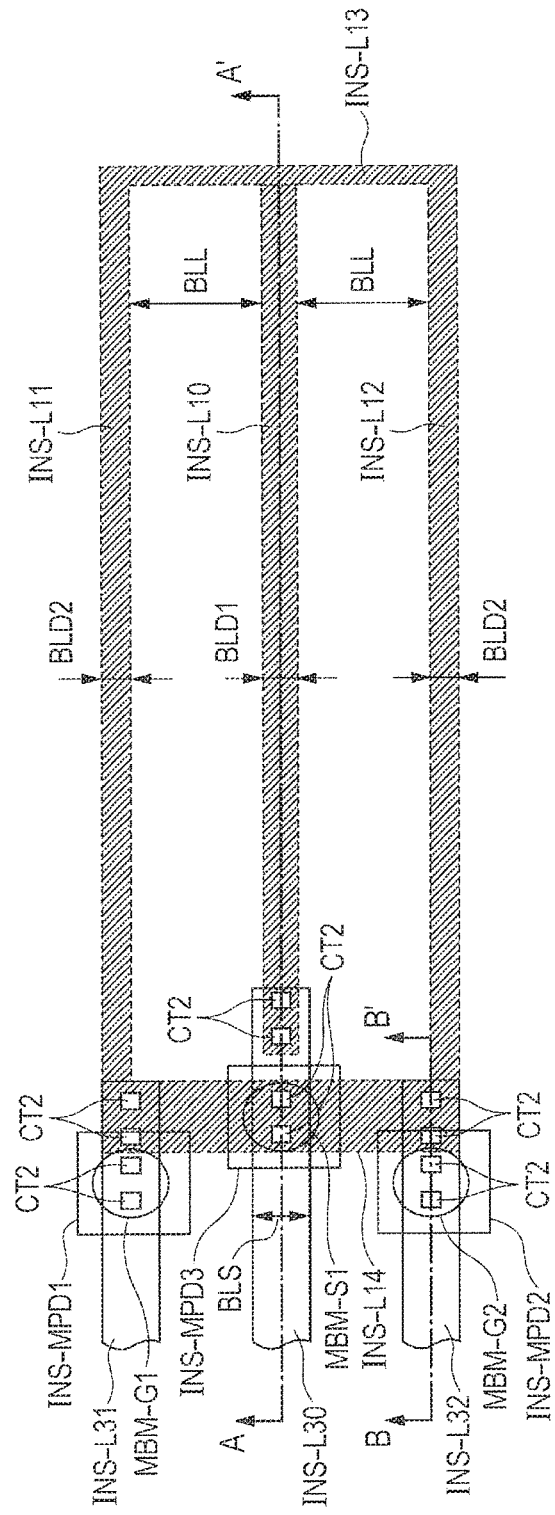
FIG. 7 is a plan view illustrating a plane of a main part of the semiconductor device according to the first embodiment.
Figure 8:
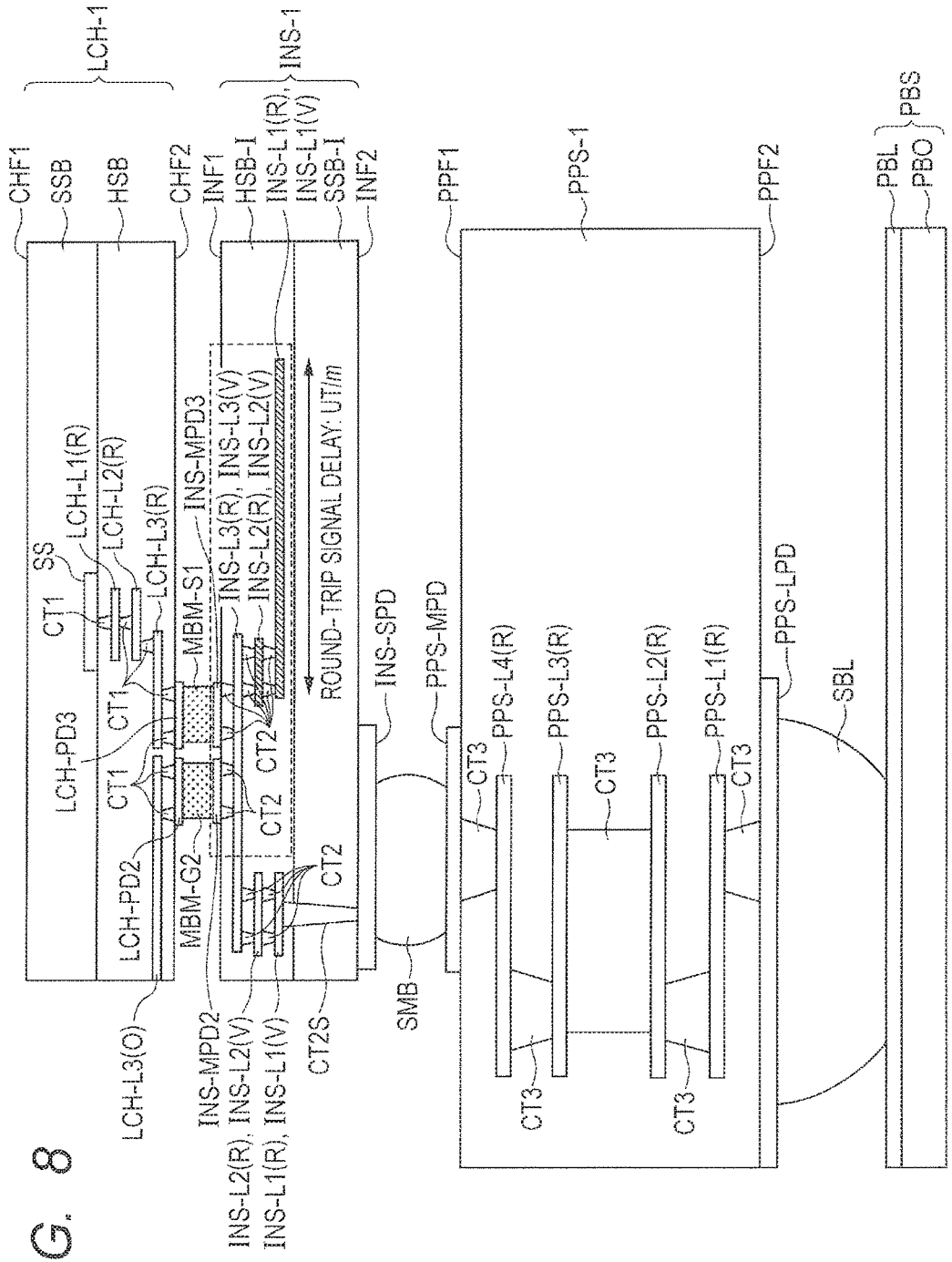
FIG. 8 is a cross section illustrating an A-A' section and a B-B' section of the plane depicted in FIG. 7.

Next, the structure of the digital filter according to the first embodiment will be described. FIG. 7 is a plan view of the broken-line region DFA-1 in FIG. 6 seen from the first main surface PPF1 of the interposer PPS-1. FIG. 8 is a cross section illustrating an A-A' section and a B-B' section in FIG. 7. FIGS. 7 and 8 illustrate an example that the delay element DLN as a component of the digital filter 1002 is comprised of the conductive layers formed in the interposer PPS-1.

In FIG. 7, each of INS-L10 to INS-L14 and INS-L10 to INS-L12 indicates a wiring pattern (signal wire) formed by the conductive layer formed in the interposer INS-1. Although an example will be described later with reference to FIG. 8, the interposer INS-1 has three conductive layers INS-L1 to INS-L3 isolated from one another by the insulating layers. Although not limited, the wiring patterns INS-L10 to INS-L14 are formed by the first conductive layer INS-L1 in the three conductive layers, and each of the wiring patterns INS-L30 to INS-L32 is formed by the third conductive layer INS-L3.

As described with reference to FIGS. 1 to 5, the delay element DLN has a signal line to/from which a signal to be transmitted is input/output and a voltage line which extends in parallel to the signal line and to which the predetermined voltage Vs is supplied. In FIG. 7, the wiring patterns INS-L10 is used as the signal line to/from which the signal to be transmitted is input/output, and the wiring patterns INS-L11 and INS-L12 are used as the voltage lines to which the predetermined voltage Vs is supplied. As understood from FIG. 7, each of the wiring patterns INS-L11 and INS-L12 (seventh and eighth wiring patterns) has a region opposed (parallel in FIG. 7) to the wiring pattern INS-L10.

Consequently, when viewed from the first main surface INF1 of the interposer INS-1, the wiring pattern (signal wire) INS-L10 extends in the lateral direction in FIG. 7, and the wiring patterns (signal lines) INS-L11 and INS-L12 are parallel to the wiring pattern INS-L10 in plan view and extend in the lateral direction as illustrated in FIG. 7. The other end of each of the wiring patterns INS-L10, INS-L11, and INS-L12 is coupled to the wiring pattern INS-L13 extending in the vertical direction in FIG. 7 and disposed so as to be perpendicular to each of the wiring patterns INS-L10, INS-L11, and INS-L12. One end of each of the wiring patterns INS-L11 and INS-L12 is coupled to the wiring pattern INS-L14 extending in the vertical direction in FIG. 7 and disposed so as to be perpendicular to each of the wiring patterns INS-L10 and INS-L12.

The wiring pattern INS-L14 is coupled to wiring patterns INS-L31 and INS-L32 formed by the third conductive layer INS-L3 via contacts CT2 buried with a conductive material so as to couple the conductive layers. The wiring pattern INS-L14 is coupled to microbump electrodes (hereinbelow, electrodes will be also called pads) INS-MPD1 and INS-MPD2 formed over the first main surface INF1 of the interposer INS-1 via the contacts CT2. On the other hand, one end of the wiring pattern INS-L10 is coupled to the wiring pattern INS-L30 formed by the third conductive layer INS-L3 via the contacts CT2. One end of the wiring pattern INS-L10 is coupled to a microbump electrode INS-MPD3 formed over the first main surface INF1 of the interposer INS-1 via the contacts CT2.

As will be described later, to the wiring patterns INS-L31 and INS-L32, the predetermined voltage Vs (for example, the ground voltage of the circuit) is supplied via a wiring pattern formed in the package substrate PPS-1 (FIG. 6) and the print substrate PBS (FIG. 6). To the wiring pattern INS-L30, a transmission signal is supplied from the logic semiconductor chip LCH-2 via a signal wire (wiring pattern) formed in the package substrate PPS-1 and the print substrate PBS.

The microbump electrodes INS-MPD1 and INS-MPD2 are coupled to corresponding microbump electrodes in the second main surface CHF2 of the logic semiconductor chip LCH-1 by the microbumps MPM (in FIG. 7, MBM-G1 and MBM-G2). With the configuration, the predetermined voltage Vs is supplied to the logic semiconductor chip LCH-1. The predetermined voltage Vs is used as a voltage for operating circuit blocks formed in the logic semiconductor chip LCH-1 (for example, the transmission buffer circuit SCB1-1 and the reception buffer circuit RCB1-2 illustrated in FIG. 6).

The microbump electrode INS-MPD3 is coupled to a corresponding microbump electrode over the second main surface CHF2 of the logic semiconductor chip LCH-1 by the microbump MBM (in FIG. 7, MBM-S1). In this case, the corresponding microbump electrode is coupled to the input terminal of the reception buffer circuit RCB1-2. With the configuration, a transmission signal from the logic semiconductor chip LCH-2 is supplied to the reception buffer circuit RCB1-2 provided in the logic semiconductor chip LCH-1.

In the example illustrated in FIG. 7, in the plan view, the predetermined voltage Vs is supplied to the wiring pattern INS-L10 to/from which a signal to be transmitted is input/output, and the wiring pattern INS-L10 is surrounded by the wiring patterns INS-L11 to LNS-L14 formed by the conductive layer which is the same as that of the wiring pattern INS-L10. It can also prevent leakage of electromagnetic field generated when the signal input to the wiring pattern INS-L10 changes.

Next, with reference to FIG. 8, the structure of the digital filter DFA-1 will be described. FIG. 8 illustrates the section of not only the interposer INS-1 as a component of the digital filter DFA-1 but also a part of the logic semiconductor chip LCH, a part of the package substrate PPS-1, and a part of the print substrate PBS. The part illustrated in FIG. 8 is only the part related to the digital filter DFA-1 and the other part is not illustrated. FIG. 8 is the A-A' section viewed from the B-B' side in FIG. 7. Consequently, in FIG. 8, the A-A' section and the B-B' section are partially overlapped.

The print substrate PBS has a plurality of conductive layers and a plurality of insulating layers alternately stacked up. In FIG. 8, to facilitate the explanation, the print substrate PBS having only an insulating layer PBO and one conductive layer PBL stacked on the insulting layer PBO is illustrated. By the conductive layer PBL illustrated in FIG. 8, the wiring pattern PBL1 illustrated in FIG. 6 is formed. In FIG. 8, the ball electrodes SBL described with reference to FIG. 6 are not illustrated.

The package substrate PPS-1 has, although not limited, four conductive layers PPS-L1 to PPS-L4 which are isolated from one another by insulating layers.

FIG. 8 illustrates, for explanation, a part of the package substrate PPS-1 related to the bump MBM-S1 described in FIG. 7. Over the second main surface PPF2 of the package substrate PPS-1, as described with reference to FIG. 6, the ball electrode is formed. In FIG. 8, the ball electrode is indicated as reference characters PPS-LPD. The ball electrode PPS-LPD is coupled to the wiring pattern PBL via the not-illustrated ball electrode SBL by the ball SBL. On the first main surface PPF1 of the package substrate PPS-1, as described in FIG. 6, the bump electrode is formed. In FIG. 8, the bump electrode is indicated by reference characters PPS-SPD.

In FIG. 8, PPS-L4(R), PPS-L3(R), PPS-L2(R), and PPS-L1(R) indicate predetermined wiring patterns formed by the conductive layers PPS-L1 to PPS-L4. The reference character (R) indicates a wiring pattern related to the wiring pattern INS-L10 illustrated in FIG. 7, and the reference characters before the reference character (R) indicate the conductive layer forming the wiring pattern. For example, PPS-L4(R) indicates a wiring pattern related to the wiring pattern INS-L10 formed by the fourth conductive layer. The wiring patterns PPS-L3(R) to PPS-L1(R) are expressed by the same notation system.

Openings are formed in the insulating layers interposed between the wiring patterns PPS-L1(R) to PPS-L4(R) and filled with a conductive material, thereby forming contacts CT3. Via the contacts CT3, as illustrated in FIG. 8, the wiring patterns PPS-L1(4) to PPS-L4(4) are coupled to one another. Via the contact CT3, the wiring pattern PPS-L1(R) and the ball electrode PPS-LPD are coupled. Similarly, via the contact CT3, the wiring pattern PPS-L4(R) and the bump electrode PPS-MPD are coupled. As a result, by the wiring patterns PPS-L1(R) to PPS-L4(R) and the contacts CT3, the ball electrode PPS-LPD and the bump electrode PPS-MPD are electrically coupled and the wiring pattern (signal line) PPL1-1 illustrated in FIG. 6 is formed.

The interposer INS-1 is, although not limited, a silicon interposer. That is, the interposer INS-1 is comprised of a silicon substrate SSBI and a wiring layer HSB-I having a plurality of conductive layers formed on the silicon substrate SSBI by the known semiconductor manufacturing technology. In the first embodiment, the wiring layer HSB-I has the three conductive layers INS-L1 to INS-L3. Obviously, between the adjacent conductive layers, an insulating layer is interposed. As described in FIG. 6, the bump electrode is formed over the second main surface INF2 of the interposer INS-1, and the microbump electrode is formed over the first main surface INF1. In FIG. 8, the bump electrode formed over the second main surface INF2 is indicated by reference characters INS-SPD, and the microbump electrodes formed over the first main surface INF1 are indicated by reference numerals INS-MPD2 and INS-MPD3 (refer to FIG. 7).

In FIG. 8, INS-L1(R) to INS-L3(R) indicate wiring patterns formed by the conductive layers INS-L1 to INS-L3, and INS-L1(V) to INS-L3(V) also indicate wiring patterns formed by the conductive layers INS-L1 to INS-L3. The wiring patterns are also expressed by the notation system used in the description of the package substrate. Specifically, the reference character (R) indicates a wiring pattern related to the wiring pattern INS-L10 illustrated in FIG. 7, and the reference characters before the reference character (R) indicate the conductive layer forming the wiring pattern. The reference character (V) indicates a wiring pattern related to the wiring pattern INS-L12 illustrated in FIG. 7, and the characters before the reference character (V) indicate the conductive layer forming the wiring pattern.

In FIG. 8, the A-A' section and the B-B' section illustrated in FIG. 7 are drawn overlapped. First, the A-A' section will be described. In the left part in FIG. 8, by a contact CT2S formed by filling an opening formed in the silicon substrate SSB-I with a conductive material, the bump electrode TNS-SPD (second electrode) is coupled to the wiring pattern INS-L1(R). The wiring pattern INS-L1(R) is coupled to the wiring pattern INS-L2(R) in the second layer via the contact CT2, and the wiring pattern INS-L2(R) in the second layer is coupled to the wiring pattern INS-L3(R) in the third layer via the contact CT2. The wiring pattern INS-L3(R) in the third layer corresponds to the wiring pattern INS-L30 illustrated in FIG. 7. The wiring pattern INS-L3(R) in the third layer corresponds to the wiring pattern INS-L30 illustrated in FIG. 7. That is, in plan view of FIG. 7, a part of the wiring pattern INS-L3(R) in the third layer has a plane shape drawn as the wiring pattern INS-L30.

The wiring pattern INS-L3(R) is coupled to the microbump electrode INS-MPD3 (first electrode) via the contact CT2. In the right part in FIG. 8, the wiring pattern INS-L3(R) is coupled to the wiring pattern INS-L2(R) which is hatched via the contact CT2, and the wiring pattern INS-L2(R) in the second layer is coupled to the wiring pattern INS-L1(R) (fourth wiring pattern) which is hatched via the contact CT2. The hatched wiring pattern INS-L1(R) in the first layer corresponds to the wiring pattern INS-L10 illustrated in FIG. 7. That is, in plan view, the hatched wiring pattern INS-L1(R) has a plane shape as illustrated by the wiring pattern INS-L10 in FIG. 7.

Next, the B-B' section illustrated in FIG. 7 will be described. Although not illustrated in FIG. 8, over the second main surface INF2 of the interposer INS-1, a bump electrode to which the predetermined voltage Vs is supplied is formed. The wiring pattern INS-L1(V) in the first layer illustrated in the left part of FIG. 8 is coupled to a not-illustrated bump electrode via the contact CT2S. The wiring pattern INS-L1(V) is coupled to the wiring pattern INS-L2 (V) via the contact CT2, and the wiring pattern INS-L2(V) is coupled to the wiring pattern INS-L3(V) via the contact CT2. The wiring pattern INS-L3(V) in the third layer corresponds to the wiring pattern INS-L32 illustrated in FIG. 7. That is, the plane shape of a part of the wiring pattern INS-L3(V) in the third layer is the shape of the wiring pattern INS-L32 illustrated in FIG. 7.

The wiring pattern INS-L3(V) is coupled to the hatched wiring pattern INS-L2(V) via the contact CT2 in the right part of FIG. 8 and, further, the wiring pattern INS-L2(V) is coupled to the wiring pattern INS-L1(V) (sixth wiring pattern) which is hatched via the contact CT2. The hatched wiring pattern INS-L1(V) in the first layer corresponds to the wiring pattern INS-L12 illustrated in FIG. 7. That is, the plane shape of the hatched wiring pattern INS-L1(V) is the shape of the wiring pattern INS-L12 illustrated in FIG. 7.

The wiring pattern INS-L3(V) in the third layer is coupled to the microbump electrode INS-MPD2 via the contact CT.

Like the bump electrode INS-SPD illustrated in FIG. 8, the bump electrode which is not illustrated in FIG. 8 is coupled to the wiring pattern of the print substrate SBP via the package substrate PPS-1, and the predetermined voltage Vs is supplied via the wiring pattern of the print substrate SBP. Like the contact CT3, the contact CT2 is formed by providing an opening in an insulating layer interposed between the conductive layers and filling the opening with a conductive material.

In FIG. 8, it can be regarded that the wiring pattern INL1-1 illustrated in FIG. 6 is comprised of the wiring patterns INS-L1(R), INS-L2(R), and INS-L3(R), the contact CT2 coupling the wiring patterns, and the contact CT2S illustrated on the left side.

The logic semiconductor chip LCH-1 has a semiconductor substrate, for example, the silicon substrate SSB in which a semiconductor region configuring an element and the like is formed and the wiring layer HSB formed on the main surface of the silicon substrate SSB. The wiring layer HSB has a plurality of conductive layers and a plurality of insulating layers which are stacked alternatively. Although not limited, in the first embodiment, the wiring layer HSB has three wiring layers LCH-L1 to LCH-L3. In FIG. 8, SS indicates a semiconductor region formed in the semiconductor substrate SSB. The semiconductor region SS corresponds to the input terminal of the reception buffer circuit RCB1-2 (FIG. 6).

In FIG. 8, LCH1-L1(R), LCH-L2(R), LCH-L3(R) and LCH-L3 indicate wiring patterns. The wiring patterns LCH1-L1(R), LCH-L2(R), and LCH-L3(R) are drawn by the same notation system as that of the wiring patterns formed in the interposer INS-1. That is, the reference character (R) indicates a wiring pattern related to the wiring pattern INS-L10 illustrated in FIG. 7, and the reference characters before the reference character (R) indicate the conductive layer in which the wiring pattern is formed.

As described with reference to FIG. 6, a plurality of microbump electrodes are formed over the second main surface CHF2 of the logic semiconductor chip LCH-1. In FIG. 8, LCH-PD2 and LCH-PD3 indicate microbump electrodes formed on the second main surface CHF2.

The microbump electrode INS-MPD3 on the interposer INS-1 is coupled to the microbump electrode LCH-PD3 formed on the second main surface CHF2 by the microbump MBM-S1. The microbump electrode LCH-PD3 is coupled to the wiring pattern LCH-L3(R) (fifth wiring pattern) in the third layer via the contact CT1. The wiring pattern LCH-L3(R) is coupled to the wiring pattern LCH-L2(R) in the second layer via the contact CT1, and the wiring pattern LCH-L2 is coupled to the wiring pattern LCH-L1(R) in the first layer. Further, the wiring pattern LCH-L1(R) is coupled to the semiconductor region SS via the contact CT1. The wiring pattern INS-L3(R) illustrated in FIG. 8 corresponds to the wiring pattern INS-L30 illustrated in FIG. 7, and the microbump electrode INS-MPD3 and the bump electrode INS-SPD are coupled via the wiring pattern INS-L3(R).

The microbump electrode LCH-PD2 is coupled to the microbump electrode INS-MPD2 by the microbump MBM-G2, and the microbump electrode INS-MPD2 is coupled to a wiring pattern LCH-L3(O) via the contact CT1. The wiring pattern LCH-L3(O) is used, for example, as a wire supplying the predetermined voltage Vs to the reception buffer circuit RCB1-2. The contact CT1 is formed by, like the contact CT2, forming an opening in the insulating layer between the conductive layers and filling the opening with a conductive material.

With the configuration, a transmission signal from the logic semiconductor chip LCH-2 (FIG. 6) is transmitted to the input terminal of the reception buffer circuit RCB1-2 via the wiring pattern in the print substrate PBS, the wiring pattern in the package substrate PPS-1, and the wiring pattern in the interposer INS-1.

A wiring pattern L10 illustrated in FIG. 7 (first wiring pattern: in FIG. 8, the hatched wiring pattern INS-L1(R)) corresponds to the delay element DLN described with reference to FIG. 1 and the like, and the wiring patterns INS-L11 and INS-L12 illustrated in FIG. 7 (second wiring patterns: in FIG. 8, the hatched wiring pattern INS-L1(V)) extend in parallel to the delay element DLN and become wiring patterns (voltage wires) to which the predetermined voltage Vs is supplied. When a signal is input, the wiring pattern INS-L10 is set so that a round-trip delay as delay time of a signal which is output becomes a fraction of an integer of the data width interval UT (round-trip signal delay UT/m).

In FIG. 6, a transmission signal output from the transmission buffer circuit SCB2-1 in the logic semiconductor chip LCH-2 is transmitted to the wiring pattern PBL1 in the print substrate PBS via the wiring pattern INL2-1 in the interposer INS and the wiring pattern PPL2-1 in the package substrate PPS-2. A transmission signal transmitted to the wiring pattern PBL1 in the print substrate PBS propagates through the wiring pattern PBL1, is transmitted to the wiring pattern PPL1-1 in the package substrate PPS-1 and the wiring pattern INL1-2 in the interposer INS-1, and is transmitted to the microbump electrode LCH-PD3 illustrated in FIG. 8.

The transmission signal transmitted to the microbump electrode LCH-PD3 is transmitted to the input terminal (for example, the semiconductor region SS) of the reception buffer circuit RCB1-2, amplified, and processed. The transmission signal transmitted to the microbump electrode LCH-PD3 is input also to one end of the wiring pattern INS-L10 as a component of the delay element DLN. The other end of the wiring pattern INS-L10 is coupled to the predetermined voltage Vs. Consequently, as described with reference to FIG. 1 and the like, a reflecting wave is generated and output from one end of the wiring pattern to the microbump electrode LCH-PD3.

The wiring patterns INL2-1, PPL2-1, PBL1, PPL1-1, and INL1-2 are coupled in series to configure the signal line 1000 described with reference to FIG. 1 and the like. The transmission signal deteriorated by a loss in the signal line 1000 is restored (shaped) by the output signal (reflecting wave) output from one end of the wiring pattern INS-L10, and the resultant signal is supplied to the input terminal of the reception buffer circuit RCB1-2.

In the first embodiment, one end of the wiring pattern INS-L10 as a component of the delay element DLN functions as an input/output terminal and the other end is coupled to the predetermined voltage Vs (for example, the ground voltage of the circuit). The wiring patterns (voltage lines) INS-L11 and INS-L12 as components of the delay element DLN, to which the predetermined voltage Vs is supplied, are disposed so as to extend in parallel to the wiring pattern (signal line) INS-L10 while sandwiching the wiring pattern INS-L10 therebetween in plan view. That is, the delay element DLN has a structure of a so-called co-planar waveguide. From the viewpoint that the predetermined voltage Vs is supplied to the other end of each of the wiring patterns INS-L10 to INS-L12, it can be regarded that the signal line (wiring pattern INS-L10) as a component of the delay element DLN and the other end of each of the voltage lines (wiring patterns INS-L11 and INS-L12) are short-circuited.

In the first embodiment, the thicknesses of the conductive layers in the interposer INS-1 are the same. As there is a condition that the signal loss (electric resistance ratio) per unit length of the delay element DLN is smaller than that of the signal line, it is sufficient to make line width BLD1 (FIG. 7) of the signal line (wiring pattern INS-L10) as a component of the delay element DLN and line width BLD2 (FIG. 7) of the voltage line (wiring patterns INS-L11 and INS-L12) thinner than line width BLS (FIG. 7) of the signal line (for example, wiring pattern INS-L30).

FIGS. 7 and 8 have been described using the wiring patterns INL1-1 and PPL1-1 illustrated in FIG. 6 as an example. The wiring patterns INL1-2, PPL1-2, INL2-1, PPL2-1, INL2-2, and PPL2-2 illustrated in FIG. 6 are similar. In this case, a wiring pattern similar to the wiring pattern as a component of the delay element DLN described with reference to FIGS. 7 and 8 may be coupled to the input terminal of each of the reception buffer circuits or coupled to the output terminal of each of the transmission buffer circuits. The wiring pattern as a component of each of the delay elements DLN may be coupled to both of the input terminal of the reception buffer circuit and the output terminal of the transmission buffer circuit.

As illustrated in FIGS. 7 and 8, in the case of forming the wiring pattern INS-L30 (third wiring pattern: INS-L3(R)) as a component of the signal line and the wiring patterns INS-L10 (INS-L1(R)), IND-L11, and INS-L12 (INS-L1(V)) configuring the delay element DLN by different conductive layers, the extension direction of the wiring pattern as a component of the signal line and that of the wiring patterns configuring the delay element DLN can be determined arbitrarily as long as they are not in contact.

Details of Delay Element

Although limited, the wiring pattern INS-L10 as a component of the delay element DLN is formed by a thin metal wiring layer, and an equivalent circuit of the delay element DLN is expressed by FIG. 1B. By the skin effect of the wiring pattern INS-L10, resistance R in the equivalent circuit illustrated in FIG. 1B becomes large. As a result, the delay element becomes to have large signal attenuation. In place of increasing the resistance R, the conductance G illustrated in FIG. 1B may be increased. In this case, a signal flowing in the predetermined voltage Vs becomes large, and the signal attenuation becomes large.

As described with reference to FIG. 1 and the like, a transmission signal from the signal line 1000 is distributed to the digital filter 1002 and the reception buffer circuit 1003 at the part (node WRN) of the wired-OR coupling. The equation (7) illustrated in FIG. 3 expresses the signal distribution. In the equation (7), $Z_0$ expresses impedance of the part of the wired-OR coupling (for example, the node WRN in FIG. 1A) when the delay element DLN is not coupled. In the equation (7), $Z_c$ indicates the impedance of the delay element DLN.

As illustrated in the equation (7), the impedance $Z_c$ changes according to the inductance L and capacitance C illustrated in FIG. 1B. The inductance L and the capacitance C can be changed by changing the distance (interval) BLL between the wiring pattern INS-L10 illustrated in FIG. 7 and each of the wiring patterns INS-L11 and INS-L12. That is, when the interval BLL illustrated in FIG. 7 is enlarged, the inductance L increases, and the capacitance C decreases. On the contrary, when the interval BLL is narrowed, the inductance L decreases, and the capacitance C increases. By setting the interval BLL to a desired value, a state where impedance $Z_c$<impedance $Z_0$ and a state where impedance $Z_c$>impedance $Z_0$ can be formed. By setting the states of the impedances $Z_c$ and $Z_0$, the value of a distribution ratio of a signal (signal distribution ratio) can be controlled by the equation (7).

That is, at the time of performing restoration (shaping), the value of the signal output from the delay element DLN to the part of the wired-OR coupling can be controlled by the interval BLL.

In FIG. 7, the delay element DLN is comprised of the signal line (wiring pattern INS-L10) and the voltage lines (wiring patterns INS-L11 and INS-L12) disposed so as to sandwich the signal line, and the predetermined voltage Vs is supplied to the voltage lines. However, the voltage lines may be disposed on only one of the sides. In this case, on the side that the voltage line is not provided, an electromagnetic field may be leaked. Consequently, the configuration is not suitable to high-speed signal transmission. However, in the case of disposing the voltage line only one of the sides to reduce the area or the like, it is desirable to set the state of impedance $Z_c$<impedance $Z_0$ by narrowing the interval BLL.

Eye Pattern

Figure 9A:
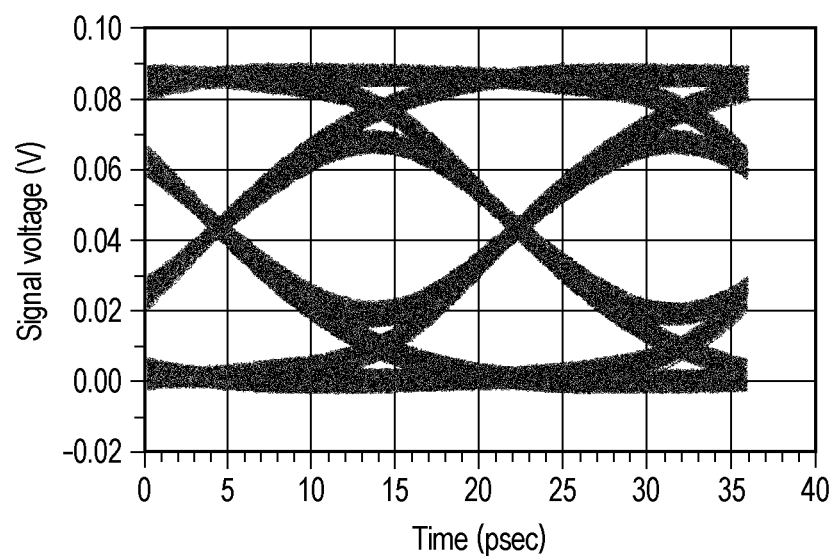
FIGS. 9A and 9B are waveform charts illustrating waveforms of the digital filter according to the first embodiment.
Figure 9B:
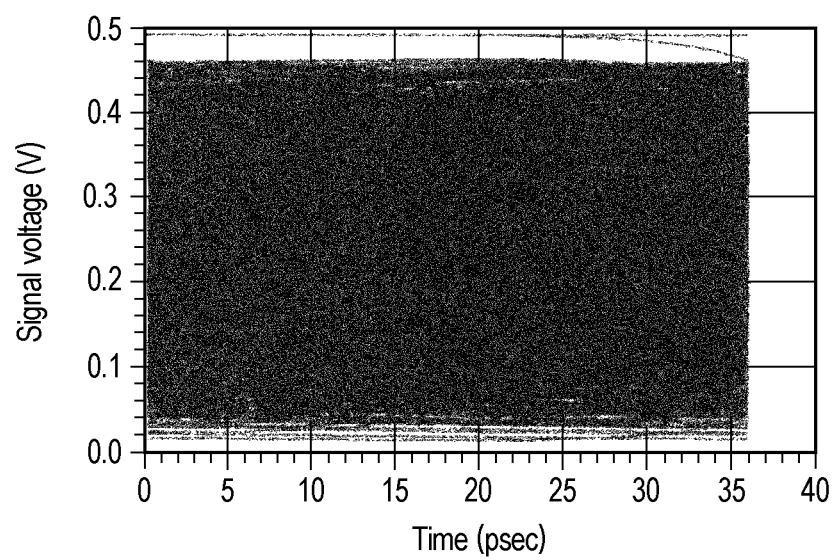

FIGS. 9A and 9B are diagrams illustrating eye patterns in the semiconductor device according to the first embodiment. In FIGS. 9A and 9B, the horizontal axis indicates time, and the vertical axis indicates signal voltage. FIGS. 9A and 9B illustrate the case where an FR4 (Flame Retardant Type 4) substrate is used as a print substrate, the logic semiconductor chips LCH-1 and LCH-2 as illustrated in FIG. 6 are mounted over the print substrate so that the interval of the logic semiconductor chips LCH-1 and LCH-2 becomes four inches, and a signal in the NRZ form is supplied from the logic semiconductor chip LCH-2 to the logic semiconductor chip LCH-1 via the wiring pattern of the print substrate at transfer speed of 56 Gbps. As the interposer, a silicon interposer is used. FIG. 9A is a diagram of an eye pattern drawn by overlapping signal voltage waveforms at the input terminal of the reception buffer circuit when the digital filter 1002 is coupled to the reception buffer circuit of the logic semiconductor chip LCH-1. On the other hand, FIG. 9B is a diagram of an eye pattern drawn by overlapping voltage waveforms at the input terminal of the reception buffer circuit in a state where the digital filter 1002 is not coupled to the reception buffer circuit of the logic semiconductor chip LCH-1.

In the case of comparing FIGS. 9A and 9B, in FIG. 9B, the voltage waveform at the input terminal fluctuates so that it becomes difficult to specify the eye pattern. In contrast, in FIG. 9A, the eye pattern can be recognized, so that a transmission signal can be specified.

Figure 10A:
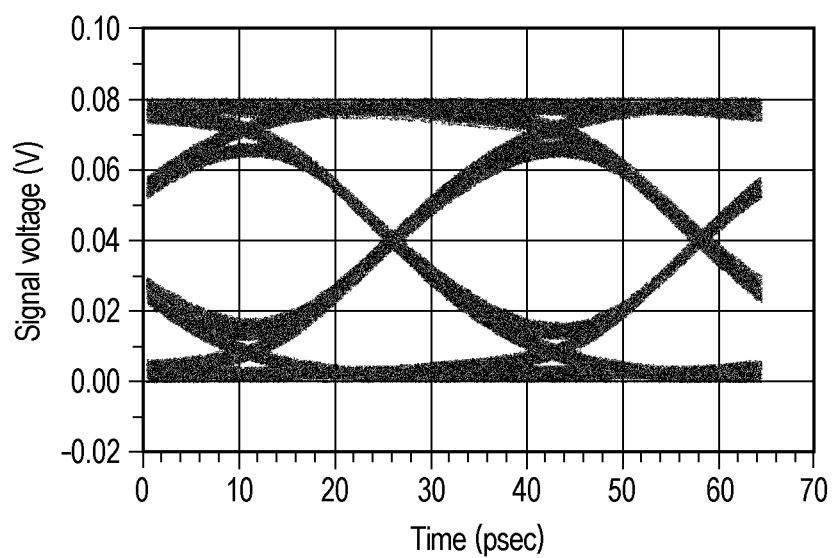
FIGS. 10A and 10B are waveform charts illustrating waveforms of the digital filter according to the first embodiment.
Figure 10B:
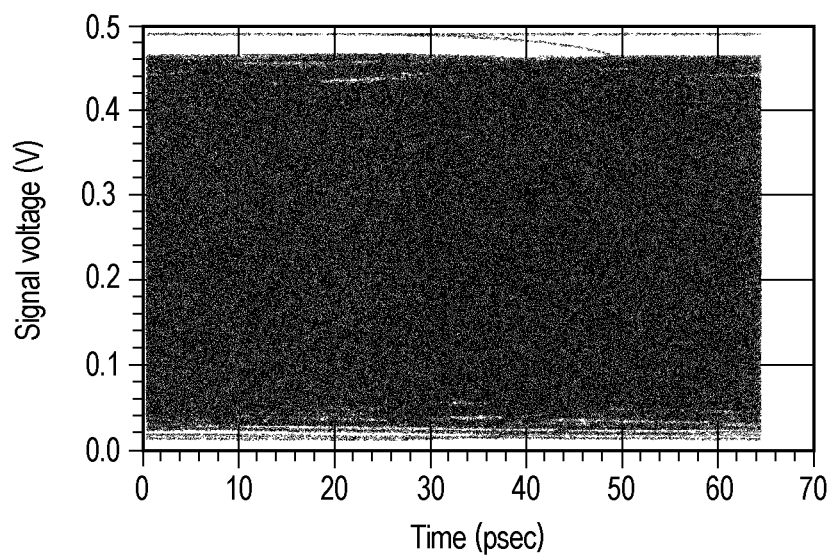

FIGS. 10A and 10B are diagrams, like FIGS. 9A and 9B, illustrating eye patterns in the case where the digital filter is coupled to the input terminal of the reception buffer circuit and the case where the digital filter is not provided. The points different from FIGS. 9A and 9B are that a glass interposer is used as the interposer, the interval between the logic semiconductor chips is 6 inches, and the transmission speed is 31.25 Gbps. FIG. 10A illustrates the eye pattern when the digital filter 1002 is coupled. FIG. 10B illustrates the eye pattern when the digital filter 1002 is not provided. In the case of comparing FIGS. 10A and 10B, like FIGS. 9A and 9B, when the digital filter 1002 is not provided, it is difficult to specify the eye pattern. On the contrary, in FIG. 10A, the eye pattern can be specified, and a transmission signal can be specified.

That is, by providing the digital filter 1002 comprised of a passive element not an active element such as a transistor, while suppressing increase in power consumption, a signal (data) can be specified.

Modification

In FIG. 8, the wiring pattern INS-L30 (FIG. 7) forming the signal line and the wiring pattern INS-L10 (FIG. 7) as a component of the delay element DLN are formed by different conductive layers. That is, the wiring pattern INS-L30 is, as illustrated in FIG. 8, the wiring pattern INS-L3(R) in the third layer, and the wiring pattern L10 is the wiring pattern INS-L1(R) in the first layer which is hatched. In FIG. 8, it can be also regarded that the wiring pattern INS-L2(R) in the second later which is hatched is a part of the wiring pattern forming the delay element DLN.

Figure 11:
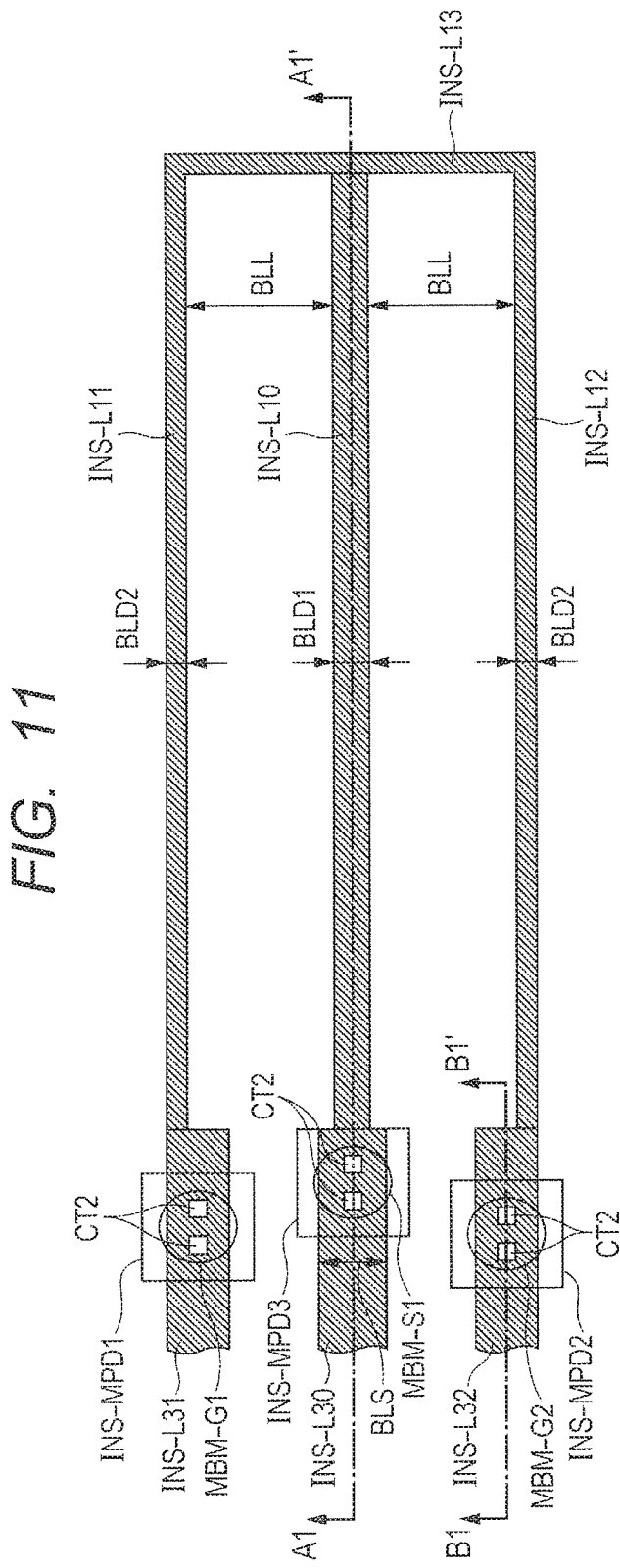
FIG. 11 is a plan view illustrating a plane of a semiconductor device according to a modification of the first embodiment.
Figure 12:
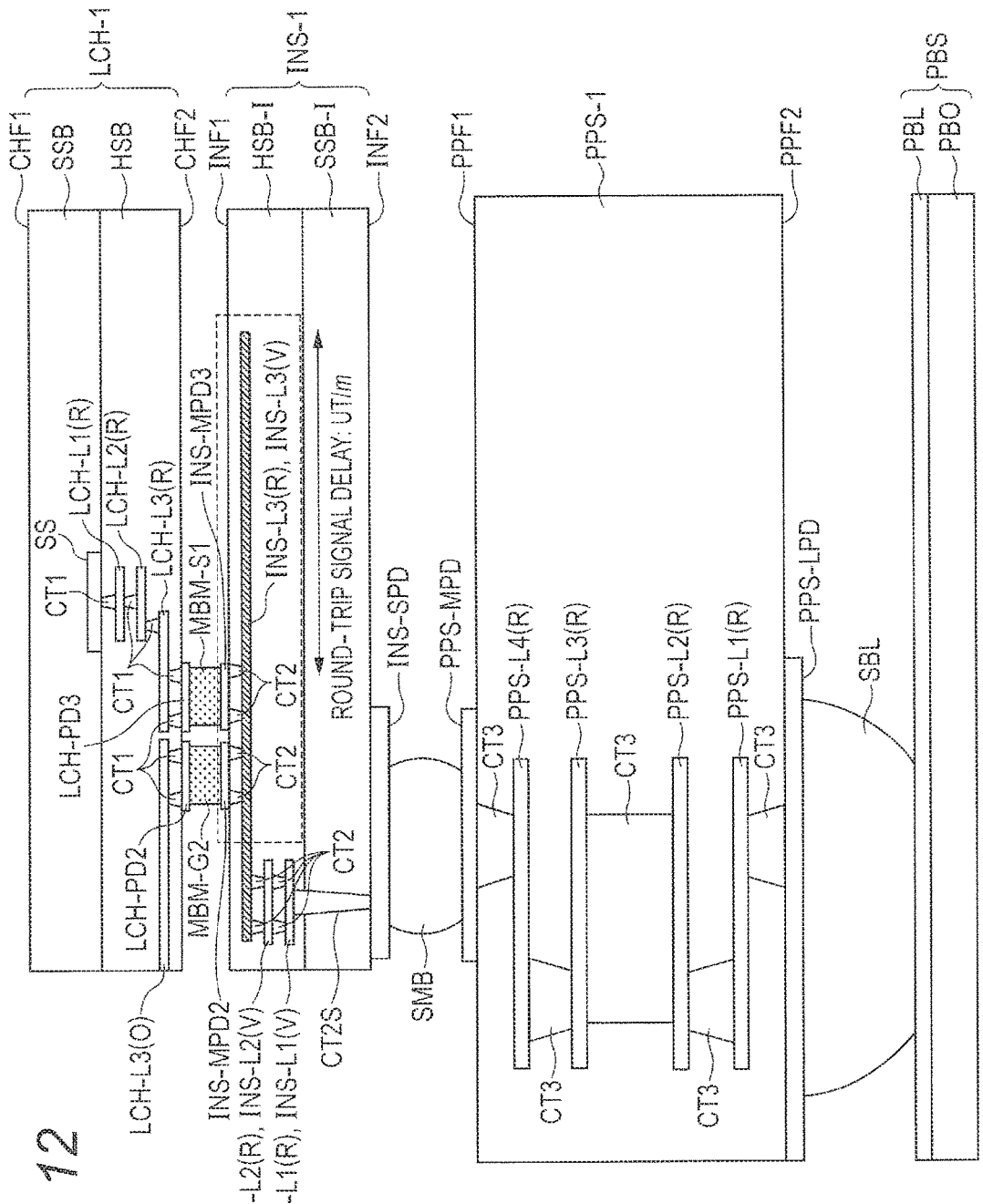
FIG. 12 is a cross section illustrating an A1-A1' section and a B1-B1' section of the plane depicted in FIG. 11.

On the other hand, in the modification, the wiring pattern forming the signal line and the wiring pattern forming the delay element DLN are formed in the same layer. FIG. 11 is a plan view of a semiconductor device according to the modification. FIG. 12 is a cross section illustrating an A1-A1' section and a B1-B1' section in FIG. 11.

FIG. 11 is similar to FIG. 7, and FIG. 12 is similar to FIG. 8. The point that FIGS. 11 and 12 are different from FIGS. 7 and 8 is that the wiring pattern forming the signal line and the wiring pattern forming the delay element DLN are formed by the same layer. Only the different point will be mainly described here.

In FIG. 11, the wiring pattern INS-L10 as a component of the signal line and the wiring pattern INS-L10 as a component of the delay element DLN are integrally formed by the same conductive layer. In the modification, the wiring patterns INS-L30 and INS-L10 are formed by the third conductive layer INS-L3. In FIG. 11, in plan view, the wiring pattern disposed on the left side of the region overlapped with the microbump electrode INS-MPD3 is the wiring pattern INS-L30 as a component of the signal line, and the wiring pattern disposed on the right side of the microbump electrode INS-MPD3 is the wiring pattern INS-L10 as a component of the delay element DLN.

In the example of FIG. 11, the line width BLS of the wiring pattern INS-L30 and the line width BLD1 of the wiring pattern INS-L10 are different. The line width BLD1 is narrower than the line width BLS. Consequently, in the wiring patterns integrally formed, using the region at which the line width changes as a border, the wider wiring pattern may be distinguished as the wiring pattern INS-L30 and the narrower wiring pattern may be distinguished as the wiring pattern INS-L10.

In FIG. 11, the wiring patterns INS-L11 and INS-L12 function as the voltage lines of the delay element DLN. The wiring patterns INS-L11 and INS-L12 are also formed by the same conductive layer as that of the wiring patterns INS-L31 and INS-L32 for supplying the predetermined voltage Vs. In the modification, the wiring patterns INS-L11 and INS-L12 are formed by the third conductive layer INS-L3 which is the same as that of the wiring patterns INS-L10 and INS-L30. Specifically, the wiring pattern INS-L11 is formed integrally with the wiring pattern INS-L31, and the wiring pattern INS-L12 is formed integrally with the wiring pattern INS-L32.

In the example of FIG. 11, the line width of the wiring pattern INS-L31 and that of the wiring pattern INS-L11 are different. Similarly, the line width of the wiring pattern INS-L32 and that of the wiring pattern INS-L12 are different. Specifically, the line width BLD2 of the wiring patterns INS-L11 and INS-L12 is narrower than the line width of the wiring patterns INS-L31 and INS-L32. Consequently, using the region at which the line width changes as a border, the wider regions can be distinguished as the wiring patterns INS-L31 and INS-L32 and the narrower regions can be distinguished as the wiring pattern INS-L11 and INS-L12.

The other ends of the wiring patterns INS-L10 to INS-L12 are coupled to the wiring pattern INS-L13. The wiring pattern INS-L13 is also formed by the third conductive layer INS-L3 which is the same as that of the wiring patterns INS-L10 to INS-L12. Consequently, it can be regarded that the wiring patterns INS-L10 to INS-L13 and INS-L30 to INS-L32 are formed integrally. In FIG. 7, one end of the wiring pattern INS-L11 and that of the wiring pattern INS-L12 are coupled to each other by the wiring pattern INS-L14. In the modification illustrated in FIG. 11, the wiring pattern INS-L14 is not provided, and one end of the wiring pattern INS-L11 and that of the wiring pattern INS-L12 are separated.

In FIG. 12, INS-L3(R) indicates the wiring patterns INS-L30 and INS-L10 in the A1-A1' section, and INS-L3 (V) indicates the wiring patterns INS-L32 and INS-L12 in the B1-B1' section. As illustrated in FIG. 12, each of the wiring patterns INS-L10, INS-L30, INS-L12, and INS-L32 is formed by the third conductive layer.

As described above, in the case of forming the wiring pattern as a component of the signal line and the wiring pattern as a component of the delay element DLN by the same conductive layer, it is sufficient to make the wiring pattern as a component of the signal line extend from the microbump electrode INS-MPD3 and to change the line width in the extended region.

In the modification, even the number of conductive layers forming the interposer INS-1 is small, the digital filter 1002 can be configured.

In the first embodiment, the delay element DLN has the signal line to/from which the signal is input/output and the voltage line which extends in parallel to the signal line and to which the predetermined voltage Vs is supplied. In other words, it can be regarded that the delay element DLN is comprised of delay lines. In this case, a signal loss amount per unit length of the signal line and the voltage line is set to be larger than that of the signal line. In the first embodiment, the boundary length in section of each of the signal wire and the voltage wire is set to be smaller than that of the signal line. To decrease the boundary length in section, the thickness of the signal wire, that of the voltage wire, and that of the signal line are set to the same, and the line width of the signal wire and that of the voltage wire is set to be narrower than that of the signal line.

Second Embodiment

Figure 13:
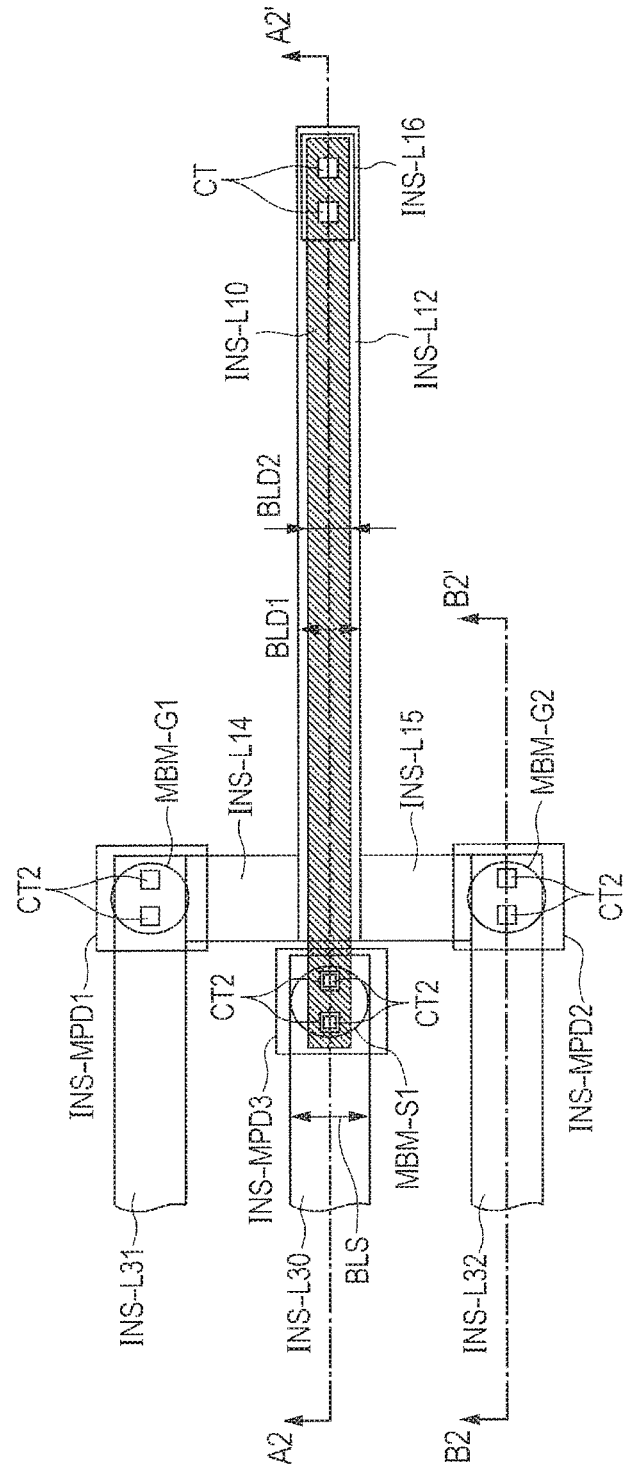
FIG. 13 is a plan view illustrating a plane in a semiconductor device according to a second embodiment.
Figure 14:
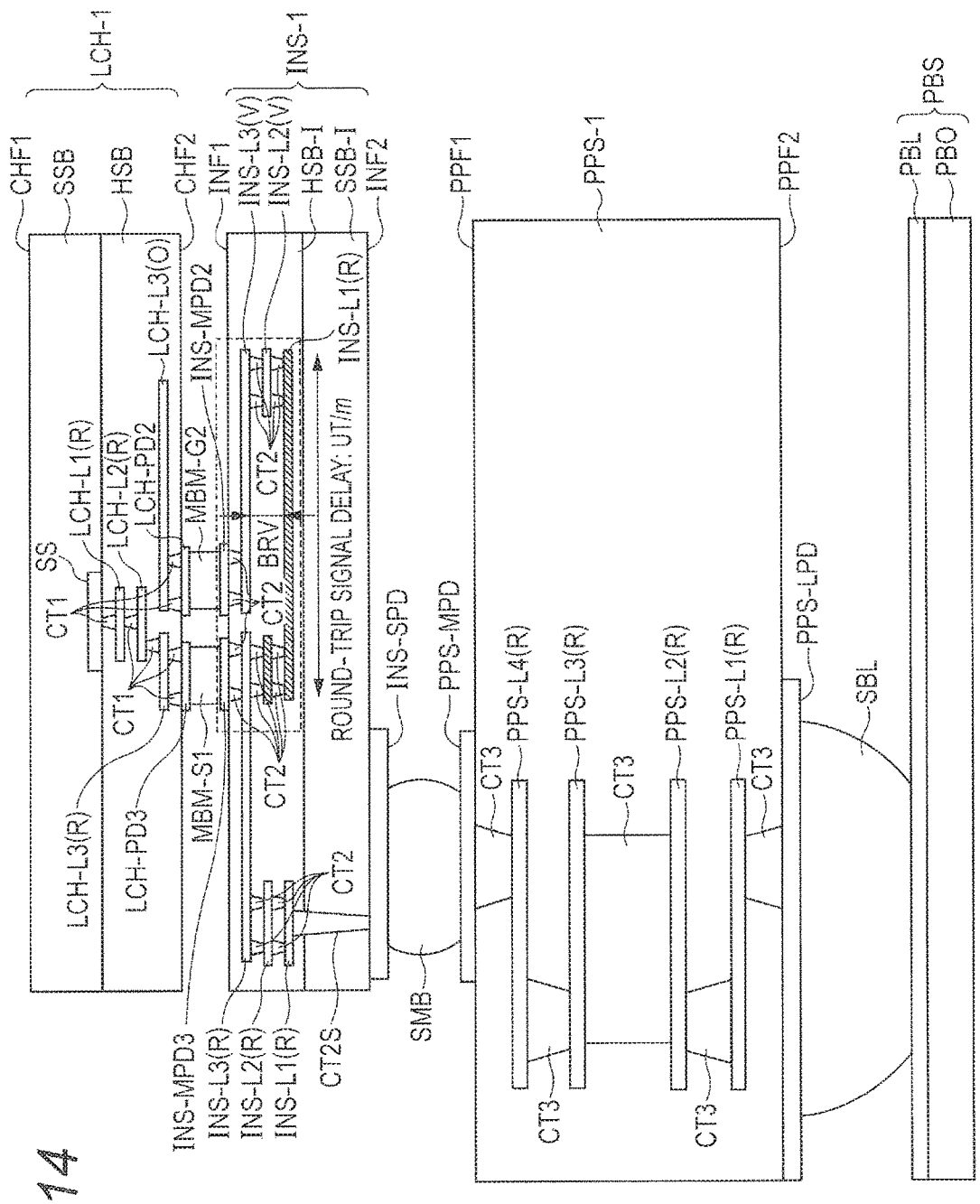
FIG. 14 is a cross section illustrating an A2-A2' section and a B2-B2' section of the plane depicted in FIG. 13.

FIGS. 13 and 14 are diagrams illustrating the structure of a semiconductor device according to a second embodiment. FIG. 13 is a plan view illustrating a plane of the semiconductor device. FIG. 14 is a cross section illustrating an A2-A2' section and a B2-B2' section in FIG. 13.

In the first embodiment, in plan view from the first main surface INF1 of the interposer INS-1, the signal wire (for example, the wiring pattern INS-L10 in FIG. 7) and the voltage wire (for example, the wiring pattern INS-L12 in FIG. 7) configuring the delay element DLN are disposed so as to extend in parallel. On the other hand, in the second embodiment, the signal wire and the voltage wire configuring the delay element DLN are disposed so as to be overlapped in plan view. That is, the signal wire and the voltage wire are disposed so as to be stacked in the vertical direction in the interposer INS-1.

FIG. 13 is similar to FIG. 7, and FIG. 14 is similar to FIG. 8. Only the different points will be described here.

As illustrated in FIG. 13, in the region of the A2-A2' section, the wiring pattern INS-L10 and the wiring pattern INS-L12 (ninth wiring pattern) configuring the delay element DLN are overlapped. As will be described later with reference to FIG. 14, the wiring pattern INS-L10 as a component of the signal line to/from which a signal is input/output is formed by the first conductive layer INS-L1, and the wiring pattern INS-L12 to which the predetermined voltage Vs is supplied is formed by the third wiring layer INS-L3. One end of the wiring pattern INS-L10 is coupled to the microbump electrode INS-MPD3 and the wiring pattern INS-L30 as a component of the signal line, and the other end of the wiring pattern INS-L10 is coupled to the wiring pattern INS-L12 via the wiring pattern INS-L16 in the second layer.

The other end of the wiring pattern INS=L12 is coupled to the wiring patterns INS-L14 and INS-L15 in the third layer. The wiring pattern INS-L14 is coupled to the microbump electrode INS-MPD1 and the wiring pattern INS-L31, and the wiring pattern INS-L15 is coupled to the microbump electrode INS-MPD2 and the wiring pattern INS-L32. Since the wiring patterns INS-L12, INS-L14, and INS-L15 are formed by the wiring layer INS-L3 in the third layer, the wiring patterns can be integrally formed.

As illustrated in FIG. 13, the line width BLD1 of the wiring pattern INS-L10 to/from which a signal is input/output is narrower than the line width BLD2 of the wiring pattern INS-L12 to which the predetermined voltage Vs is supplied.

Like in FIG. 7, the predetermined voltage Vs is supplied to the wiring patterns INS-L31 and INS-L32, and a transmission signal is supplied to the wiring pattern INS-L30. The microbump electrodes INS-MPD1, INS-MPD2, and INS-MPD3 are coupled to the microbump electrode of the logic semiconductor chip by the microbumps MBM-G1, MBM-S1, and MBM-G2.

In FIG. 14, the A2-A2' section and the B2-B2' section in FIG. 13 are overlapped. First, the structure related to the A2-A2' section will be described. In FIG. 14, the print substrate PBS, the package substrate PPS-1, the ball SBL, and the bump SMB are the same as those in FIG. 8. In FIG. 14, the wiring patterns INS-L1(R) and INS-L2(R) illustrated in the left part of the interposer INS-1 are also the same as those in FIG. 8.

When FIGS. 13 and 7 are compared, in the second embodiment, the microbump electrode INS-MPD3 is disposed on the left side of the microbump electrodes INS-MPD1 and INS-MPD2. Accordingly, in FIG. 14, the microbump electrode INS-MPD3 is disposed on the left side of the microbump electrode INS-MPD2. The wiring pattern INS-L2(R) is coupled to the wiring pattern INS-L3(R) in the third layer via the contact CT2, and the wiring pattern INS-L3(R) is coupled to the microbump electrode INS-MPD3 via the contact CT2 and also coupled to the hatched wiring pattern INS-L2(R) via the contact CT2. The hatched wiring pattern INS-L2(R) is coupled to one end of the hatched wiring pattern INS-L1(R) in the first layer via the contact CT2.

The hatched wiring pattern INS-L1(R) extends in the lateral direction in FIG. 14, and the other end of the hatched wiring pattern INS-L1(R) is coupled to the wiring pattern INS-L2(V) in the second layer via the contact CT2. The hatched wiring pattern INS-L1(R) corresponds to the wiring pattern INS-L10 illustrated in FIG. 13. The wiring pattern INS-L2(V) corresponds to the wiring pattern INS-L16 illustrated in FIG. 13.

The wiring pattern INS-L2(V) is coupled to the other end of the wiring pattern INS-L3(V) in the first layer via the contact CT2, and one end of the wiring pattern INS-L3(V)

is coupled to the microbump electrode INS-MPD2 via the contact CT2. The wiring pattern INS-L3(V) in the first layer corresponds to the wiring pattern INS-L12 illustrated in FIG. 13. That is, the wiring pattern INS-L3(V) extends in parallel to the wiring pattern INS-L1(R) in the first layer and, in plan view, is disposed so as to cover the wiring pattern INS-L1(R).

The microbump electrode INS-MPD3 is coupled to the microbump electrode LCH-PD3 by the microbump MBM-S1. Like FIG. 8, the microbump electrode LCH-PD3 is coupled to the semiconductor region SS in the reception buffer circuit via the wiring patterns LCH-L3(R) to LCH-L1(R) and the contact CT1.

The microbump electrode INS-MPD2 is coupled to the microbump electrode LCH-PD2 by the microbump MBM-G2 in the B2-B2' section in FIG. 13, and the microbump electrode LCH-PD2 is coupled to the wiring pattern LCH-L3(O) in the logic semiconductor chip LCH-1. In FIG. 14, the wiring pattern INS-L32 illustrated in FIG. 13 is omitted.

Also in the second embodiment, a signal from the wiring pattern INS-L30 as a component of the signal line 1000 is input/output to/from one end of the wiring pattern (signal wire) INS-L10 as a component of the delay element DLN. The other end of the wiring pattern INS-L10 is coupled to the predetermined voltage Vs. With the configuration, the waveform can be restored (shaped) with low consumption power. As illustrated in FIG. 13, the line width BLD1 of the signal line (wiring pattern INS-L10) as a component of the delay element DLN and the voltage wire (wiring pattern INS-L12) is narrower than the line width BLS of the wiring pattern INS-L30 as a component of the signal line.

An equivalent circuit of the delay element DLN (microstrip delay element) illustrated in FIGS. 13 and 14 has the configuration illustrated in FIG. 1B. When the line width BLD1 of the wiring pattern INS-L10 and the line width BLD2 of the wiring pattern INS-L12 illustrated in FIG. 13 are increased, in the equivalent circuit illustrated in FIG. 1B, the inductance L decreases, the capacitance C increases, and the resistance R decreases. On the contrary, when the line widths BLD1 and BLD2 are narrowed, the inductance L increases, the capacitance C decreases, and the resistance R increases. In FIG. 14, by changing the interval BRV between the wiring pattern INS-L3(V) (INS-L10) and the hatched wiring pattern INS-L1(R) (INS-L12) which extend in parallel to each other, the inductance L and the capacitance C illustrated in FIG. 1B can be increased/decreased. For example, by increasing the interval BRV, the inductance L can be increased, and the capacitance C can be decreased. As a result, in a manner similar to the first embodiment, the signal loss amount can be set to a desired value.

In the second embodiment, the signal wire and the voltage wire configuring the delay element DLN are disposed stereoscopically. Since the line width of the signal wire and the voltage wire is narrower than that of the wiring pattern as a component of the signal line 1000, the area occupied by the delay element DLN can be reduced.

Although FIG. 14 illustrates that the delay element DLN is configured by using the conductive layer INS-L1 in the first layer and the conductive layer INS-L3 in the third layer, the present invention is not limited to the configuration. As long as wiring patterns which are overlapped at least partly in plan view can be formed, a wiring pattern in an arbitrary layer can be used as a wiring pattern as a component of the delay element DLN.

Third Embodiment

FIG. 15 and FIGS. 16A to 16C are diagrams illustrating the structure of a semiconductor device according to a third embodiment. In the first and second embodiments, the example of configuring the delay element DLN by the wiring pattern in the interposer has been described. In the third embodiment, the wiring pattern as a component of the delay element DLN is formed in the logic semiconductor chip LCH-1. Since the delay element DLN as a component of the digital filter 1002 is formed in the logic semiconductor chip LCH-1, a semiconductor device using no interposer is described as an example. Obviously, an interposer may be provided between the logic semiconductor chip LCH-1 and the package substrate PPS-1.

Figure 15:
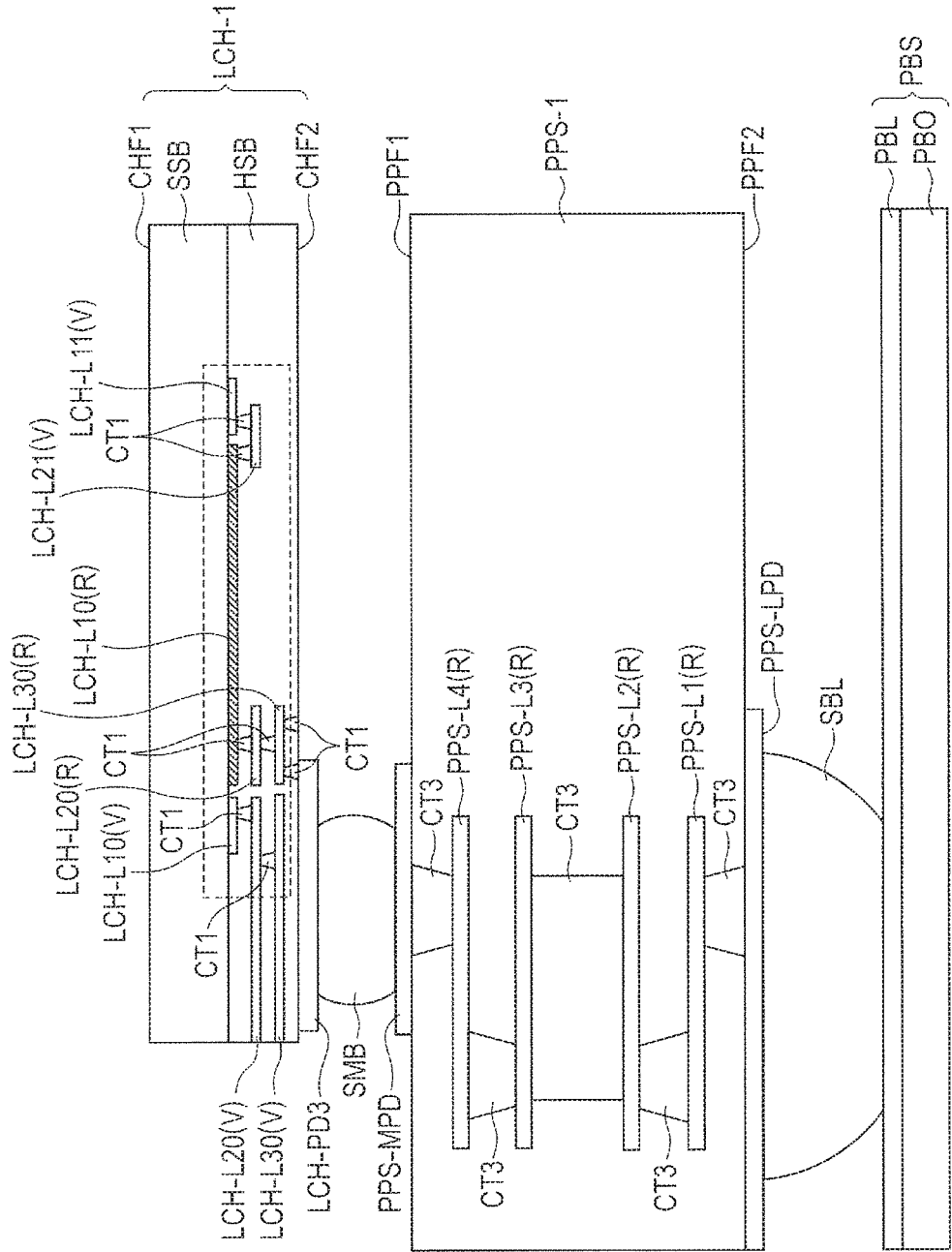
FIG. 15 is a cross section illustrating a section of a semiconductor device according to a third embodiment.
Figure 16A:
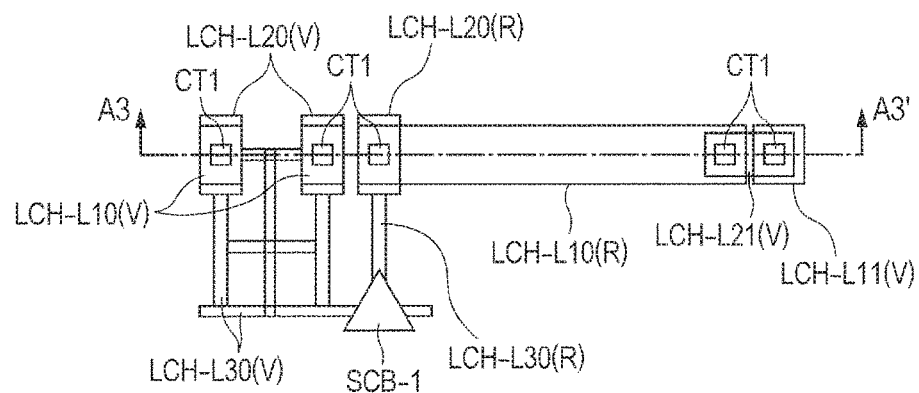
FIGS. 16A to 16C are a plan view and cross sections of the semiconductor device according to the third embodiment.
Figure 16B:
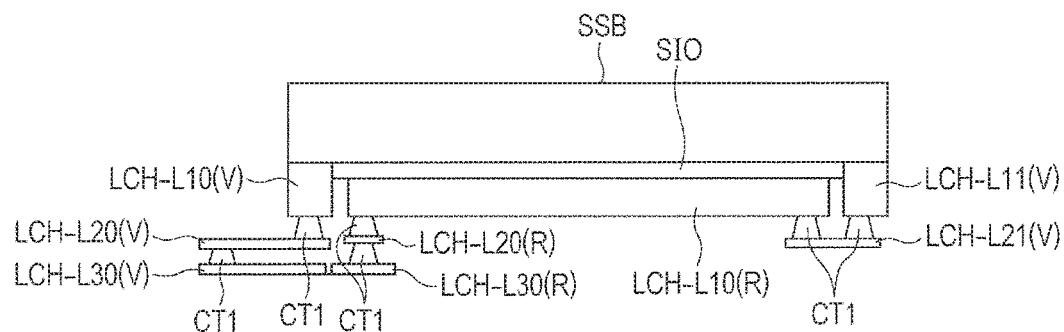
Figure 16C:
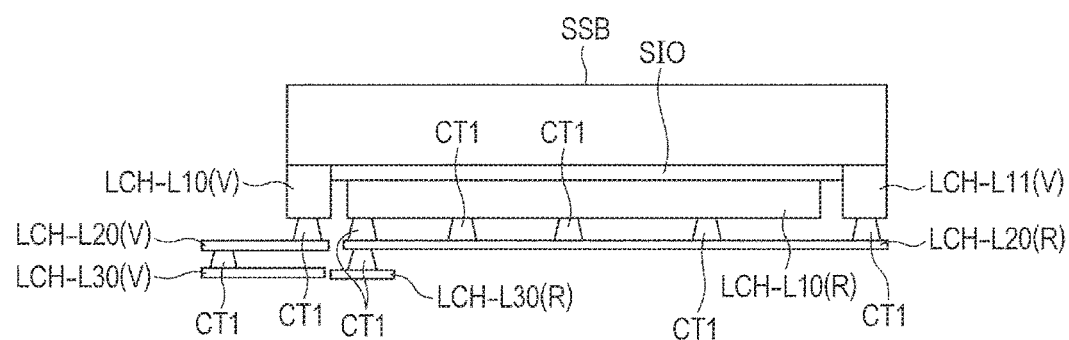

FIG. 15 is a cross section of the semiconductor device according to the third embodiment. FIGS. 16A to 16C are diagrams illustrating the structure of the digital filter 1002. FIG. 16A is a plan view of the digital filter 1002, and FIG. 16B is a cross section illustrating the structure of the delay element DLN according to the third embodiment.

FIG. 15 is an A3-A3' section in FIG. 16A. First, the semiconductor device according to the third embodiment will be described with reference to FIG. 15. FIG. 15 is similar to FIG. 8. Specifically, the print substrate PBS, the package substrate PPS-1, the ball SBL, and the bump SMB illustrated in FIG. 15 are the same as those in FIG. 8. Consequently, their description will not be repeated here.

A bump electrode LCH-PD3 is formed on the second main surface CHF2 of the logic semiconductor chip LCH-1. The bump electrode LCH-PD3 is coupled to the bump electrode PPS-MPD formed on the first main surface PPF1 of the package substrate by the bump SMB.

The logic semiconductor chip LCH-1 has the silicon substrate SSB and the wiring layer HSB formed on the main surface of the silicon substrate SSB. The wiring layer HSB has a plurality of conductive layers and a plurality of insulating layers which are alternately stacked. Although not limited, description will be given on assumption that the wiring layer HSB has three conductive layers. Obviously, the present invention is not limited to the number of the layers.

To form the plurality of circuit blocks such as the transmission buffer circuit SCB1-1 and the reception buffer circuit RCB1-2, in the silicon substrate SSB, a plurality of semiconductor regions functioning as the source and the drain of a field effect transistor (hereinbelow, called MOS FET) are formed. The plurality of formed semiconductor regions are coupled by the wiring pattern formed by the conductive layer in the wiring layer HCB. Consequently, the circuit blocks such as the transmission buffer circuit SCB1-1 and the reception buffer circuit RCB1-2 are configured. In FIG. 15, the MOSFET is omitted and only a part such as the digital filter 1002 is illustrated.

In the logic semiconductor chip LCH-1 illustrated in FIG. 15, LCH-L10(R), LCH-L10(V), and LCH-L11(V) are wiring patterns formed by the first conductive layer LCH-L1 and disposed in the main surface of the silicon substrate SSB. As will be described specifically later with reference to FIG. 16, the wiring pattern LCH-L10(R) is formed in the silicon substrate SSB via an insulating layer (gate insulating field), and the wiring patterns LCH-L10(V) and LCH-L11 (V) are formed so as to be ohmic-coupled to the silicon substrate SSB. One end of the wiring pattern LCH-L10(R) is coupled to the wiring pattern LCH-L20(R) formed by the second conductive layer LCH-L2 via the contact CT1, and the wiring pattern LCH-L20(R) is coupled to the wiring pattern LCH-L30(R) formed by the third conductive layer LCH-L3 via the contact CT1.

The wiring pattern LCH-L30(R) is coupled to the bump electrode LCH-PD3 via the contact CT1. The other end of the wiring pattern LCH-L10(R) is coupled to the wiring pattern LCH-L21(V) formed by the second conductive layer LCH-L2 via the contact CT1, and the wiring pattern LCH-L21(V) is further coupled to the wiring pattern LCH-L1(V) via the contact CT1.

The wiring pattern LCH-L10(V) is coupled to the wiring pattern LCH-L20(V) formed by the second conductive layer LCH-L2 via the contact CT1, and the wiring pattern LCH-L20(V) is coupled to the wiring pattern LCH-L30(V) formed by the third wiring layer LCH-L3 via the contact CT1.

FIG. 16A is a plan view including the section part illustrated in FIG. 15. As illustrated in FIG. 16A, the wiring pattern LCH-L10(R) extends in the lateral direction. In the third embodiment, as illustrated in FIG. 16A, the wiring pattern LCH-L30(R) is coupled to the output terminal of the transmission buffer circuit SCB1-1 (FIG. 6). Consequently, a transmission signal from the transmission buffer circuit SCB1-1 is output to one end of the wiring pattern LCH-L10(R) and the bump electrode LCH-PD3. A signal according to the input signal is output from the one end of the wiring pattern LCH-L10(R) and combined with the transmission signal output to the bump electrode LCH-PD3, and a resultant signal passes through a wiring pattern formed in the print substrate PBS and the like and is transmitted to the logic semiconductor chip LCH-2 (FIG. 6).

In FIG. 16A, two sets of the wiring patterns LCH-L10(V) and LCH-L20(V) are drawn. In FIG. 16B, only one set of the wiring patterns LCH-L10(V) and LCH-L20(V) on the right side in the two sets is drawn. The wiring pattern LCH-L30(V) is disposed like a mesh shape as illustrated in FIG. 16B and is coupled to, for example, the transmission buffer circuit SCB1-1 and the reception buffer circuit RCB1-2. Those buffer circuits operate on, for example, the predetermined voltage Vs as a reference voltage.

In the third embodiment, the delay element DLN is formed by the wiring pattern LCH-L10(R) and the silicon substrate SSB. In the third embodiment, in the equivalent circuit illustrated in FIG. 1B, not only the resistance R but also the conductance G can be increased and the signal loss ratio can be controlled. By using the large dielectric constant of the silicon substrate SSB, the delay amount per unit length of the wiring pattern LCH-L10(R) can be increased, and the size of the delay element DLN can be made smaller.

Next, by using FIG. 16B, the delay element DLN according to the third embodiment will be described. The silicon substrate SSB is, for example, a P-type silicon substrate. For the wiring pattern LCH-L10(R), as an insulating layer, a gate insulating film formed over the P-type silicon substrate is used. The other end of the wiring pattern LCH-L10(R) is coupled to the P-type silicon substrate via the wiring patterns LCH-L11(V) and LCH-L21(V) which are ohmic-coupled to the P-type silicon substrate. The wiring pattern LCH-L10(R) operates as the gate electrode of a MOSFET and, equivalent, a MOS diode (equivalent diode element) having the gate electrode to which the source or drain of the MOSFET is coupled is formed. That is, a MOS diode of a distributed constant type is formed and functions as the delay element DLN. The relative permittivity of an oxide film used as an insulating layer in the silicon interposer is about four. The relative permittivity of a resin material used as an insulating layer in another interposer is about 3.1. In comparison to the relative permittivity of those materials, the relative permittivity of silicon is about 12. Consequently, delay per unit length of the delay element DLN can be made large, and the size of the delay element DLN can be reduced. Since the equivalent MOS diode is used, current flows. The current corresponds to current passed by the parallel conductance G illustrated in FIG. 1B. As a result, the signal loss ratio can be controlled not only by the resistance R illustrated in FIG. 1B but also the conductance G.

The above-described wiring patterns and the like are formed by the known semiconductor manufacturing technology. There is a case that the resistance value of the wiring pattern LCH-L10(R) extending in the lateral direction is too high. In this case, it is sufficient to use the structure as illustrated in FIG. 16C as the structure of the delay element DLN. Specifically, the wiring pattern LCH-L20(R) extends in the lateral direction and is coupled to the wiring pattern LCH-L21(V). Further, the extended wiring pattern LCH-L20(R) and the wiring pattern LCH-L10(R) are coupled by a plurality of contacts CT1. In such a manner, the combined resistance of the wiring patterns LCH-L10(R) and LCH-L20(R) can be lowered.

In the third embodiment, the delay element DLN is formed in the logic semiconductor chip LCH-1. Consequently, one end of the delay element DLN can be disposed close to the output terminal of the transmission buffer circuit or the input terminal of the reception buffer circuit. By the arrangement, signal deterioration which occurs between the part of the wired-OR coupling (node WNR in FIG. 1) and the input terminal or the output terminal can be reduced.

In the third embodiment, the delay element DLN is equivalently formed by the MOS diode, so that the resistance R relative to the predetermined voltage Vs (ground voltage of the circuit) per unit length of the signal wire and the voltage wire as components of the delay element DLN can be made smaller than the resistance R relative to the predetermined voltage Vs per unit length of the signal line 1000. In other words, the conductance G relative to the predetermined voltage Vs (ground voltage of the circuit) can be increased.

Although the P-type silicon substrate has been described as an example of the silicon substrate, an N-type silicon substrate may be used. The silicon substrate illustrated in FIGS. 16B and 16C may be a well region of the P type or the N type.

Fourth Embodiment

FIG. 17 and FIGS. 18A to 18C are diagrams illustrating the structure of a semiconductor device according to a fourth embodiment. Also in the fourth embodiment, like in the third embodiment, the delay element DLN is formed in the logic semiconductor chip LCH-1. FIG. 17 and FIGS. 18A to 18C are similar to FIG. 15 and FIGS. 16A to 16C and the different points will be mainly described. In the third embodiment described with reference to FIG. 15 and FIGS. 16A to 16C, the delay element DLN is comprised of the MOS diode of the distributed constant type. On the other hand, in the fourth embodiment, the delay element DLN is comprised of a PN junction diode (equivalent diode element) of the distributed constant type.

Figure 17:
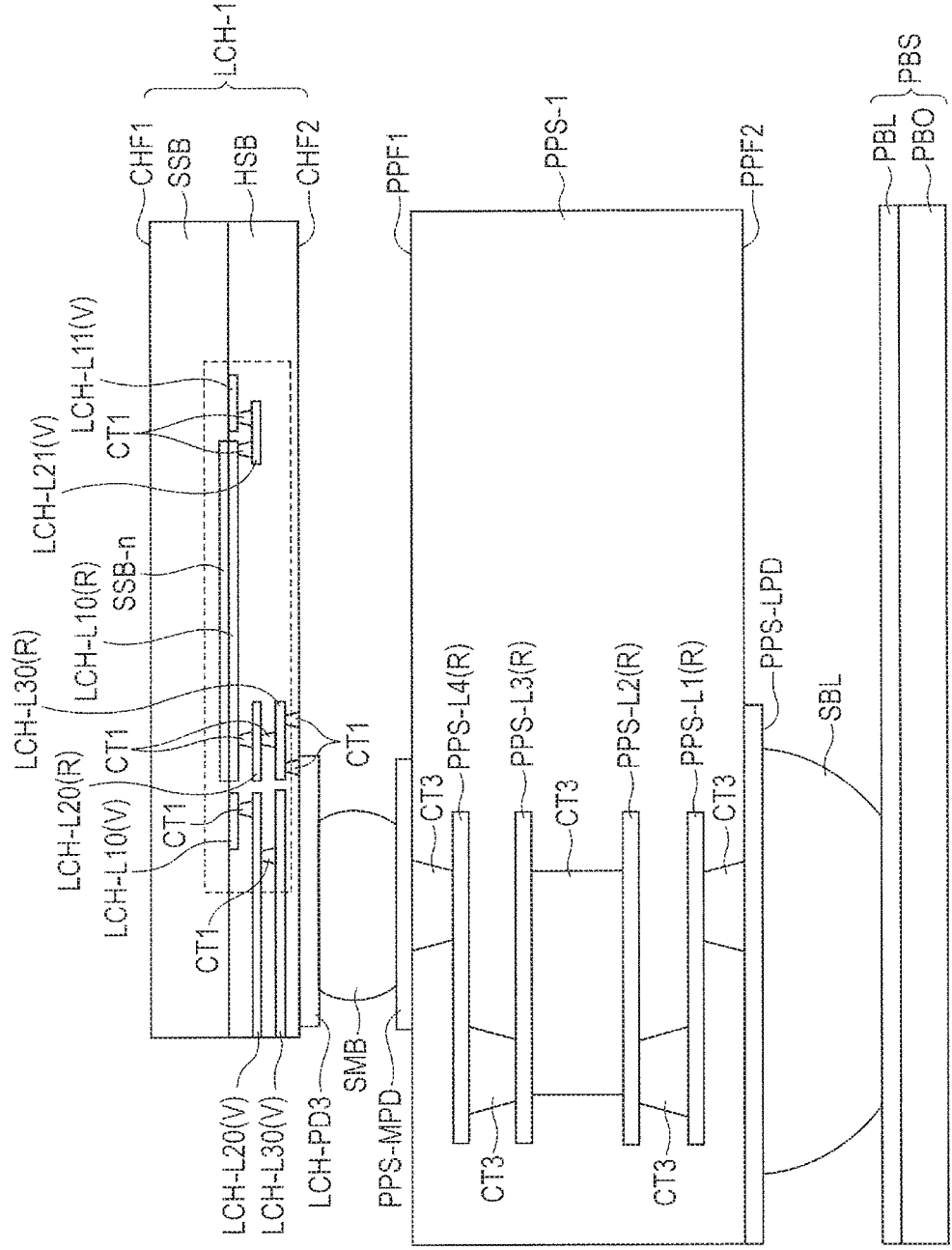
FIG. 17 is a cross section illustrating a section of a semiconductor device according to a fourth embodiment.
Figure 18A:
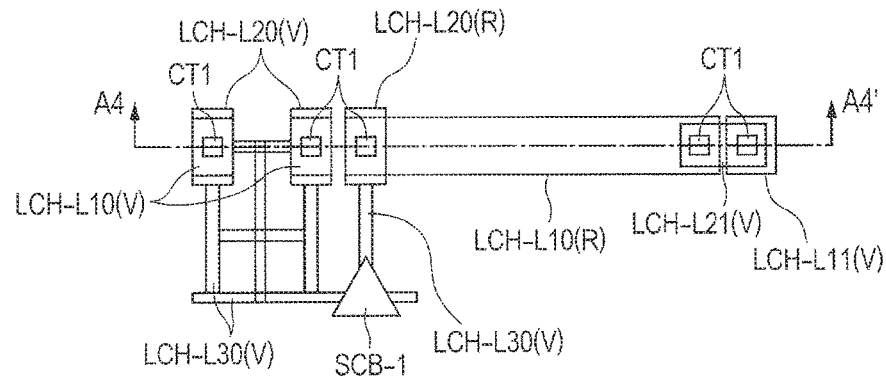
FIGS. 18A to 18C are a plan view and cross sections of the semiconductor device according to the fourth embodiment.
Figure 18B:
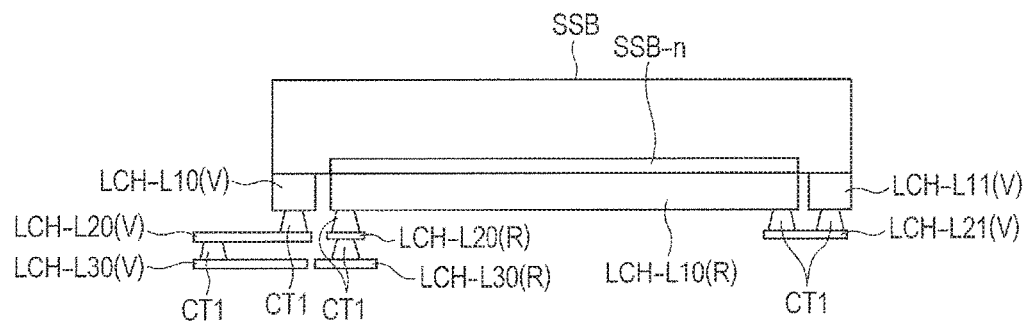
Figure 18C:
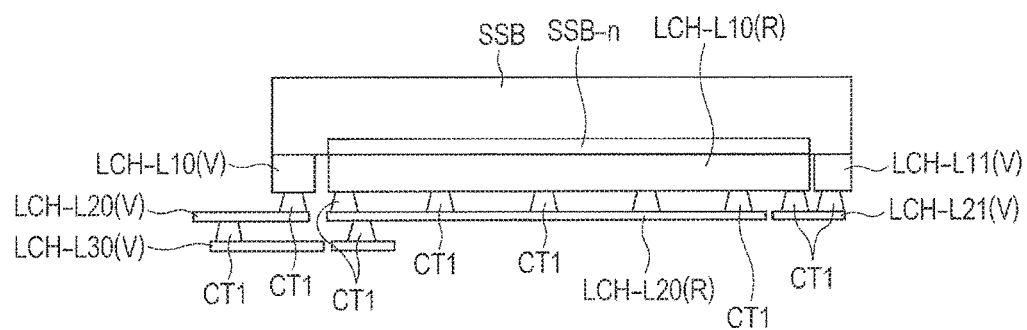

FIG. 17 is a cross section illustrating a section of a semiconductor device like FIG. 15. FIGS. 18A to 18C are diagrams illustrating the structure of the delay element like FIGS. 16A to 16C. FIG. 18A is a plan view illustrating the structure of the delay element, and the A4-A4' section in FIG. 18A is illustrated in FIG. 17. FIG. 18B is a cross section illustrating a section of the delay element like FIG. 16B.

In the fourth embodiment, to form the PN junction diode of the distributed constant type, in the silicon semiconductor substrate SSB, a semiconductor region of the conduction type opposite to that of the silicon substrate SSB is formed.

In FIGS. 17 and 18B, SSB-n indicates a semiconductor region formed in the silicon substrate SSB. The silicon substrate SSB is, for example, a P-type silicon substrate. In this case, the semiconductor region SB-n is an N-type semiconductor region of the conduction type opposite to the P type. Consequently, in the junction part between the P-type silicon substrate SSB and the N-type semiconductor region, a PN-type diode is formed.

The N-type semiconductor region SSB-n extends in the lateral direction in FIG. 17 and FIGS. 18B and 18C. The N-type semiconductor region SSB-n extending in the lateral direction is ohmic-coupled to the wiring pattern LCH-L10 (R). In the third embodiment, the wiring pattern LCH-L10 (R) is formed over the silicon substrate SSB via the gate oxide film and functions as the gate electrode. In the fourth embodiment, the wiring pattern LCH-L10(R) functions as the electrode of the PN junction diode.

In this case, the P-type silicon substrate SSB is coupled to the predetermined voltage Vs (for example, the ground voltage of the circuit). In the embodiment, since the delay element DLN is comprised of the PN junction diode, current flowing in the PN junction diode can be increased. An equivalent circuit of the delay element DLN comprised of the PN junction diode is the same as the equivalent circuit illustrated in FIG. 1B. Since diode current flowing in the PN junction diode can be regarded as current flowing in the PN junction diode which is coupled in parallel in the equivalent circuit, according to the fourth embodiment, the delay element DLN having larger conductance G can be formed.

FIG. 18C is similar to FIG. 16C. In FIG. 18C, the wiring pattern LCH-L20(R) is disposed so as to extend along the wiring pattern LCH-L10(R). The extended wiring pattern LCH-L20(R) is coupled in parallel to the wiring pattern LCH-L10(R) by the plurality of contacts CT1. In such a manner, the combined resistance of the wiring patterns LCH-L10(R) and LCH-L20(R) can be reduced. That is, the resistance of the electrode of the PN junction diode can be reduced. In the fourth embodiment, to reduce the resistance of the electrode of the diode, the wiring pattern LCH-L20(R) is extended. Consequently, different from the third embodiment, the extended wiring pattern LCH-L20(R) is electrically isolated from the wiring pattern LCH-L21(V) coupled to the P-type silicon substrate.

Although the case that the silicon substrate SSB is the P-type silicon substrate has been described as an example, like the third embodiment, the present invention is not limited to the case. The silicon substrate SSB may be an N-type silicon substrate or a well of the P type or the N type. Obviously, in the case of the N-type silicon substrate or the well of the N type, a P-type semiconductor region is used in place of the N-type semiconductor region SSB-n.

In the third and fourth embodiments, the digital filter coupled to the output terminal of the transmission buffer circuit SCB1-1 has been described as an example. Obviously, the digital filter described in the third and fourth embodiments may be coupled to the input terminal of the reception buffer circuit RCB1-2.

Fifth Embodiment

In the first to fourth embodiments, the signal line transmitting a single-phase signal has been described as an example. The digital filter can be also applied to a signal line transmitting a differential signal. Also in this case, while reducing the consumption power, a signal can be restored (shaped). A mode of using the digital filter for the signal line transferring the differential signal will be described as a fifth embodiment.

Figure 19:
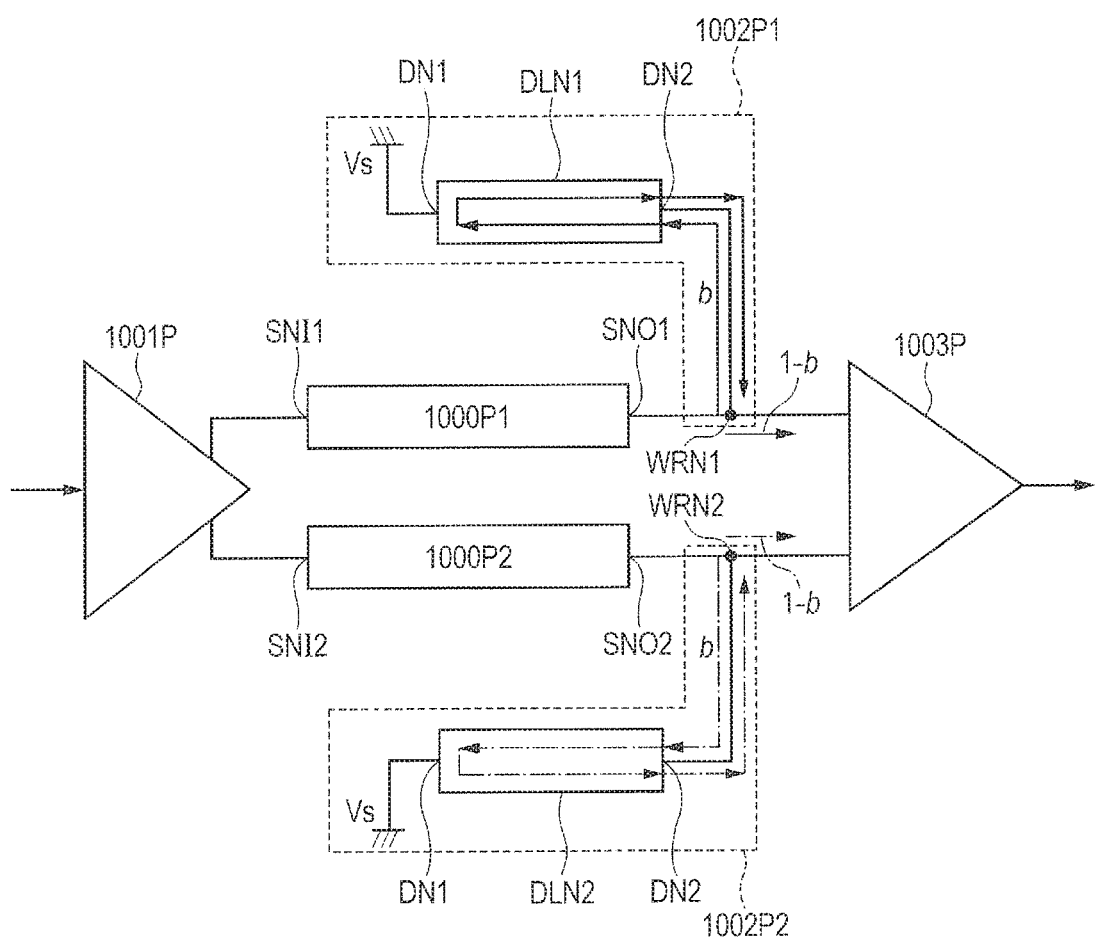
FIG. 19 is a block diagram illustrating the configuration of a digital filter according to a fifth embodiment.

FIG. 19 is a block diagram illustrating the configuration of a digital filter according to a fifth embodiment. In FIG. 19, 1001P denotes a transmission buffer circuit having a pair of output terminals, and 1003P indicates a reception buffer circuit having a pair of input terminals. The transmission buffer circuit 1001P is provided, for example, for the SerDes circuit in the logic semiconductor chip LCH-2 illustrated in FIG. 6, and the reception buffer circuit 1003P is provided for the SerDes circuit in the logic semiconductor chip LCH-1 illustrated in FIG. 6. The transmission buffer circuit 1001P receives a signal to be transmitted and generates differential signals according to the received signal. The transmission buffer circuit 1001P generates, for example, a pair of serial signals whose phases are inverted as differential signals at transfer speed of 56 Gpbs. The generated differential signals are supplied from the pair of output terminals of the transmission buffer circuit 1001P to ends SNI1 and SNI2 of a pair of signal lines (first and second signal lines) 1000P1 and 1000P2. Specifically, one of the pair of serial signals generated is supplied to the end ENI1 of the signal line (first or second signal line) 1000P1, and the other serial signal is supplied to the end SNI2 of the signal line (second or first signal line) 1000P2.

The pair of signal lines 1000P1 and 1000P2 is comprised of wiring patterns and contacts coupling the transmission buffer circuit 1001P disposed in the logic semiconductor chip LCH-1 and the reception buffer circuit 1003P disposed on the logic semiconductor chip LCH-2. For example, a pair of wiring patterns and the like formed in the print substrate PBS are included in the pair of signal lines 1000P1 and 1000P2.

The differential signals supplied to the ends SNI1 and SNI2 of the pair of signal lines 1000P1 and 1000P2 propagate through the signal lines 1000P1 and 1000P2 and are transmitted to ends SNO1 and SNO2 of the signal lines 1000P1 and 1000P2. The pair of signal lines 1000P1 and 1000P2 are coupled to a pair of digital filters 1002P1 and 1002P2 at nodes WRN1 and WRN2, respectively.

A pair of input terminals of the reception buffer circuit 1003P is coupled to the nodes WRN1 and WRN2. Specifically, one of the pair of input terminals of the reception buffer circuit 1003P is coupled to the node WRN1, and the other input terminal is coupled to the node WRN2. The reception buffer circuit 1003P amplifies the differential signals supplied to the pair of input terminals and outputs a resultant signal. It can be regarded that the reception buffer circuit 1003P has a differential circuit coupled to the pair of input terminals. In this case, the differential signals supplied to the pair of input terminals are amplified by the differential circuit. An output from the reception buffer circuit 1003P is processed in the SerDes circuit.

The pair of digital filters 1002P1 and 1002P2 have the same configuration which is the same as that of the digital filter 1002 described in the first to fourth embodiments. The digital filter 1002P1 has a delay element DLN1 having a pair of ends DN1 and DN2, and the digital filter 1002P2 has a delay element DLN2 having a pair of ends DN1 and DN2.

At node WRN, the one end DN2 of the delay element DLN1 is wired-OR coupled to the end SNO1 of the signal line 1000P1 and one of the input terminals of the reception buffer circuit 1003P and the other end DN1 is coupled to the predetermined voltage Vs. Also in the delay element DLN2, like the delay element DLN1, at the node WRN, one end DN2 is wired-OR coupled to the end SNO2 of the signal line 1000P2 and the other input terminal of the reception buffer circuit 1003P, and the other end DN1 is coupled to the predetermined voltage Vs.

Correspondence between the digital filter 1002 described in the first embodiment and the pair of digital filters 1002P1 and 1002P2 will be described as follows. Each of the delay elements DLN1 and DLN2 illustrated in FIG. 19 corresponds to the delay element DLN described in FIG. 1A and operates in a manner similar to the delay element DLN.

Since the operation is similar, detailed description will not be repeated. One end DN2 of each of the delay elements DLN1 and DLN2 functions as a signal input/output terminal. A signal according to the signal distribution ratio "b" in signals output from the end SNO1 of the signal line 1000P1 is input to the delay element DLN1 and, after the round-trip signal delay UT/m, an attenuated signal is output (solid-line arrow). The signal output from the delay element DLN1 is combined at the wired-OR-coupling part (node WRN1), and a combined signal is supplied to one of the input terminals of the reception buffer circuit 1003P. Similarly, a signal according to the signal distribution ratio "b" in signals output from the end SNO2 of the signal line 1000P2 is input to the delay element DLN2 and, after the round-trip signal delay UT/m, an attenuated signal is output (alternate long and short dash arrow). The signal output from the delay element DLN2 is combined at the wired-OR-coupling part (node WRN2), and a combined signal is supplied to the other input terminal of the reception buffer circuit 1003P.

As described above, to each of the pair of input terminals of the reception buffer circuit 1003P, the signal restored (shaped) by the combination is supplied. Since the pair of digital filters 1002P1 and 1002P2 is formed by the delay elements DLN1 and DLN2 as passive elements, respectively, while reducing consumption power, signal deterioration caused by the loss in the pair of signal lines can be restored.

Each of the delay elements DLN1 and DLN2 may be formed in the interposer as described in the first and second embodiments or formed in the semiconductor chip as described in the third and fourth embodiments. FIG. 19 illustrates the example of coupling the pair of digital filters 1002P1 and 1002P2 to the pair of input terminal sides of the reception buffer circuit 1003P. The pair of digital filters 1002P1 and 1002P2 may be coupled to the pair of output terminal sides of the transmission buffer circuit 1001P.

Sixth Embodiment

Figure 20:
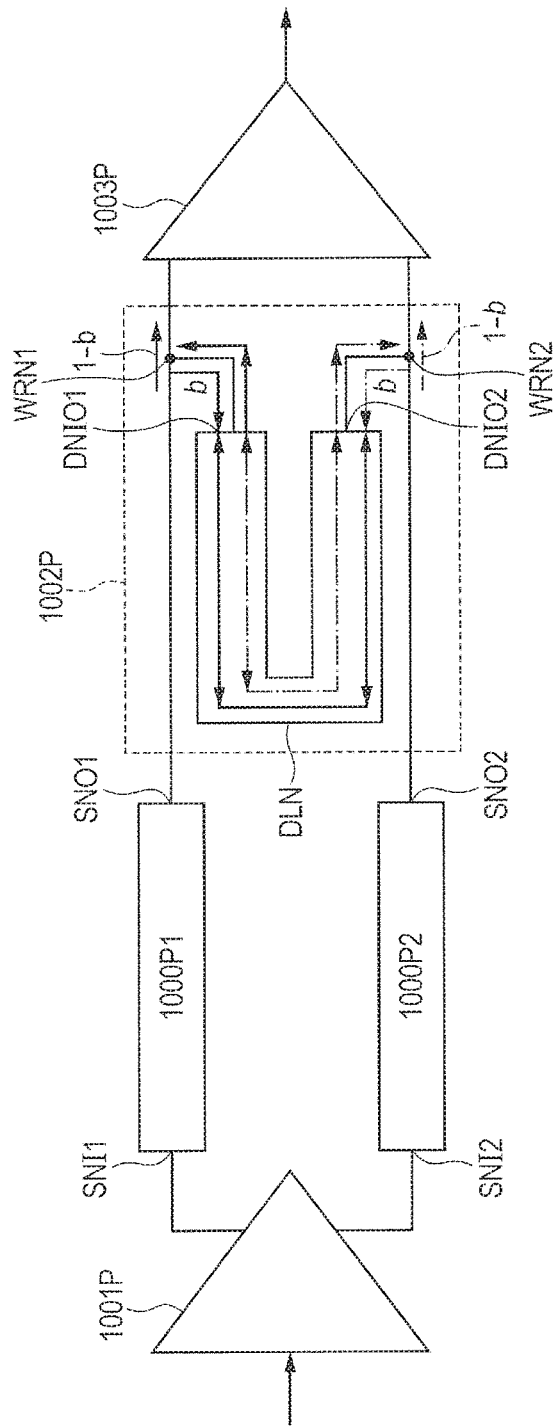
FIG. 20 is a block diagram illustrating the configuration of a digital filter according to a sixth embodiment.

FIG. 20 is a block diagram illustrating the configuration of a digital filter according to a sixth embodiment. Also in the sixth embodiment, a digital filter adapted to a signal line transmitting differential signals is provided. Since FIG. 20 is similar to FIG. 19, the different points will be mainly described.

In FIG. 20, the pair of signal lines 1000P1 and 1000P2, the transmission buffer circuit 1001P, and the reception buffer circuit 1003P are the same as those of FIG. 19, so that the description will not be repeated. In FIG. 19, the digital filters 1002P1 and 1002P2 are provided for the signal lines 1000P1 and 1000P2, respectively. In contrast, in the sixth embodiment, one digital filter 1002P is provided for the pair of signal lines 1002P1 and 1002P2.

The digital filter 1002P includes the delay element DLN having a pair of ends DNIO1 and DNIO2. The end DNIO1 as one of the ends of the delay element DLN is wired-OR-coupled to the end SNO1 of the signal line 1001P1 and one input terminal of the reception buffer circuit 1003P at the node WRN1. Similarly, the other end DNIO2 of the delay element DLN is wired-OR-coupled to the end SNO2 of the signal line 1001P2 and the other input terminal of the reception buffer circuit 1003P at the node WRN2. Different from the delay element DLN described in the first to fifth embodiments, the delay element DLN does not have an end coupled to the predetermined voltage Vs.

In FIG. 20, the delay element DLN is drawn folded in its plane shape. However, the invention is not limited to the plane shape. For example, like the wiring pattern INS-L10 illustrated in FIG. 7, the plane shape may be linear. In the case of using the wiring pattern INS-L10 as the signal wire in the delay element DLN illustrated in FIG. 20, the wiring patterns INS-L10 and INS-L13 are separated, one end of the wiring pattern INS-L10 is coupled to the node WRN1 in FIG. 20, and the other end is coupled to the node wRN2 in FIG. 20. Also in this case, in plan view, in a manner similar to FIG. 7, the wiring pattern L10 extends between the wiring patterns INS-L11 and INS-L12 as voltage wires as components of the delay element DLN in parallel to the wiring patterns INS-L11 and INS-L12.

The delay element DLN illustrated in FIG. 20 is set to have a round-trip signal delay corresponding to sum of a round-trip signal delay of the delay element DLN1 and a round-trip signal delay of the delay element DLN2. The signal loss amount of the delay element DLN illustrated in FIG. 20 is set to be the sum of a signal loss amount (db) of the delay element DLN1 and a signal loss amount (db) of the delay element DLN2. Since the delay elements DLN1 and DLN2 illustrated in FIG. 19 have the same configuration, the delay element DLN illustrated in FIG. 20 is formed by a wiring pattern having a length which is twice as long as that of the delay element DLN1.

A pair of signals (serial signals) forming differential signals can be considered that, when viewed from one signal (other signal), the other signal (one signal) functions as a reference potential. That is, the phases function as reference potentials each other. In the sixth embodiment, one of differential signals is input to the end DNIO1 of the delay element DLN, and the other differential signal is input to the other terminal DNIO2 of the delay element DLN. Consequently, when the signal input to the end DNIO1 is viewed, the reference potential to the signal is supplied to the other end DNIO2. Similarly, when the signal input to the other end DNIO2 is viewed, the reference potential to the signal is supplied to the end DNIO1.

As a result, the signal input to the end DNIO1 of the delay element DLN is reflected by the other end DNIO2 of the delay element DLN, and the reflected signal is output from the end DNIO1 (solid-line arrow). Similarly, the signal input to the other end DNIO2 of the delay element DLN is reflected by the end DNIO1 of the delay element DLN, and the reflected signal is output from the other end DNIO2 (arrow of the alternate long and short dash line).

Since the pair of signals input to one end DNIO1 and the other end DNIO2 of the delay element DLN are differential signals, when the signal input to the other end DNIO2 (or one end DNIO1) is used as a reference potential, the signal input to the end DNIO1 (or the other end DNIO2) has a value twice as high as the center potential of the pair of signals (predetermined voltage Vs). Consequently, the signal attenuation amount of the delay element DLN is set to twice (sum of the signal attenuation amount (db) of the delay element DLN1 and the signal attenuation amount (db) of the delay element DLN2).

The pair of signals as differential signals change at the same frequency. Consequently, when the signal input to the other end DNIO2 functions as the reference potential, in the case of regarding the reference potential as a fixed reference potential which does not change with time, it can be regarded that the signal input to the end DNIO1 has frequency of twice. Consequently, the round-trip signal delay of the delay element DLN is doubled.

As the delay element DLN is sufficiently short, the round-trip signal delay of the delay element DLN depends on the length of the delay element DLN. Therefore, by setting the sum of the delay elements DLN1 and DLN2 illustrated in FIG. 19 to the length of the delay element DLN, a round-trip signal delay of twice can be obtained.

The round-trip signal delay is a value obtained by dividing the data width interval UT by the integer "m", and the round-trip signal delay of twice relates to the case where the integer "m" is 1. "Twice" is an example, and it is sufficient to determine the length or the like of the delay element DLN so that the round-trip signal delay occurs integer (m) number of times including one in the one data width interval UT.

A signal output from the end DNIO1 of the delay element DLN is combined at the node WRN1. Similarly, a signal output from the end DNIO2 of the delay element DLN is combined at the node WRN2. As a result, the restored (shaped) differential signals are supplied to the pair of input terminals of the reception buffer circuit 1003P. That is, while reducing consumption power, the waveform deformed in the signal line can be shaped.

In the sixth embodiment, when noise of the same phase occurs in the pair of signal lines 1000P1 and 1000P2, the reference potential supplied to the end DNIO2 or DNIO1 of the delay element changes according to the noise. As a result, an output signal from the end DNIO1 or DNIO2 is not influenced by the noise. That is, the influence of the noise can be reduced.

Although FIG. 20 illustrates the example that the digital filter 1002P is provided on the reception buffer circuit 1003P side, the digital filter 1002P may be provided on the transmission buffer circuit 1001P side. As described in the first to fourth embodiments, the delay element DLN may be formed in the interposer or the semiconductor chip.

Seventh Embodiment

In the fifth and sixth embodiments, the digital filter used for the signal lines (differential signal lines) transmitting differential signals has been described. In a seventh embodiment, a more concrete mode of a digital filter used for the signal lines (differential signal lines) transmitting differential signals is provided.

Differential Signal and Common Mode Signal

Figure 24:
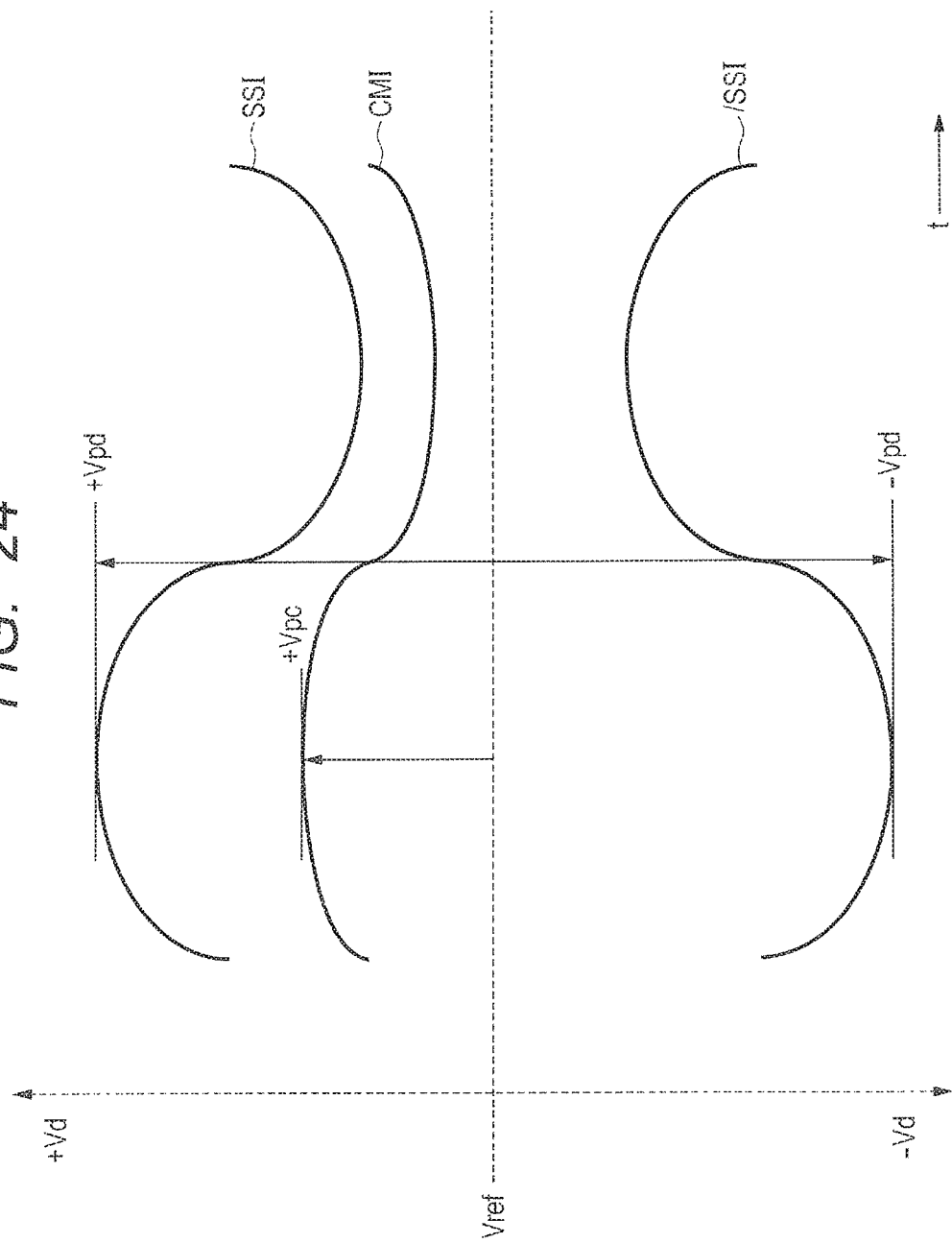
FIG. 24 is a waveform chart illustrating voltage waveforms of a differential signal.

First, an example of differential signals transmitted through the signal lines will be described with reference to FIG. 24. FIG. 24 is a waveform chart illustrating voltage waveforms of differential signals. In the diagram, the horizontal axis indicates time "t" and the vertical axis indicates voltage. In the vertical axis, Vref denotes reference voltage. +Vd indicates voltage whose voltage value is higher than the reference voltage Vref, and −Vd indicates voltage lower than the reference voltage Vref.

The differential signals are a pair of signals whose voltages change complementarily with lapse of time. In FIG. 24, the pair of signals are indicated as reference characters SSI and /SSI. When the signal SSI changes with lapse of time in the range of a voltage higher than the reference voltage Vref, the signal /SSI changes with lapse of time in the range of a voltage lower than the reference voltage Vref. Changes of the signals SSI and /SSI accompanying the lapse of time are complementarily. Specifically, when the voltage of the signal SSI changes so as to increase from the reference voltage Vref toward the voltage +Vd, the voltage of the signal /SSI changes so as to decreases from the reference voltage Vref toward the voltage −Vd. Similarly, when the signal SSI changes so as to decrease from the voltage +Vd toward the reference voltage Vref, the voltage of the signal /SSI changes so as to increase from the voltage −Vd toward the reference voltage Vref.

For example, the differential circuit detects and/or amplifies the voltage difference between the pair of signals SSI and /SSI. In the specification, hereinafter, when there is no need to clearly describe, each of the pair of signals SSI and /SSI will be called a differential signal.

In FIG. 24, +Vpd indicates peak voltage when the differential signal SSI changes, and −Vpd indicates peak voltage when the differential signal /SSI changes. Description will be given on assumption that the absolute value of the voltage of the differential signal SSI and the absolute value of the voltage of the differential signal /SSI are equal. Consequently, the absolute value of the voltage from the reference voltage Vref to the peak voltage +Vpd and the absolute value of the voltage from the reference voltage Vref to the peak voltage −Vpd are equal.

In FIG. 24, CMI indicates a common mode signal synchronized with the differential signals SSI and /SSI. In FIG. 24, the common mode signal CMI is indicated as a signal having the same phase as that of the differential signal SSI. Specifically, the common mode signal CMI increases synchronously with increase in the differential signal SSI and decreases synchronously with decrease in the differential signal SSI. In FIG. 24, the peak voltage of the common mode signal CMI relative to the reference voltage Vref is indicated as +Vpc.

When the common mode signal CMI is superimposed on each of the differential signals SSI and /SSI as noise, the voltage of each of the differential signals SSI and /SSI increases only by the voltage amount of the common mode signal CMI. In this case, since the common mode signal CMI is superimposed as noise, the common mode signal CMI can be regarded as common mode noise CMI and therefore will be also called as common mode noise CMI. Even when the voltages of the differential signals SSI and /SSI change due to the common mode noise CMI, the voltage difference does not change, so that the differential circuit can output a detection result and/or an amplification result which is not influenced by the common mode noise CMI.

Single-End Digital Filter

In the fifth embodiment, as illustrated in FIG. 19, the pair of signals (differential signals SSI and /SSI) are supplied from the pair of output terminals of the transmission buffer circuit 1001P to the ends SNI1 and SNI2 of the pair of signal lines 1000P1 and 1000P2. The differential signals SSI and /SSI propagate through the signal lines 1000P1 and 1000P2 and are transmitted to the ends SNO1 and SNO2 of the signal lines 1000P1 and 1000P2. In the fifth embodiment, the pair of signal lines 1000P1 and 1000P2 are coupled to the pair of digital filters 1002P1 and 1002P2 at the nodes WRN1 and WRN2.

As illustrated in FIG. 19, the digital filters 1002P1 and 1002P2 have the delay elements DLN1 and DLN2 each having the other end DN1 coupled to the predetermined voltage Vs. Since the other end DN1 is coupled to the predetermined voltage Vs such as the ground voltage, each of the digital filters 1002P1 and 1002P2 illustrated in FIG. 19 can be regarded as the single-end digital filter.

Common Mode Signal

The transmission buffer circuit 1001P illustrated in FIG. 19 supplies a pair of differential signals to the pair of signal lines 1000P1 and 1000P2. In reality, the transmission buffer circuit 1001P generates some common mode signals. When an asymmetric part exists between the signal lines 1000P1 and 1000P2, there is a case that a common mode signal is generated. The common mode signal generated in such a manner is applied as noise to each of the signal lines 1000P1 and 1000P2. The digital filters (single-end digital filters) 1002P1 and 1002P2 illustrated in FIG. 19 operate so as to equalize the given common mode signal (common mode noise). The inventors of the present invention examined that, in the case of the single-end digital filter, not only the differential signals but also the common mode noise are equalized. The result of the examination will now be described.

Figure 25A:
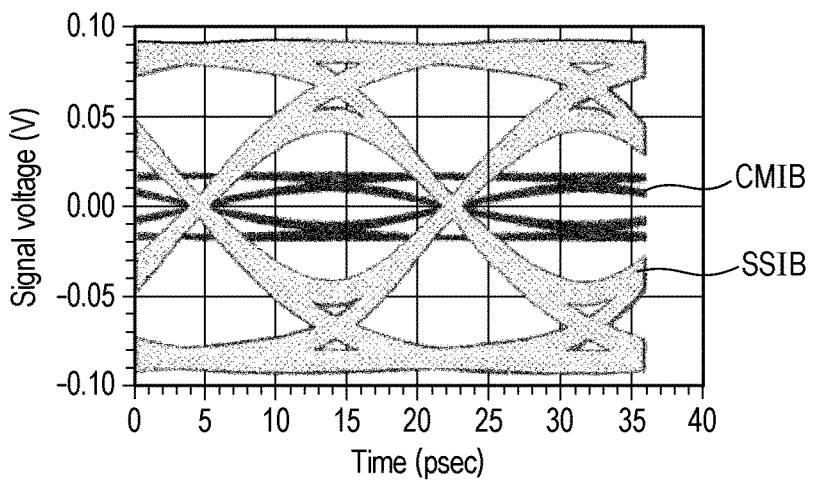
FIGS. 25A to 25C are diagrams illustrating eye patterns of a single-end digital filter.
Figure 25B:
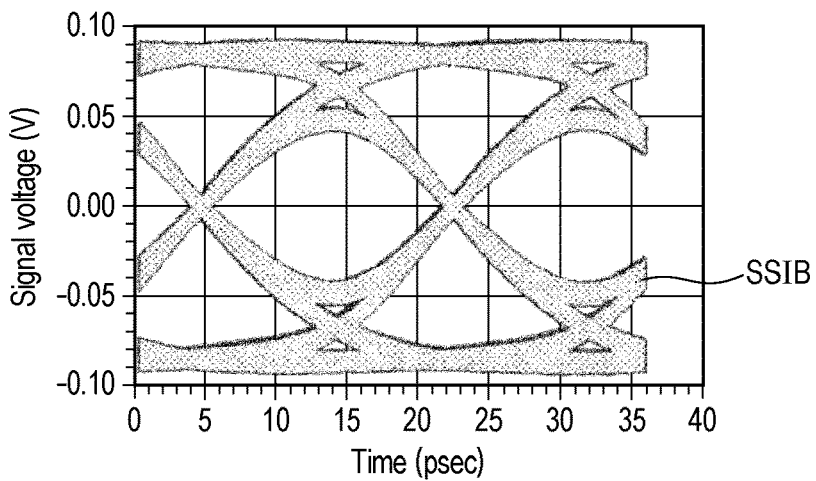
Figure 25C:
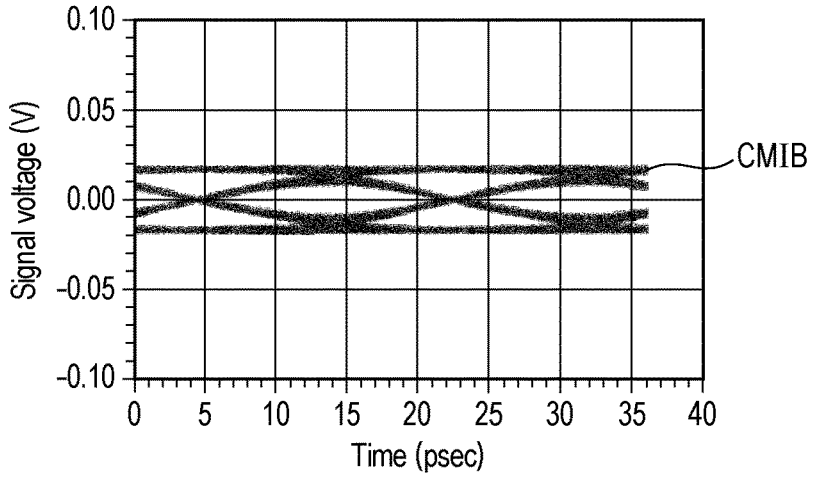

FIGS. 25A to 25C are diagrams illustrating eye patterns in the case of configuring each of the digital filters 1002P1 and 1002P2 by a single-end digital filter. In FIGS. 25A to 25C, the horizontal axis indicates time, and the vertical axis indicates signal voltage. The eye pattern is obtained under conditions similar to those of FIGS. 9A and 9B. Specifically, FIGS. 25A to 25C illustrate a case that an FR4 substrate is used as the print substrate, the logic semiconductor chips LCH-1 and LCH-2 as illustrated in FIG. 6 are mounted on the print substrate so that the interval becomes four inches, and differential signals in the NRZ format are supplied from the logic semiconductor chip LCH-2 to the logic semiconductor chip LCH-1 at transmission speed of 56 Gbps via the wiring pattern of the print substrate. As the interposer, a silicon interposer is used. In FIGS. 25A to 25C, the reception buffer circuit 1003P as illustrated in FIG. 19 is used as the reception buffer circuit of the logic semiconductor chip LCH-1, and a pair of differential signals are supplied to the reception buffer circuit 1003P via the pair of signal lines 1000P1 and 1000P2 as illustrated in FIG. 19.

FIG. 25A is a diagram of eye patterns drawn by overlapping signal voltage waveforms at the input terminal of the reception buffer circuit 1003P in a state where the digital filters 1002P1 and 1002P2 are coupled to the nodes WRN1 and WRN2 as illustrated in FIG. 19. In FIG. 25A, a dotted waveform SSIB is a signal voltage waveform generated by equalizing components of the differential signals SSI and /SSI, and a solid-line waveform CMIB indicates a signal voltage waveform generated by equalizing components of the common mode noise CMI. FIG. 25 illustrates the case where the value of the peak voltage +Vpc (FIG. 24) of the common mode noise CMI is 20% of the voltage difference between the peak voltage +Vpd of the differential signal SSI and the peak voltage −Vpd of the differential signal /SSI.

FIG. 25B is a diagram illustrating eye patterns obtained by extracting the signal voltage waveform SSIB generated by equalizing the components of the differential signals SSI and /SSI from FIG. 25A. FIG. 25C is a diagram illustrating eye patterns obtained by extracting the signal voltage waveform CMIB generated by equalizing the components of the common mode signal CMI from FIG. 25A.

It is understood from FIG. 25B that since the eye pattern is open, the components of the differential signals SSI and /SSI are equalized by the digital filters 1002P1 and 1002P2 and the transmitted differential signals can be identified. However, as illustrated in FIG. 25C, the eye pattern is open with respect to the components of the common mode signal CMI. That is, the components of the common mode signal CMI are also equalized by the digital filters 1002P1 and 1002P2. As a result, as illustrated in FIG. 25A, in the eye pattern, the signal voltage waveform SSBIB generated by equalizing the components of the differential signals SSI and /SSI and the signal voltage waveform CMIB generated by equalizing the components of the common mode noise mixedly exist.

In the mixedly existing state, for example, in the case of identifying the logic value of a transmitted differential signal (serial signal) in the reception buffer circuit 1003P, the logic value of the differential signal is erroneously identified on the basis of the signal voltage waveform CMIB of the common mode signal CMI, and it causes erroneous operation. Skew It is desirable that the pair of differential signals SSI and /SSI change synchronously with each other but there is a case that delay (skew) occurs between the differential signals SSI and /SSI. For example, delay occurs between the differential signals SSI and /SSI due to variations in the characteristic of the transmission buffer circuit 1001P (FIG. 19), variations in delay between the signal lines 1000P1 and 1000P2, and the like. As an example, a timing the voltage of the differential signal /SSI changes delays from a timing the voltage of the differential signal SSI changes.

Figure 26A:
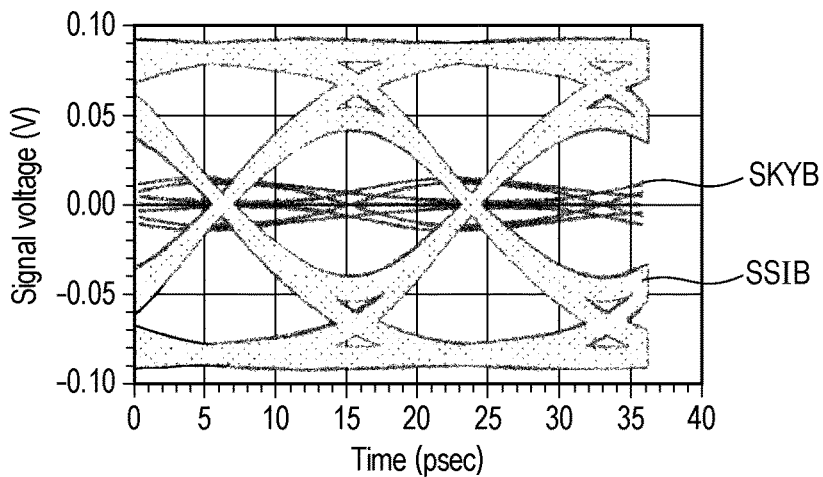
FIGS. 26A to 26C are diagrams illustrating eye patterns of a single-end digital filter.
Figure 26B:
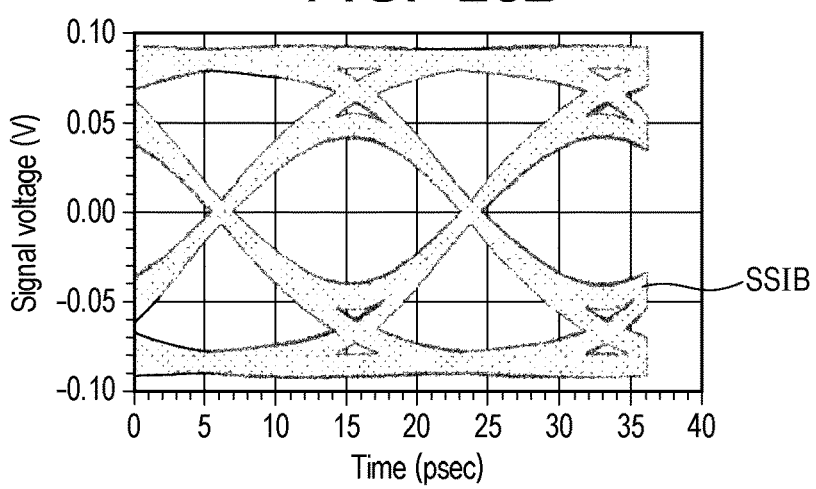
Figure 26C:
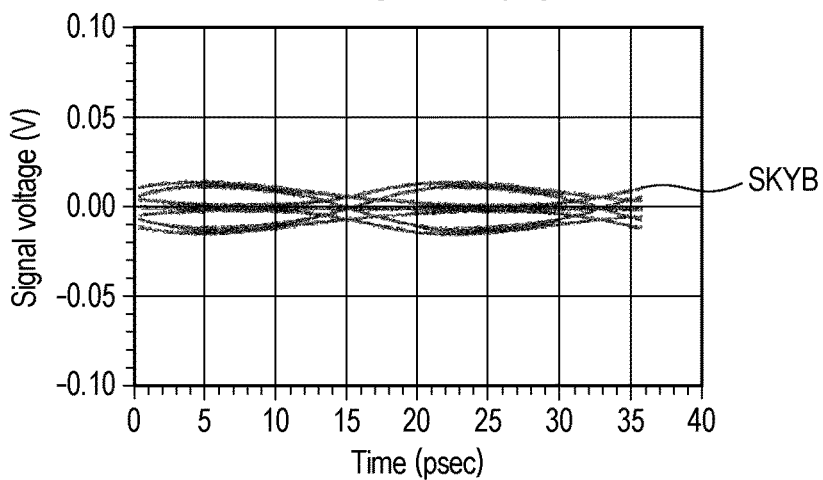

The inventors of the present invention also examined the eye patterns in the case where there is a skew between the pair of differential signals SSI and /SSI. FIGS. 26A to 26C are diagrams illustrating eye patterns examined by the inventors of the present invention. FIGS. 26A to 26C also illustrate the eye patterns in the case where each of the digital filters 1002P1 and 1002P2 is a single-end digital filter. FIGS. 26A to 26C illustrate eye patterns in the case where skew of three picoseconds (psec) exists between the differential signals SSI and /SSI due to delay variations in the signal lines. Also in FIGS. 26A to 26C, the horizontal axis indicates time, and the vertical axis indicates signal voltage. The eye patterns illustrated in FIGS. 26A to 26C are obtained by conditions similar to those of FIGS. 25A to 25C.

In FIG. 26A, the dotted waveform SSIB indicates the signal voltage waveform generated by equalizing the components of the differential signals SSI and /SSI, and the solid-line waveform SKYB indicates a signal voltage waveform generated by equalizing the skew. Like FIG. 25B, FIG. 26B is a diagram illustrating eye patterns obtained by extracting the signal voltage waveform SSIB generated by the components of the differential signals SSI and /SSI from FIG. 26A. FIG. 26C is a diagram illustrating the eye patterns by extracting the signal voltage waveform SKYB generated by the skew.

FIGS. 25A to 25C illustrate the case where the common mode noise CMI of the phase same as that of the differential signals is mixed in the differential signals SSI and /SSI. Consequently, the phase of the signal voltage waveform SSIB generated by the components of the differential signals and that of the signal voltage waveform CMIB generated by the component of the common mode noise CI are the same. That is, the phase of the eye pattern by the signal voltage waveform SSIB and that of the eye pattern by the signal voltage waveform CMIB are the same, and the timing the eye pattern by the signal voltage waveform SSIB is open and that the eye pattern by the signal voltage waveform CMIB is open match. In contrast, in FIGS. 26A to 26C, the timing the eye pattern by the signal voltage waveform SKYB caused by skew is open is deviated from the timing the eye pattern generated by the signal voltage waveform SSIB is open.

Also in the case where the skew exists, as illustrated in FIG. 26C, the eye pattern according to the skew exists, so that an erroneous operation is caused like the case where the common mode signal CMI is mixed.

Configuration of Digital Filter

Figure 27A:
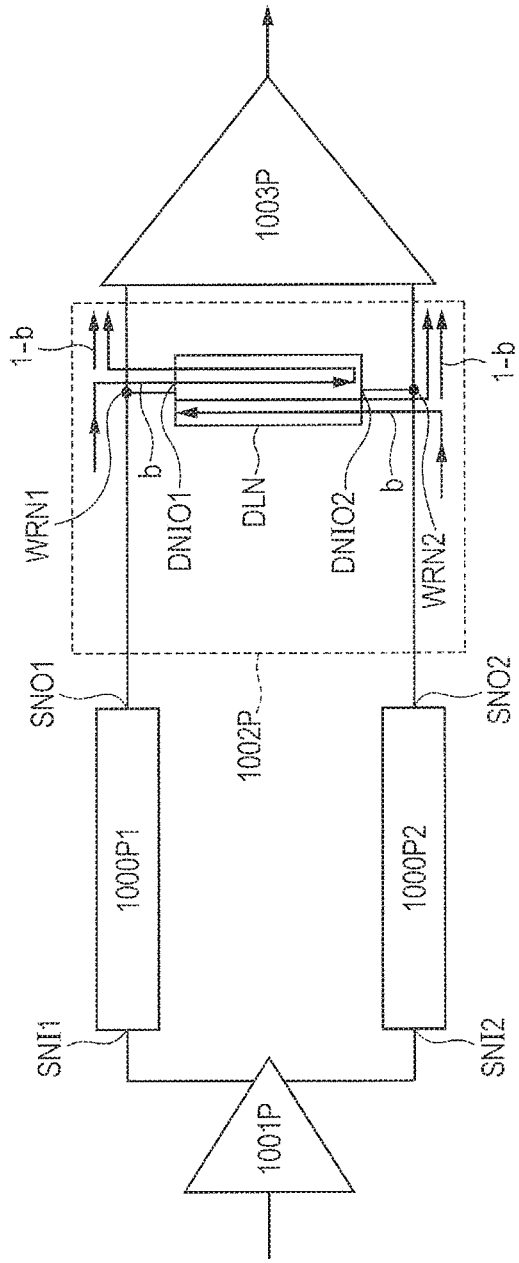
FIGS. 27A and 27B are diagrams illustrating the configuration of a digital filter according to a seventh embodiment and an equivalent circuit.
Figure 27B:
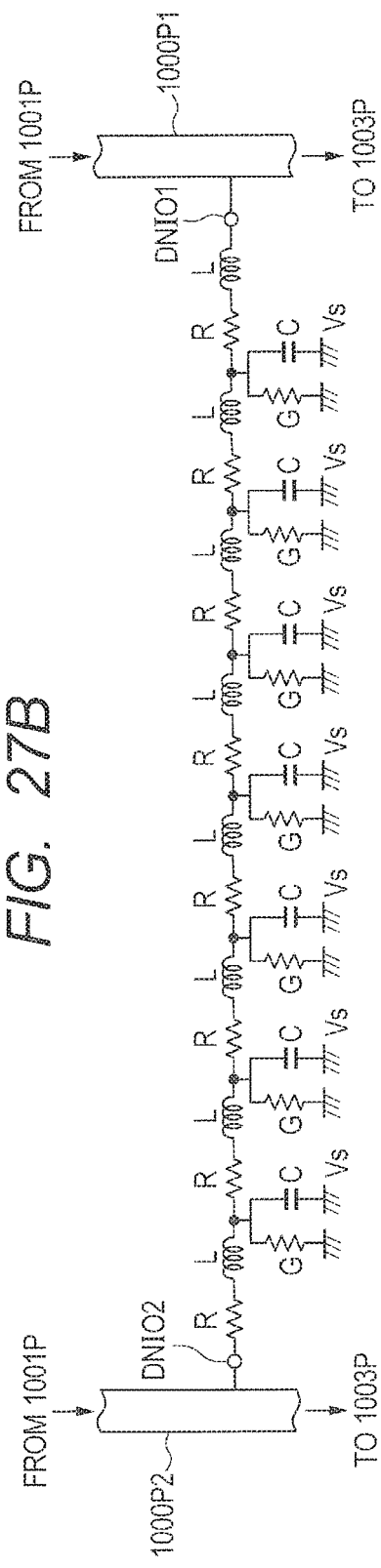

FIGS. 27A and 27B are diagrams illustrating the configuration of a digital filter according to the seventh embodiment and an equivalent circuit of the digital filter. FIG. 27A illustrates the configuration of the digital filter, and FIG. 27B illustrates an equivalent circuit of the digital filter depicted in FIG. 27A.

Since FIG. 27A is similar to the configuration of the digital filter illustrated in FIG. 20, only the different point will be described. In the digital filter illustrated in FIG. 20, the delay element DLN is comprised of a bended delay wire (hereinbelow, also called delay line). On the other hand, in the seventh embodiment, the delay element DLN is comprised of a delay line of a linear shape. However, also in the seventh embodiment, as illustrated in FIG. 20, the delay element DLN may be also comprised of a bended delay line. Except for the point that the delay element DLN is comprised of a delay line of a linear shape, the configuration and operation of the digital filter illustrated in FIG. 27A are similar to those of FIG. 20.

The equivalent circuit illustrated in FIG. 27B is similar to that illustrated in FIG. 1B. The different point is that the ends DNIO1 and DNIO2 of the delay element DLN are coupled to the signal lines 1000P1 and 1000P2. That is, the end DNIO1 of the delay element DLN is wired-OR-coupled to the signal line 1000P1, and the end DNIO2 is wired-OR-coupled to the signal line 1000P2. Each of the signal lines 1000P1 and 1000P2 is coupled between the transmission buffer circuit 1001P and the reception buffer circuit 1003P, and the wired-OR coupling to the delay element DLN is performed near the reception buffer circuit 1003P.

In the equivalent circuit diagram illustrated in FIG. 27B, like FIG. 1B, the inductance L, the delay element DLN is expressed by a π-type distributed constant circuit comprised of the inductance L, the resistance R, the capacitance C, and the conductance G. Although the distributed constant circuit is expressed so that the inductance L and the resistance R are coupled to each of the ends DNIO1 and DNIO2 in FIG. 27B, the invention is not limited to the configuration. As will be described later, the voltage wire is disposed along the delay line as a component of the delay element DLN. To the voltage wire, the predetermined voltage Vs is supplied. The predetermined voltage Vs supplied to the voltage wire functions as the voltage Vs illustrated in FIG. 27B. The equivalent circuit illustrated in FIG. 27B will be described that a capacitance and a conductance formed in parallel between the voltage wire and the delay wire are expressed by the capacitance C and the conductance G configuring the distributed constant circuit illustrated in FIG. 27B.

In a manner similar to the six embodiment, the digital filter 1002P includes the delay element DLN having the pair of ends DNIO1 and DNIO2. The end DNIO1 of the delay element DLN is wired-OR-coupled to the end SNO1 of the signal line 1001P1 and one of the input terminals of the reception buffer circuit 1003P at the node WRN1. The other end DNIO2 of the delay element DLN is wired-OR-coupled to the end SNO2 of the signal line 1001P2 and the other input terminal of the of the reception buffer circuit 1003P at the node WRN2. As described, the delay element DLN does not have an end coupled to the predetermined voltage Vs in a manner similar to the sixth embodiment.

As understood from the description of FIG. 20, when the differential signal SSI (or the other differentia signal /SSI) is viewed as one of the pair of differential signals SSI and /SSI, the other differential signal /SSI (or the differential signal SSI) can function as the reference potential. That is, one of the differential signals or the other differential signal functions as the reference potential. In FIG. 27A, in the case where the differential signal SSI as one of the differential signals is input to one end DNIO1 of the delay element DLN and the other differential signal /SSI is input to the other end DNIO2 of the delay element DLN, when the differential signal input to the end DNIO1 is viewed, the reference potential to the differential signal SSI is supplied to the other end DNIO2. Similarly, when the differential signal /SSI input to the other end DNIO2 is viewed, the reference potential to the differential signal /SSI is supplied to the end DNIO1.

As a result, the differential signal SSI input to the end DNIO1 of the delay element DLN is reflected by the other end DNIO2 of the delay element DLN, and the reflected differential signal is output from the end DNIO1. Similarly, the differential signal /SSI input to the other end DNIO2 of the delay element DLN is reflected by the end DNIO1 of the delay element DLN, and the reflected signal is output from the other end DNIO2.

The differential signal output from the end DNIO1 of the delay element DLN is combined with the signal component $(1-b)$ of the differential signal SSI from the signal line 1000P1 at the node WRN1. Similarly, the differential signal output from the end DNIO2 of the delay element DLN is combined with the signal component $(1-b)$ of the differential signal /SSI from the signal line 1000P2 at the node WRN2. As a result, the restored (shaped) differential signals SSI and /SSI are supplied to the pair of input terminals of the reception buffer circuit 1003P. That is, while reducing consumption power, the waveforms of the differential signal components deteriorated in the signal lines can be shaped.

In the seventh embodiment, when the common mode noise enters the pair of signal lines 1000P1 and 1000P2, the potentials of the ends DNIO2 and DNIO1 of the delay element change similarly according to the common mode noise. That is, according to the common node noise, the potentials in the ends DNIO1 and DNIO2 change with the same phase. Consequently, when the potential at one of the ends DNIO1 and DNIO2 is regarded as the reference potential, the potential at the other end is not influenced by the common mode noise. As a result, the components of the differential signals in the signals supplied to the ends DNIO1 and DNIO2 are equalized by the delay element DLN. On the other hand, a change in the potentials of the same phase in the ends DNIO1 and DNIO2 caused by the common mode noise is transmitted to the reception buffer circuit 1003P without being equalized by the delay element DLN. In other words, the digital filter 1002P according to the seventh embodiment outputs the deterioration of the waveform caused by the components of the common mode noise without executing the function of equalization.

It can prevent formation of the opened eye pattern by the signal voltage waveform CMIB caused by the common mode noise described with reference to FIG. 25. As a result, erroneous operation of erroneously specifying the common mode noise CMI as a transmitted differential signal can be prevented. Although the common mode noise CMI is transmitted as a potential change of the same phase to the reception buffer circuit 1003P, the reception buffer circuit 1003P has the differential circuit. Consequently, even when the potential changes of the same phase are supplied, it does not exert an influence on detection and/or amplification.

Also in the case where a skew exists between the differential signals SSI and /SSI, when the differential signals SSI and /SSI change in the same voltage direction by a skew, the digital filter 1002P executes an operation similar to that for the common mode noise. That is, when both of the differential signals SSI and /SSI change in the same voltage direction, that is, the direction of the voltage +Vd illustrated in FIG. 24 by the skew, both of the ends DNIO1 and DNIO2 of the delay element DLN change to the direction of the voltage +Vd. Consequently, like the case of the common mode noise, the digital filter 1002P transmits the change of the voltage to the reception buffer circuit 1003P without performing equalization.

When a skew exits and the differential signals SSI and /SSI become voltages similar to the common mode noise, equalization by the delay element is not performed. Consequently, opening of the eye pattern by the signal voltage waveform SKYB generated by the skew can be suppressed. As a result, occurrence of erroneous operation caused by the skew can be reduced.

Eye Pattern

FIGS. 28A to 28C and FIGS. 29A to 29C illustrate eye patterns in the case of wired-OR-coupling the delay element DLN as a component of the digital filter 1002P to each of the signal lines 1000P1 and 1000P2 near the reception buffer circuit 1003P.

Common Mode Noise

Figure 28A:
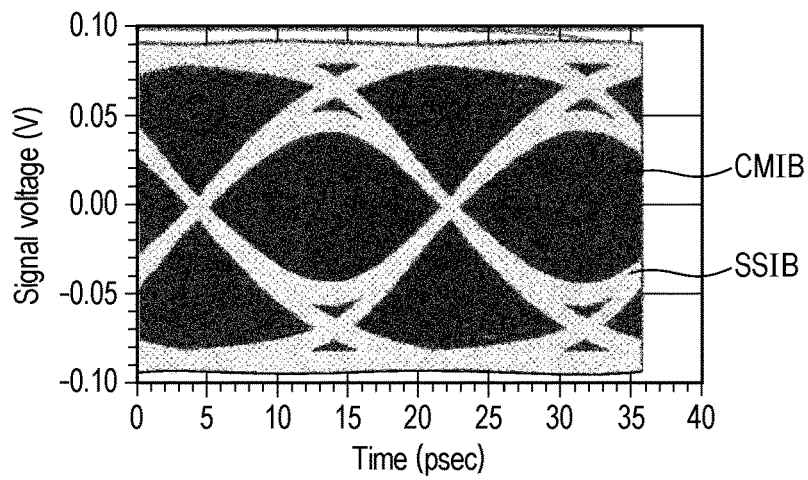
FIGS. 28A to 28C are diagrams illustrating eye patterns according to the seventh embodiment.
Figure 28B:
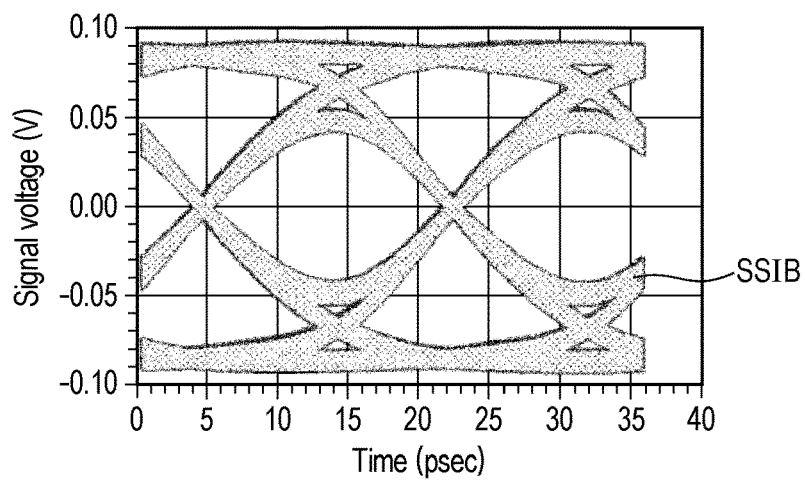
Figure 28C:
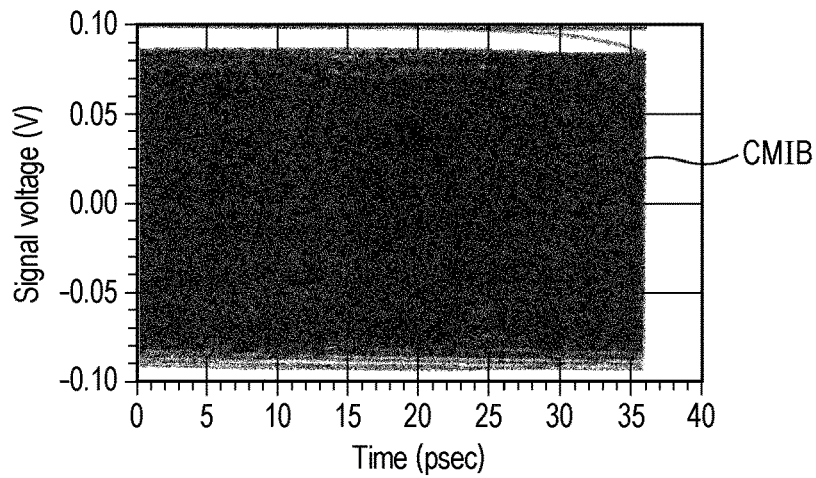

The eye patterns illustrated in FIGS. 28A to 28C are obtained by the same conditions as those described with reference to FIGS. 25A to 25C. FIGS. 28A to 28C illustrate the case that the common mode signal CMI is supplied to the signal lines 1000P1 and 1000P2. The peak voltage +Vpc (FIG. 24) of the common mode signal CMI supplied to the signal lines 1000P1 and 1000P2 has the same value as that described in FIGS. 25A to 25C, and the case where the voltage difference between the peak voltage +Vpd of the differential signal SSI and the peak voltage −Vpd of the differential signal /SSI is 20%.

In FIGS. 28A to 28C, the horizontal axis indicates time, and the vertical axis indicates voltage. FIG. 28A illustrates the eye patterns by the signal voltage waveform at the input terminal of the reception buffer circuit 1003P. In FIG. 28A, the dotted waveform SSIB is a signal voltage waveform generated by equalizing components of the differential signals SSI and /SSI. In FIG. 28A, the solid-line waveform CMIB indicates a signal voltage waveform generated by equalizing components of the common mode signal CMI. As illustrated in FIG. 28A, the eye pattern formed by the signal voltage waveform SSIB is open. On the other hand, it is difficult to recognize an eye pattern of the signal voltage waveform CMIB.

FIG. 28B is a diagram illustrating eye patterns obtained by extracting the signal voltage waveform SSIB generated by equalizing the components of the differential signals SSI and /SSI from FIG. 28A. FIG. 28C is a diagram illustrating eye patterns obtained by extracting the signal voltage waveform CMIB from FIG. 28A.

The components of the differential signals SSI and /SSI are equalized by the digital filter 1002P and the deformed waveform is shaped. Consequently, as illustrated in FIGS. 28A and 28B, the eye patterns formed by the signal voltage waveform SSIB are open, and logic values expressed by the differential signals SSI and /SSI can be identified with high precision and specified.

On the other hand, the components of the common mode signal CMI are not equalized by the digital filter 1002P and supplied as they are to the input terminal of the reception buffer circuit 1003P. Consequently, as illustrated in FIGS. 28A and 28C, it is difficult to identify the eye pattern, and the components of the common mode signal CMI can be prevented from being erroneously identified as a logic value of a differential signal which is transmitted.

Skew

Figure 29A:
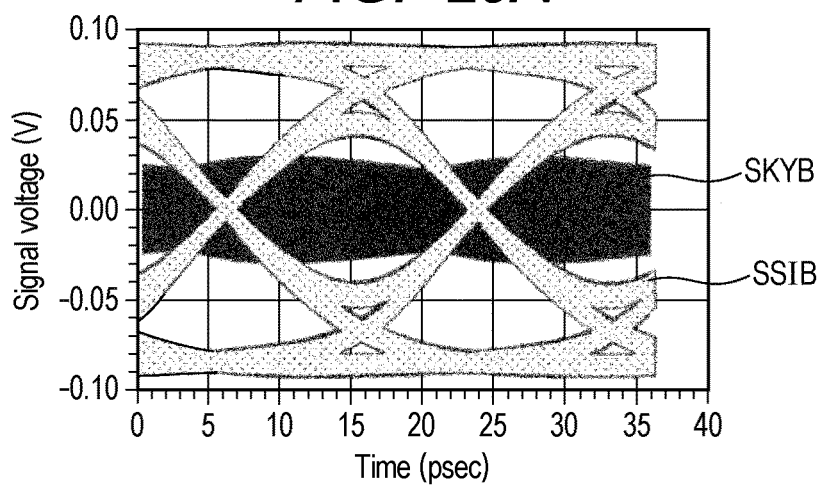
FIGS. 29A to 29C are diagrams illustrating eye patterns according to the seventh embodiment.
Figure 29B:
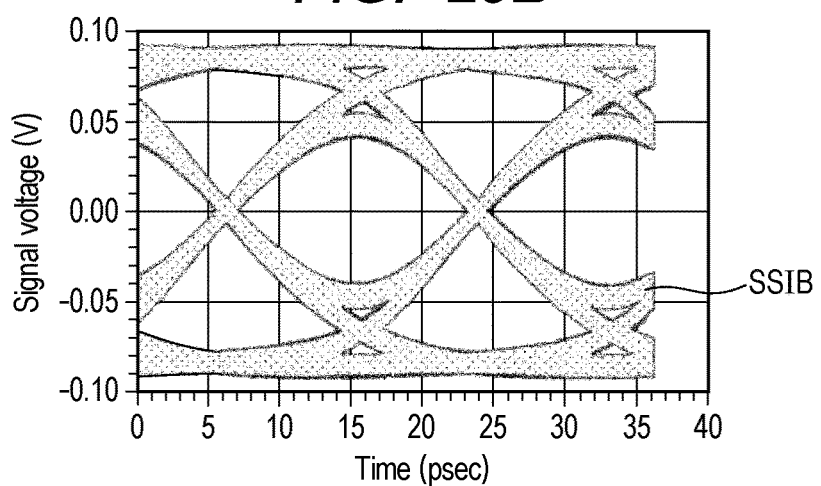
Figure 29C:
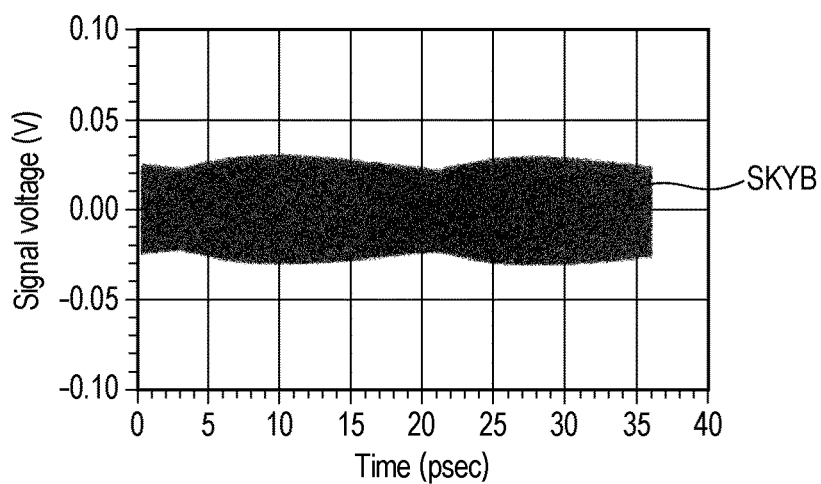

The eye patterns illustrated in FIGS. 29A to 29C are obtained under the same conditions as those described in FIGS. 25A to 25C. FIGS. 29A to 29C illustrate the case where a skew of three picoseconds exists between the differential signals SSI and /SSI.

In FIGS. 29A to 29C, the horizontal axis indicates time, and the vertical axis indicates voltage. FIG. 29A indicates the eye patterns by the signal voltage waveforms at the input terminal of the reception buffer circuit 1003P. In FIG. 29A, the dotted waveform SSIB indicates the signal voltage waveform generated by the components of the differential signals SSI and /SSI. In FIG. 29A, the solid-line waveform SKYB is a signal voltage waveform generated by the skew.

FIG. 29B is a diagram illustrating eye patterns formed by the signal voltage waveform SSIB extracted from FIG. 29A. That is, FIG. 29B is a diagram illustrating the eye patterns formed by the signal voltage waveform SSIB generated by the components of the differential signals SSI and /SSI. FIG. 29C is a diagram illustrating the eye patterns formed by the signal voltage waveform SKYB extracted from FIG. 29A. That is, FIG. 29C is a diagram illustrating an eye pattern formed by the signal voltage waveform CMIB generated by the skew.

The eye patterns formed by the signal voltage waveform SSIB are in an open state as illustrated in FIGS. 29A and 29B and, on the other hand, it is difficult to recognize an open part in the eye pattern formed by the signal voltage waveform CMIB. The components of the differential signal are equalized by the digital filter 1002P, and the deformed waveform is shaped. By the shaping, the eye pattern formed by the signal voltage waveform SSIB becomes an open state as illustrated in FIG. 29B, and the logic values of the differential signals expressed by the differential signals SSI and /SSI can be identified and specified with high precision.

On the other hand, the components corresponding to the common mode signal in the skew are transmitted to the reception buffer circuit 1003P without being equalized by the digital filter 1002P. Consequently, although the external shape of the eye pattern of the signal voltage waveform SKYB supplied to the input terminal of the reception buffer circuit 1003P can be determined as illustrated in FIG. 29C, it is difficult to recognize an open eye pattern. It can prevent the signal voltage waveform generated by the skew from being erroneously identified as the logic value of the differential signal.

Delay Element

Next, the delay element DLN as a component of the digital filter 1002P will be described. The delay element DLN is comprised of a delay line coupled between the ends SNO1 and SNO2 of the signal lines 1000P1 and 1000P2 near the input terminal of the reception buffer circuit. The signal loss per unit length of the delay line is higher than that of the signal lines 1000P1 and 1000P2.

As a method of increasing the signal loss, for example, it is regarded that the delay line as a component of the delay element DLN is comprised of a plurality of distributed constant circuits as illustrated in FIG. 27B and the value of a series resistance R in the plurality of distributed constant circuits corresponding to the unit length of the delay line is made higher than that of the signal line and/or, in a plurality of distributed constant circuits corresponding to the unit length, parallel resistance for the predetermined voltage Vs is made lower than that of the signal line. It corresponds to, for example, in FIG. 27B, increase in the conductance G in the distributed constant circuit.

The round-trip signal delay in the delay element DLN comprised of the delay line is desirably set to a value obtained by dividing the data width interval UT by the coefficient mm. That is, the round-trip signal delay is desirably set to UT/mm. The coefficient mm is ½ or an integer "m". The integer m is, for example, a natural number of 1, 2, 3, or the like.

As described above, one differential signal SSI (or the other differential signal /SSI) of the differential signals SSI and /SSI can be regarded as the reference potential. In this case, the equivalent circuit of the delay element illustrated in FIG. 27B becomes equal to the equivalent circuit (FIG. 1B) described in the first embodiment when the differential signals are supplied to the ends DNIO1 and DNIO2. Consequently, the equalizing function works on the components of the differential signals excluding the common mode signals and the like in the differential signals SSI and /SSI as described in the first embodiment, so that the deformed waveform can be restored.

Figures 30, 31:
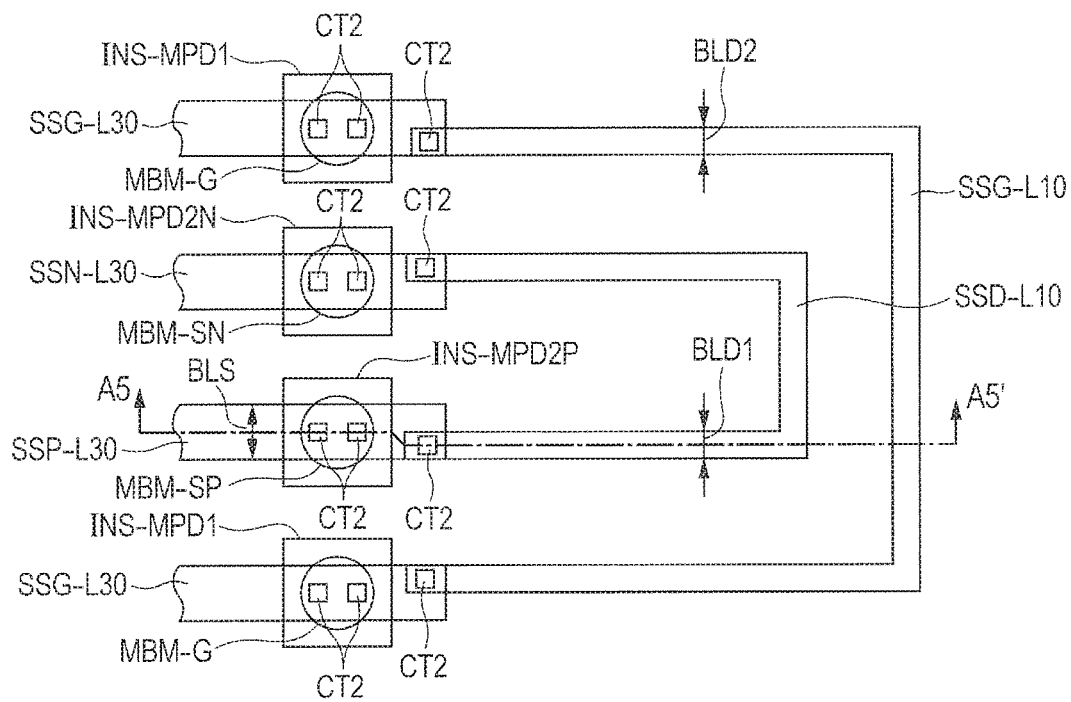
FIG. 30 is a diagram for explaining the digital filter according to the seventh embodiment.
FIG. 31 is a plan view illustrating the structure of the digital filter according to the seventh embodiment.

To equalize the equivalent circuit illustrated in FIG. 27B and that illustrated in FIG. 1B, for example, when the reference potential (the predetermined voltage Vs in the first embodiment) is supplied to the end DNIO2 in the equivalent circuit illustrated in FIG. 27B, it is necessary to set a complex impedance viewed from the end DNIO1 using the end DNIO2 as a reference as the equation (14) in FIG. 30. $Z_{DF}$ indicates a complex impedance of the delay element DLN illustrated in FIG. 27A, and $Z_{SE}$ indicates a complex impedance of the delay element DLN illustrated in FIG. 1A.

In the equation (14), the right side indicates that two delay elements having the same complex impedance $Z_{SE}$ are coupled in series. Consequently, to make the equivalent circuit of FIG. 27B and that of FIG. 1B equal, each of the loss and delay of the delay element DLN illustrated in FIG. 27A is twice as large as that of the delay element DLN illustrated in FIG. 1A. In the seventh embodiment, consequently, different from the first embodiment, the round-trip signal delay in the delay element DLN illustrated in FIG. 27A starts from the half (½) of the data width interval UT, not one. That is, the coefficient mm determining the round-trip signal delay is an integer starting from ½ or 1, not an integer starting from 1.

In the seventh embodiment, when the common mode signal (in-phase signal) is transmitted to the pair of signal lines (differential signal lines) 1000P1 and 1000P2, since both ends of the delay element DLN have equal potentials, there is no signal transmitted to the delay element DLN. Therefore, the delay element DLN does not perform digital filter operation performing equalization. On the other hand, when differential signals are transmitted, a potential difference occurs between both ends of the delay element DLN, so that the delay element DLN performs the digital filter operation performing equalization in a manner similar to the first embodiment and the like.

That is, in the seventh embodiment, the delay element DLN is a digital filter selectively working only on the components of the differential signals.

Further, in the seventh embodiment, equalizer performance can be improved. That is, since serial communication is performed by the differential signals, direct-current coupling can be eliminated. Consequently, the influence of noise in the power source voltage and the ground voltage (predetermined voltage Vs) can be avoided, and the equalizer performance can be improved. In addition, so-called limit performance can be also improved.

In the seventh embodiment, in reality, limit time is necessary for reflection of the differential signals and combination of the differential signals at each of ends of the delay element DLN. There is, so-called frequency dispersion that the time slightly varies depending on frequency at which reflection/combination occurs. The frequency band necessary for reception, of a digital signal is expressed by the equation (15) in FIG. 30. N denotes maximum data length. When the fluctuation range of time required to reflection and combination of a signal in the frequency band is Δt and signal delay of the delay element DNL is τ, even if the frequency dispersion of the delay amount is zero, at the time of reflection of a signal, a relative timing error expressed by the equation (16) in FIG. 30 occurs. In the case of using differential signals as described in the seventh embodiment, the signal delay τ becomes twice, so that the relative timing error becomes the half. The equation (16) indicates limit performance. When a filter is close to ideal, the relative timing error of the digital filter described in the seventh embodiment is reduced as compared with that of the digital filter described in the first embodiment.

Structure of Digital Filter

Figure 32:
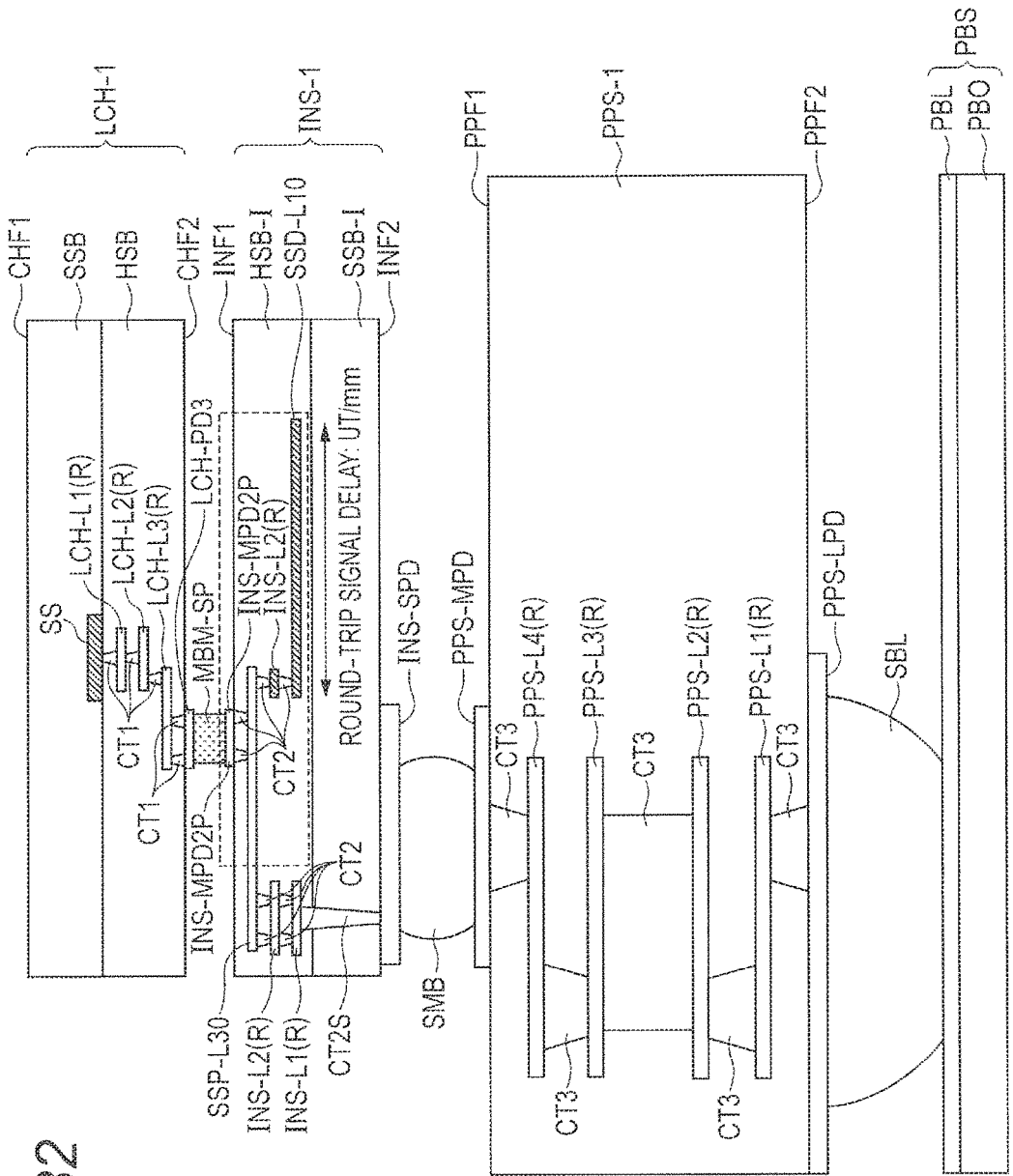
FIG. 32 is a cross section illustrating the structure of the digital filter according to the seventh embodiment.

Next, the structure of the digital filter 1002P according to the seventh embodiment will be described. FIG. 31 is a plan view when the part of the broken-line region DFA is seen from the first main surface PPF1 of the interposer PPS-1 in FIG. 6. FIG. 32 is the A5-A5' section in FIG. 31. In FIGS. 31 and 32, the delay element DLN as a component of the digital filter 1002P is comprised of the conductive layer formed in the interposer PPS-1.

FIGS. 31 and 32 ae similar to FIGS. 7 and 8 described above. The points different from FIGS. 7 and 8 will be mainly described. First, in FIGS. 7 and 8, the case of the signal end that the serial signal propagating through the signal line changes using the predetermined voltage Vs as a reference potential has been described. On the other hand, in the seventh embodiment, differential signals are transmitted by using a pair of signal lines. Accordingly, each of the transmission buffer circuits SCB1-1 and SCB2-1 and the reception buffer circuits RCB1-1, RCB1-2, RCB2-1, and RCB2-2 illustrated in FIG. 6 is comprised of a differential circuit.

In FIG. 31, SSN-L30 and SSP-L30 indicate a pair of signal lines (wiring patterns) transmitting a pair of differential signals, and SSG-L30 indicates a voltage wire (wiring pattern) to which the predetermined voltage Vs is supplied. In FIG. 31, SSD-L10 indicates a delay line (wiring pattern) as a component of the delay element DLN, and SSG-L10 indicates a voltage wire (wiring pattern) to which the predetermined voltage Vs is supplied.

In the seventh embodiment, the delay line SSD-L10 is formed by the first conductive layer INS-L1 formed in the interposer INS-1 which will be described later with reference to FIG. 32. The voltage wire SSG-L10 is also formed by the first conductive layer INS-L1 formed in the interposer INS-1. That is, both of the delay line SSD-L10 and the voltage wire SSG-L10 are formed by the same first conductive layer. In plan view, the voltage wire SSG-L10 is close to the delay line SSD-L10 and extends in parallel to the delay line SSD-L10. Since the voltage wire SSG-L10 and the delay line SSD-L10 are disposed so as to be apart from each other, the voltage wire SSG-L10 and the delay line SSD-L10 are electrically separated. Between the delay line SSD-L10 and the voltage wire SSG-L10 disposed closely, the capacitance C and the conductance G illustrated in FIG. 27B are formed.

One end of the delay line SSD-L10 is coupled to the signal line SSP-L30 via the contact CT2, and the other end is coupled to the signal line SSN-L30 via the contact CT2. The signal line SSN-L30 is coupled to the microbump electrode INS-MPD2N via the contact CT2, and the signal line SSP-L30 is coupled to the microbump electrode INS-MPD2P via the contact CT2. Each of the microbump electrodes INS-MPD2N and INS-MPD2P is coupled to a corresponding microbump electrode formed over a second main surface CLF2 of a not-illustrated logic semiconductor chip LCH-1 by the microbumps MBM-SN and MBM-SP and coupled to a pair of input terminals of the reception buffer circuit RCB1-2 formed in the semiconductor region SS.

To the signal lines SSN-L30 and SSP-L30, a pair of differential signals is supplied from the logic semiconductor chip LCH-2 via a not-illustrated print substrate PBS. Consequently, a pair of differential signals from the logic semiconductor chip LCH-2 propagates through the pair of signal lines SSN-L30 and SSP-L30 and is supplied to the pair of input terminals of the reception buffer circuit RCB1-2 of the logic semiconductor chip LCH-1.

In plan view, one end of the voltage wire SSG-L10 disposed along the signal line SSD-L10 is coupled to the voltage wire SSG-L30 via the contact CT2 and the other end is coupled to the voltage wire SSG-L30 via the contact CT so as to surround the delay line SSD-L10. The voltage wire SSG-L30 is coupled to the corresponding microbump electrode INS-MPD1 via the contact CT2, and each of the microbump electrodes INS-MPD1 is coupled to the corresponding microbump electrode formed over the second main surface CLF2 of the not-illustrated logic semiconductor chip LCH-1 by the microbump MBM-G.

To the voltage wire SSG-L30, the predetermined voltage Vs is supplied from the print substrate PBS via a wire formed in a not-illustrated package substrate PPS-1. Consequently, the predetermined voltage Vs is supplied to the logic semiconductor chip LCH-1 and also to the voltage wire SSG-L10.

FIG. 32 is the A5-A5' section in FIG. 31. In FIG. 32, the print substrate PBS, the package substrate PPS-1, and the like are the same as those in FIG. 8, the description will not be repeated. A pair of differential signals from the logic semiconductor chip LCH-2 are transmitted to the bump electrode PPS-MPD formed over the first main surface PPF1 of the package substrate PPS-1 via the print substrate PBS and the package substrate PPS-1. The bump electrode PPS-MPD is coupled to the bump electrode INS-SPD formed over the second main surface INF2 of the interposer INS-1 by the bump electrode SMB.

The bump electrode INS-SPD is coupled to the wiring pattern INS-L1(R) comprised of the first conductive layer INS-L1 formed in the interposer INS-1 via the contact CT2S formed over the silicon substrate SSB-1, and the wiring pattern INS-L1(R) is coupled to the wiring pattern INS-L2(R) formed by the second conductive layer INS-L2 via the contact CT2. The wiring pattern INS-L2(R) is coupled to the signal line SSP-L30 as a wiring pattern formed by the third conductive layer INS-L3 via the contact CT2.

The signal line SSP-L30 extends in the lateral direction in FIG. 32. In the extended part, the signal line SSP-L30 is coupled to the microbump electrode INS-MPD2P via the contacts CT2. The signal line SSP-L30 is coupled to the wiring pattern INS-L2(R) formed by the second conductive layer INS-L2 via the contacts CT2, and the wiring pattern INS-L2(R) is coupled to one end of a wiring pattern corresponding to the delay line SSD-L10 via the contact CT2. The delay line SSD-L10 is comprised of the first conductive layer INS-L1 formed in the interposer INS-1.

The microbump electrode INS-MPD2P is coupled to the microbump electrode LCH-PD3 formed on the first main surface CHF2 of the logic semiconductor chip via the microbump MBM-SP, and the microbump electrode LCH-PD3 is coupled to the semiconductor region SS via the wiring patterns LCH-L1(R) to LCH-L3(R) in the wiring layer HSB formed on the main surface of the silicon substrate SSB and the contacts CT1. In the semiconductor region SS, the reception buffer circuit RCB102 is formed. Differential signals from the logic semiconductor chip LCH-2 are supplied to the input terminal of the reception buffer circuit RCB1-2.

In the seventh embodiment, the round-trip signal delay UT/mm is determined by delay time of a signal transmitted between one end and the other end of the delay line SSD-L10. To obtain desired round-trip signal delay, for example, the length between one end and the other end of the delay line SSD-L10 and the line width of the delay line SSD-L10 are set. As illustrated in FIG. 31, also in the seventh embodiment, the line width BLD1 of the delay line SSD-L10 is narrower than the line width BLS of the signal lines SSP-L30 and SSN-L30. When it is regarded that the delay line SSD-L10 and the signal lines SSP-L30 and SSN-L30 are integrated, the line having the narrow width using the part when the line width changes corresponds to the delay line SSD-L10, and the wide lines sandwiching the narrow line are the signal lines SSP-L30 and SSN-L30.

Although only the section related to the coupling part of the signal line SSP-L30 and one end of the delay line SSD-L10 is illustrated in FIG. 32, the coupling between the signal line SSN-L30 and the other end of the delay line SSD-L10 is similar. In the seventh embodiment, the voltage wire SSG-L10 is formed by the same conductive layer as that of the delay line SSD-L10. Consequently, the coupling part between the voltage wires SSG-L30 and SSG-L10 is similar to that in FIG. 32.

In the seventh embodiment, the delay line as a component of the delay element DLN is formed by the first conductive layer INS-L1 coupled to a pair of signal lines SSN-L30 and SSP-L30 near the pair of microbump electrodes INS-MPD2N and INS-MPD2P to which the pair of signal lines SSN-L30 and SSP-L30 transmitting a pair of differential signals are coupled via the contacts CT2 and the like. Since each of the pair of signal lines SSN-L30 and SSP-L30 is formed by the third conductive layer INS-L3, the delay line SSD-L10 and the signal lines SSN-L30 and SSP-L30 are formed by different conductive layers, and the delay line SSD-L10 is coupled between the pair of microbump electrodes INS-MPD2N and INS-MPD2P.

A signal propagating through the delay line SSD-L10 is a single-end signal which changes relative to the reference potential. If the voltage wire supplying the reference potential is not specified, when the delay line SSD-L10 is expressed by an equivalent circuit as illustrated in FIG. 27B, it becomes difficult to specify, for example, the values of the capacitance C and the conductance G. Consequently, in the seventh embodiment, the voltage wire SSG-L10 to which the predetermined voltage Vs as the reference potential is supplied is formed by the first conductive layer INS-L1 which is the same as that of the delay line SSD-L10, and the voltage line SSG-L10 is disposed in parallel to the delay line SSD-L10 near the delay line SSD-L10. In plan view, although not limited, the line width BLD2 of the voltage wire SSG-L10 is set to the same as the line width BLD1 of the delay line SSD-L10 and is set to be narrower than the line width BLS of each of the signal lines SSN-L30 and SSP-L30 and the voltage wire SSG-L30. When the data width interval UT is set to one data unit of a serial signal, the round-trip signal delay of the delay element DLN becomes UT/mm. mm denotes ½ or a natural number (integer starting from 1). When mm is set to ½, the round-trip signal delay corresponds twice as large as the data width interval UT.

In FIG. 31, the signal lines SSN-L30 and SSP-L30 and a part of the delay line SSD-L10 are disposed so as to be linear, and the signal lines SSN-L30 and SSP-L30 and a part of the voltage wire SSG-L10 are disposed so as to be linear. Since the conductive layer forming the signal lines SSN-L30 and SSP-L30 is different from the conductive layer forming the delay line SSD-L10 and the voltage wire SSG-L10, the lines may not be linear. That is the disposition relations between the signal lines SSN-L30 and SSP-L30 and the delay line SSD-L10 and the voltage wire SSG-L10 are arbitrary. For example, the delay line SSD-L10 and the voltage wire SSG-L10 may be disposed so as to be orthogonal to the signal lines SSN-L30 and SSP-L30.

Modification

Figure 33:
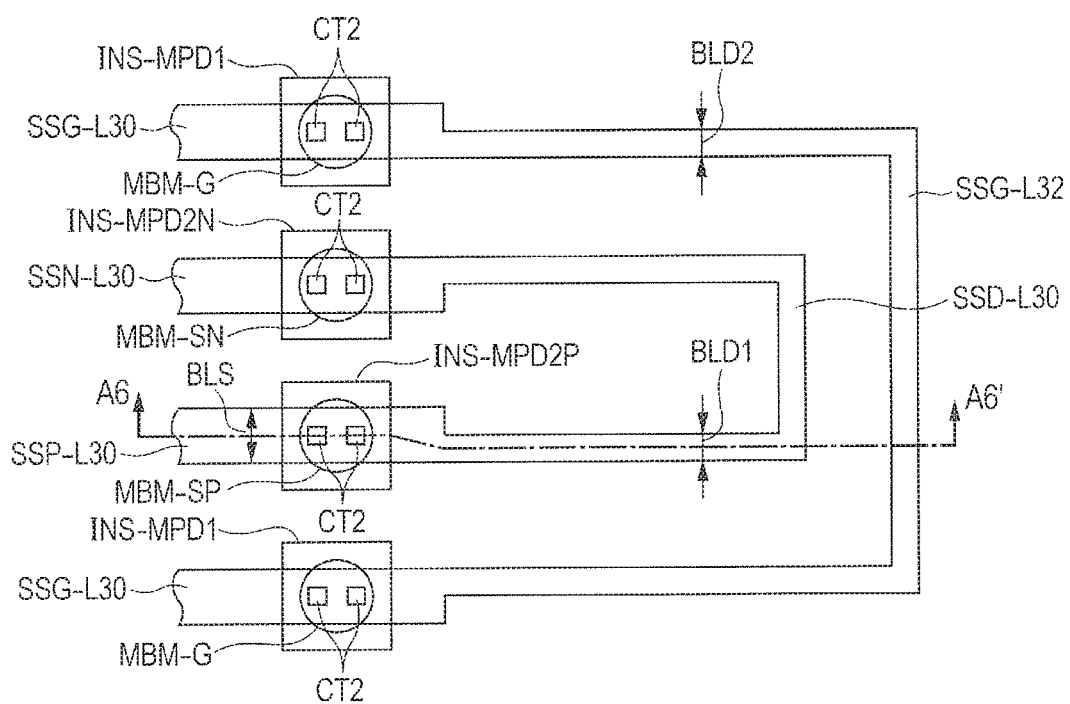
FIG. 33 is a plan view illustrating the structure of a digital filter according to a modification of the seventh embodiment.
Figure 34:
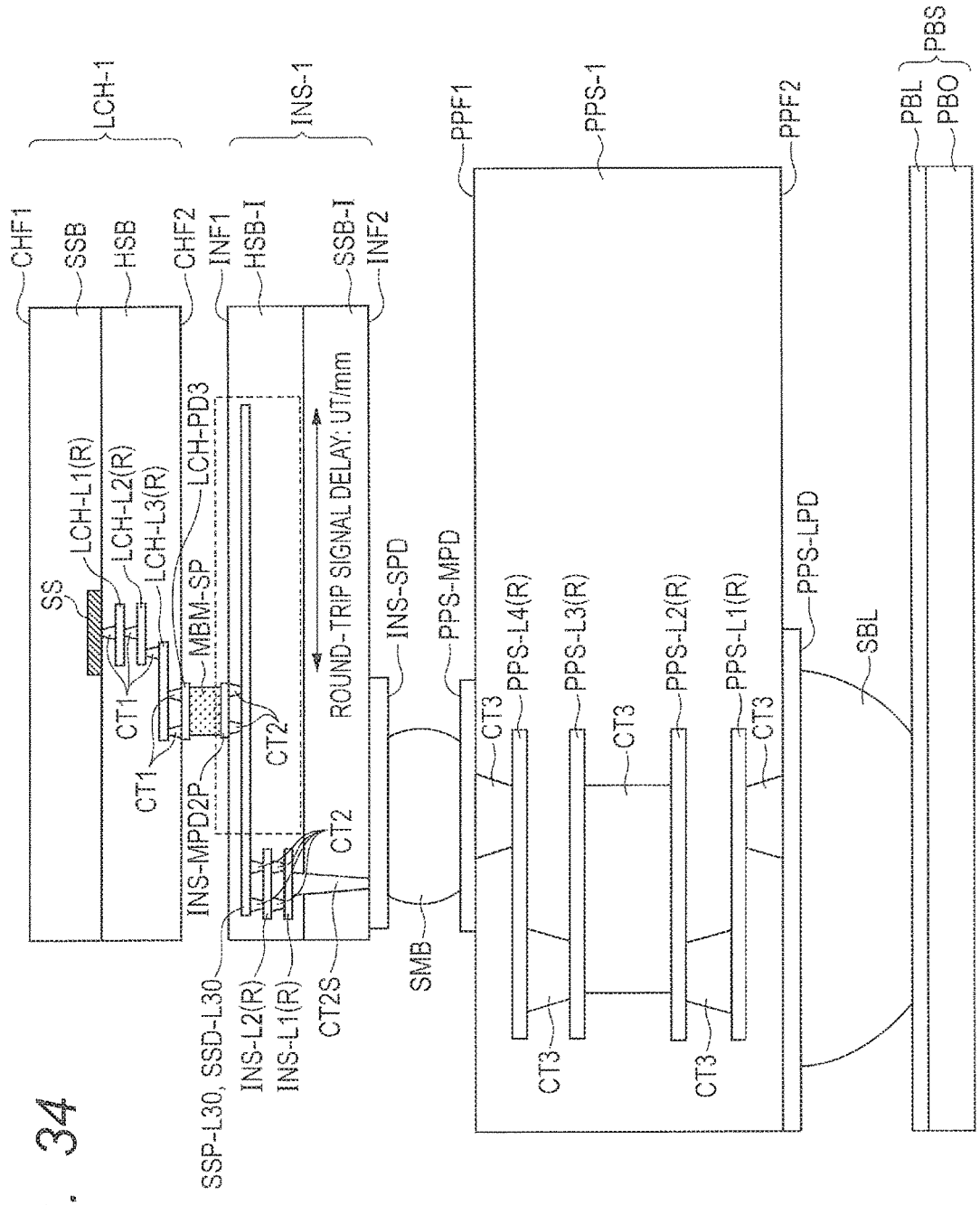
FIG. 34 is a cross section illustrating the structure of the digital filter according to the modification of the seventh embodiment.

FIGS. 33 and 34 are a plan view and a cross section illustrating the structure of a digital filter according to a modification of the seventh embodiment. FIG. 34 is a cross section A6-A6' in FIG. 33. FIGS. 33 and 34 are similar to FIGS. 31 and 32. The different points will be mainly described.

In FIGS. 31 and 32, each of the delay line SSD-L10 as a component of the delay element DLN and the voltage wire SSG-L10 disposed along the delay line SSD-L10 is formed by the first conductive layer INS-L1 different from the signal lines SSN-L30 and SSP-L30 and the voltage wire SSG-L30. In contrast, in FIGS. 33 and 34, each of the delay line SSD-L10 and the voltage wire SSG-L10 is formed by the third conductive layer INS-L3 which is the same as that of the signal lines SSN-L30 and SSP-L30 and the voltage wire SSG-L30. In FIGS. 33 and 34, the delay line is expressed as SSD-L30, and the voltage wire disposed along the delay line SSD-L30 is expressed as SSG-L32.

Since the signal lines SSN-L30 and SSP-L30 and the delay line SSD-L30 are formed by the same third conductive layer INS-L3, those lines are integrated. In FIGS. 31 and 32, to couple the delay line SSD-L10 and the signal lines SSN-L30 and SSP-L30, the contacts CT2 and the wiring pattern INS-L2(R) are necessary. In FIGS. 33 and 34, the contacts CT2 and the wiring pattern INS-L2(R) are not provided.

Similarly, since the voltage wires SSG-L30 and SSG-L32 are formed by the same third conductive layer INS-L3, those wires are integrated. In FIGS. 31 and 32, to couple the voltage wires SSG-L30 and SSG-L10, the contacts CT2 and not-illustrated wiring pattern are necessary. In FIGS. 33 and 34, however, the contacts CT2 and the wiring pattern are not provided.

Although the signal lines SSN-L30 and SSP-L30 and the delay line SSD-L30 are integrated, the border between the signal lines and the delay line can be specified as the part where the line width of the lines changes. In this case, the part in which the line width of the line changes from BLS to BLD1 and the part in which the line width changes from BLD1 to BLS are the border between the signal lines and the delay line. The region of the line whose width is narrow like BLD1 corresponds to the delay line SSD-L30. At this time, the regions in which the line width of the line is BLS correspond to the signal lines SSN-L30 and SSP-L30.

Similarly, the border between the voltage wires SSG-L30 and SSG-L32 can be specified as the part in which the line width of the wire changes. In this case, the region in which the line width of the line is narrower than the line width BLS and is BLD2 corresponds to the voltage wire SSG-L32 disposed along the delay line SSD-L30, and the region in which the line width of the wire is BLS corresponds to the voltage wire SSG-L30.

Since the signal line SSP-L30 and the delay line SSD-L30 are integrated, in FIG. 34, the wiring patter formed by the third conductive layer INS-L3 extends in the lateral direction and becomes the signal wire SSP-L30 and the delay line SSD-L30. In FIG. 34, only the signal line SSP-L30 and the delay line SSD-L30 integrally formed by the wiring pattern are illustrated. The other signal lines and voltage wires are also similar to those of FIG. 34. That is, the signal line SSN-L30 and the delay line SSD-L30 are also integrally formed by the third conductive layer INS-L3. The voltage wires SSG-L30 and SSG-L32 are also integrally formed by the third conductive layer INS-L3.

In the modification, the delay line SSD-L30 and the voltage wire SSG-L32 are formed by the same conductive layer as that of the signal lines SSN-L30 and SSP-L30 and the voltage wire SSG-L30. Consequently, the number of conductive layers configuring the digital filter 1002P can be reduced. In other words, the conductive layers configuring the digital filter 1002P can be saved.

Although not limited, in the seventh embodiment, the microbump MBM-SP is made of copper (Cu), and the bump SBL is a solder ball.

The correspondence between the structure of the digital filter described with reference to FIGS. 31 to 34 and the digital filter illustrated in FIGS. 1 and 27 will be described as follows.

The nodes WRN1 and WRN2 as the wired-OR coupling parts illustrated in FIG. 27 corresponds to the contacts CT2 coupling the signal lines SSN-L30 and SSP-L30 and the delay line SSD-L10 in FIGS. 31 and 32. In FIGS. 33 and 34, the borders between the signal lines SSN-L30 and SSP-L30 and the delay line SSD-L30 correspond to the nodes WRN1 and WRN2 illustrated in FIG. 27. That is, the border regions in which the line width of the line changes correspond to the nodes WRN1 and WRN2.

When only the components of a pair of differential signals propagate through the pair of signal lines SSN-L30 and SSP-L30 and reach the nodes WRN1 and WRN2 as the wired coupling parts, reflection of the signal is repeated between the nodes WRN1 and WRN2. Specifically, multiple signal reflection occurs and the signals are combined at the nodes WRN1 and WRN2. Consequently, the digital filter 1002P equivalently calculates the equation (1) in FIG. 1C with respect to the components of the differential signals. It means that, for example, an inverse transfer function is equivalently calculated with respect to the transfer function of the signal line coupling the transmission buffer circuit and the reception buffer circuit provided for different logic semiconductor devices. Since the digital filter 1002P does not have an active element, only attenuation occurs in equivalent calculation of the inverse transfer function. Consequently, calculation of an inverse transfer function deviated only by the amount of a constant corresponding to the attenuation is executed as equivalent calculation of an inverse transfer function.

In the seventh embodiment, with respect to the components of the differential signals, the above-described coefficient mm is used in place of the coefficient "m" in the equation (1). That is, not only an integer but also ½ can be substituted as the coefficient "m" for the equation (1).

In the seventh embodiment, the voltage wire SSG-L10 (SSG-L32) formed in the same layer as that of the delay line SSD-L10 (SSD-L30) is disposed close to the delay line SSD-L10 (SSD-L30). A signal loss per unit length of each of the delay line SSD-L10 (SSD-L30) and the voltage wire SSG-L10 (SSG-L32) is set to be larger than the signal loss per unit length of the signal lines SSN-L30 and SSP-L30. For example, the boundary length in section of each of the delay line SSD-L10 (SSD-L30) and the voltage wire SSG-L10 (SSG-L32) is set to be smaller than that of the signal lines SSN-L30 and SSP-L30. By adjusting the signal losses in those lines, for example, the inductance L and the resistance R in the distributed constant circuits illustrated in FIGS. 1C and 27B can be adjusted to arbitrary values. By adjusting the interval between the delay line SSD-L10 (SSD-L30) and the voltage wire SSG-L10 (SSG-L32), the capacitance C and the conductance G in the distributed constant circuit can be adjusted to arbitrary values. Obviously, the inductance L, the resistance R, the capacitance C, and the conductance G can be adjusted by adjusting the boundary length in section and the interval (including the line width) of the delay line SSD-L10 (SSD-L30) and the voltage wire SSG-L10 (SSG-L32). In such a manner, an arbitrary inverse transfer function can be equivalently calculated by the delay line.

Eighth Embodiment

Figure 35:
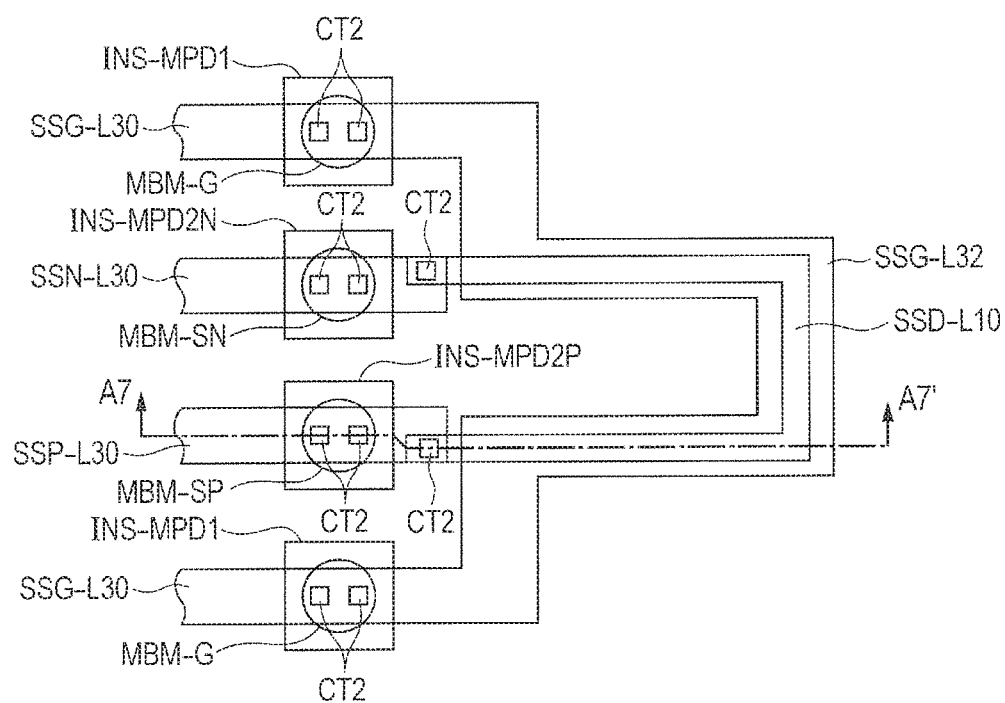
FIG. 35 is a plan view illustrating the structure of a digital filter according to an eighth embodiment.
Figure 36:
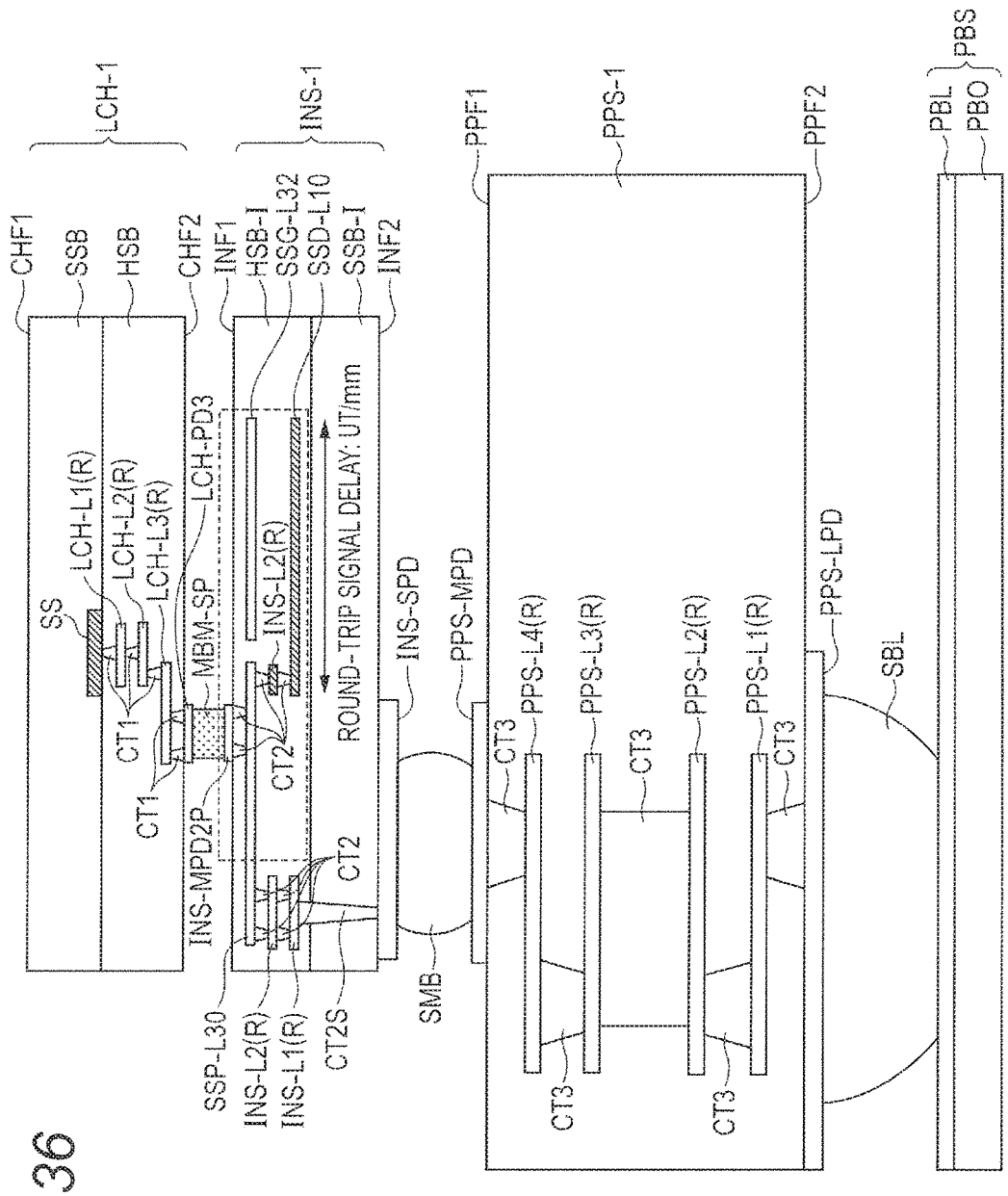
FIG. 36 is a cross section illustrating the structure of the digital filter according to the eighth embodiment.

FIGS. 35 and 36 are a plan view and a cross section illustrating the structure of a digital filter according to an eighth embodiment. FIG. 36 is an A7-A7' section in FIG. 35. FIGS. 35 and 36 are similar to FIGS. 31 to 34. The points different from FIGS. 31 and 32 will be mainly described.

In FIG. 35, SSD-L10 indicates a delay line as a component of the digital filter 1002P, and SSG-L32 indicates a voltage wire to which the predetermined voltage Vs is supplied. In the eighth embodiment, as illustrated in FIG. 36, the delay line SSD-L10 is formed by the first conductive layer in the three conductive layers formed in the interposer INS-1. The voltage wire SSG-L32 is formed by the third conductive layer. The voltage wire SSG-L32 is disposed so that its part overlaps in the delay line SSD-L10 in plan view as illustrated in FIG. 35. Specifically, in the seventh embodiment, in plan view, the voltage wire SSG-L10 (SSG-L32) is disposed close to and parallel to the delay line SSD-L10 (SSD-L30). On the other hand, in the eighth embodiment, the voltage wire SSG-L32 is disposed stereoscopically close to and parallel to the delay line SSD-L10. Obviously, an insulating layer exists between the voltage wire SSG-L32 and the delay line SD-L10, and the voltage wire SSG-L32 and the delay line SD-L10 are electrically separated.

Also in the eighth embodiment, the ends of the delay line SSD-L10 are coupled to the pair of signal lines SSN-L30 and SSP-L30 via the contacts CT2. The voltage wire SSG-L32 is formed integrally with the voltage wire SSG-L30.

Also in the eighth embodiment, the delay line SSD-L10 and the voltage wire SSG-L32 are set so that the signal loss per unit length becomes larger than that of the pair of signal lines SSN-L30 and SSP-L30. For example, the boundary length in section of the delay line SSD-L10 and the voltage wire SSG-L32 is set to be smaller than that of the signal lines SSN-L30 and SSP-L30. In the example of FIG. 35, the boundary length in section is decreased by making the line width of the delay line SSD-L10 narrower than that of the signal lines SSN-L30 and SSP-L30. The boundary length in section of the voltage wire SSG-L32 is decreased by making the thickness of the voltage wire SSG-L32 smaller than that of the signal line SSD-L10.

In the eighth embodiment, for example, by adjusting the boundary length in section of the delay line SSD-L10 and the voltage wire SSG-L32 and the distance (interlayer distance) between the overlapped regions, the inductance L, the resistance R, the capacitance C, and the conductance G in the distributed constant circuit are adjusted. Since the operation of the digital filter 1002P according to the eighth embodiment is similar to that of the seventh embodiment, the description will not be repeated.

The line width of the delay line SSD-L10 becomes narrower than that of the signal lines SSN-L30 and SSP-L30 and the like. The voltage line SSG-L32 overlaps the delay line SSD-L10. Consequently, in plan view, the digital filter 1002P can be disposed in a small area. Therefore, the eighth embodiment is suitable in the case where, for example, in plan view, the interposer INS-1 does not have much area. On the other hand, the digital filter 1002P described in the seventh embodiment is suitable to the case where the number of conductive layers formed in the interposer INS-1 is limited.

Ninth Embodiment

Figure 37:
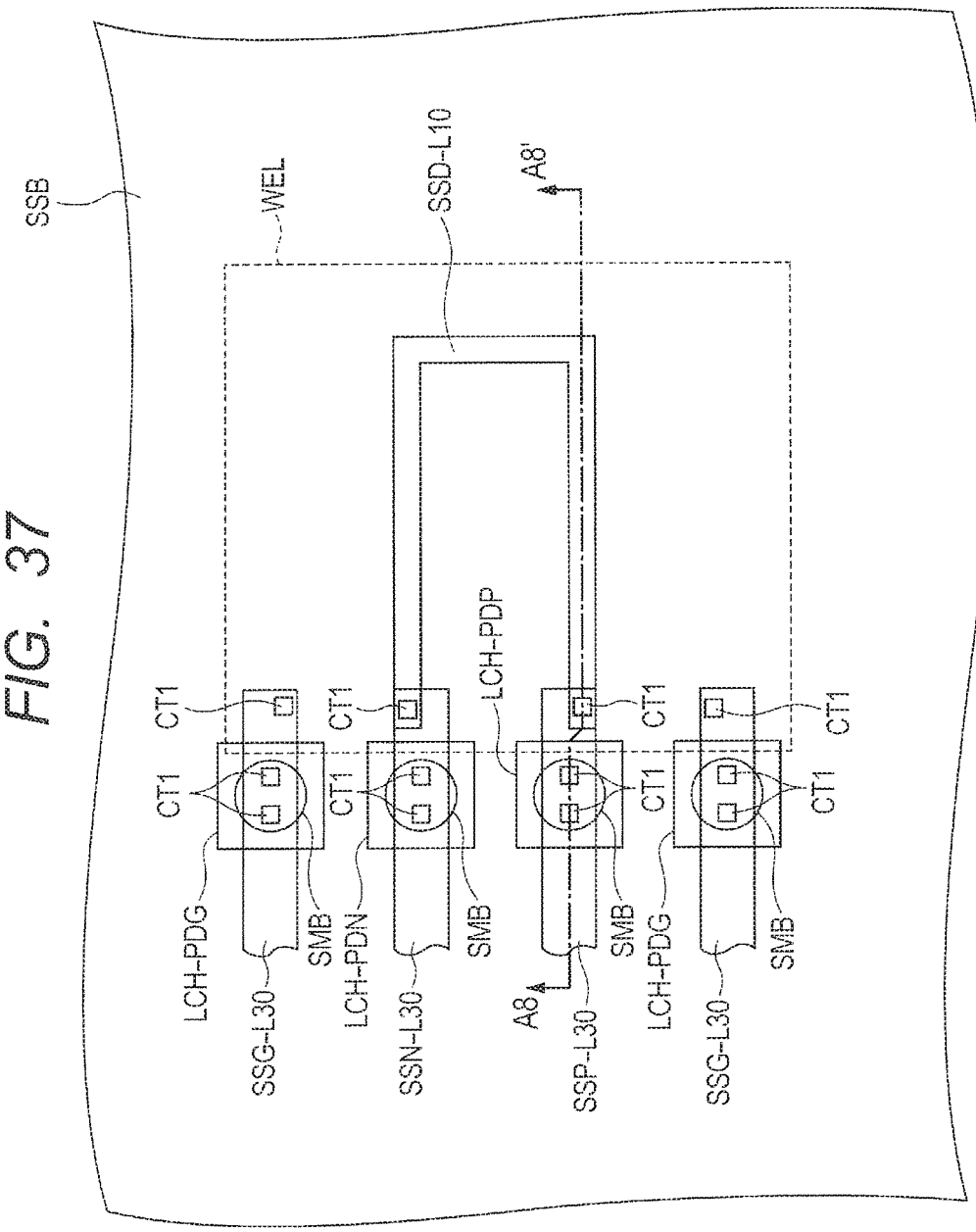
FIG. 37 is a plan view illustrating the structure of a digital filter according to a ninth embodiment.
Figure 38:
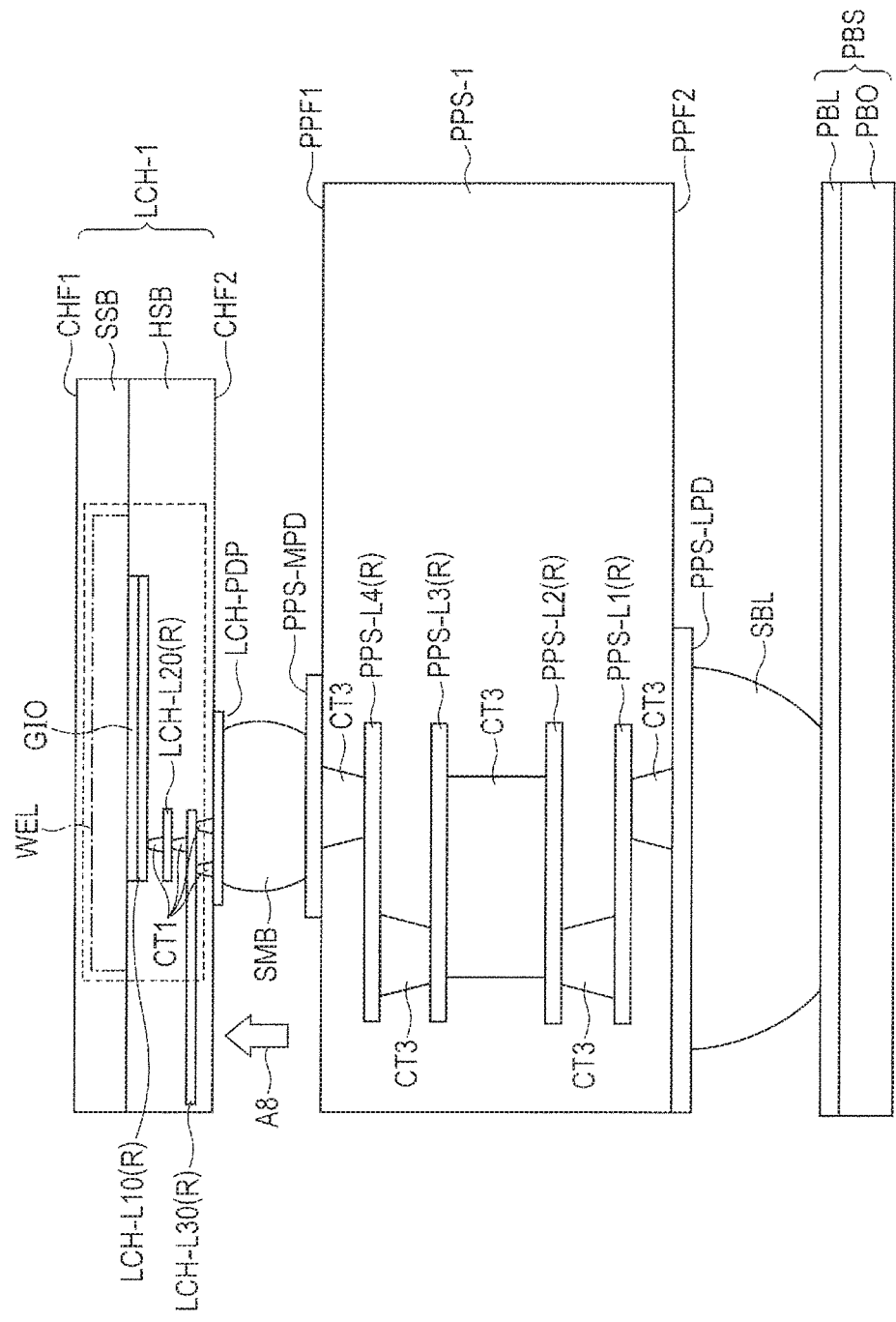
FIG. 38 is a cross section illustrating the structure of the digital filter according to the ninth embodiment.

FIGS. 37 and 38 are a plan view and a cross section illustrating the structure of a digital filter according to a ninth embodiment. In the ninth embodiment, a structure that the logic semiconductor chip LCH-1, not the interposer INS-1, has the digital filter 1002P is provided. FIG. 37 is a plan view when the logic semiconductor device LCH-1 is seen from the second main surface side CHF2. FIG. 38 is an A8-A8' cross section in FIG. 37. In FIG. 38, the section of the package substrate PPS-1 and the print substrate PBS in the A8-A8' cross section is also illustrated.

In the ninth embodiment, in a manner similar to the third embodiment, the wiring pattern as a component of the delay element DLN is formed in the logic semiconductor chip LCH-1. Since the delay element DLN as a component of the digital filter 1002P is formed in the logic semiconductor chip LCH-1, although the example of the semiconductor device which does not use the interposer INS-1 will be described, obviously, the interposer INS-1 may be provided between the logic semiconductor chip LCH-1 and the package substrate.

In FIG. 38, PPS-1 indicates the package substrate, and PBS denotes the print substrate. Since the structure of the package substrate PPS-1 and the print substrate PBS has been described, for example, in FIG. 15 related to the third embodiment, the description will not be repeated. The logic semiconductor chip LCH-1 is mounted over the package substrate PPS-1 so that its second main surface CHF2 faces the first main surface PPF1 of the package substrate PPS-1. The bump electrode PPS-MPD formed on the first main surface PPF1 of the package substrate PPS-1 is coupled to a microbump electrode formed on the second main surface CHF2 of the logic semiconductor chip LCH-1. In the diagram, the microbump electrode is indicated as LCH-PDP.

The logic semiconductor chip LCH-1 has the silicon substrate SSB in which a semiconductor region for configuring an element and the like is formed, and the wiring layer HSB formed on a main surface of the silicon substrate SSB. The wiring layer HSB has a plurality of conductive layers and a plurality of insulating layers alternately stacked. In the ninth embodiment, the wiring layer HSB has three conductive layers (wiring layers). In FIG. 38, LCH-L10(R) is a wiring pattern formed by the first conductive layer, LCH-L20(R) is a wiring pattern formed by the second conductive layer, and LCH-L30(R) is a wiring pattern formed by the third conductive layer. CT1 indicates contacts electrically coupling the conductive layers via the insulating layers provided between the conductive layers.

In FIG. 38, WEL indicates a well region formed in the silicon substrate SSB. The well region WEL has a conduction type opposite to that of the silicon substrate SSB. For example, when the silicon substrate SSB is N-type semiconductor, the well region WEL is a P-type semiconductor region. In the diagram, GIO indicates an insulating film. The insulating film GIO is formed on the main surface of the well region WEL, and the wiring pattern LCH-L10(R) is formed on the insulating film GIO. The insulating film GIO is, for example, a gate insulating film of MOSFET, and the wiring pattern LCH-L10(R) is a gate electrode formed on the gate insulating film.

FIG. 37 is a plan view from the direction (visual direction) indicated by the arrow A8 in FIG. 38 and, that is, a plan view when the logic semiconductor chip LCH-1 is seen from the second main surface CHF2. In FIG. 37, LCH-PDG indicates microbump electrodes which are coupled to the bump electrodes PPS-MPD formed on the package substrate PPS-1 via the bump SMB and to which the predetermined voltage Vs is supplied via the package substrate PPS-1.

In FIG. 37, LCH-PDN and LCH-PDP indicate microbump electrodes which are coupled to the bump electrode PPS-MPD formed on the package substrate PPS-1 via the sump SMB and to which a pair of differential signals is supplied from the print substrate PBS via the package substrate PPS-1. That is, a pair of differential signals is supplied to the microbump electrodes LCH-PDN and LCH-PDP using the conductive layers formed in the print substrate PBS and the package substrate PPS-1 as a pair of signal paths.

The microbump electrode LCH-PDG is coupled to the voltage wire SSG-L30 comprised of the third conductive layer formed in the wiring layer HSB of the logic semiconductor chip LCH-1. The voltage wire SSG-L30 is ohmic-coupled to the well region WEL via the contact CT1. With the configuration, the predetermined voltage Vs is supplied to a not-illustrated circuit block in the logic semiconductor chip LCH-1 via the voltage wire SSG-L30 and, the predetermined voltage Vs is supplied also to the well region WEL.

The microbump electrode LCH-PDN is coupled to the signal line SSN-L30 formed by the third conductive layer formed in the wiring layer HSB in the logic semiconductor chip LCH-1 via the contact CT1. The microbump electrode LCH-PDP is coupled to the signal line SSP-L30 formed by the third conductive layer formed in the wiring layer HSB of the logic semiconductor chip LCH-1 via the contact CT1. The signal lines SSN-L30 and SSP-L30 are coupled to a pair of input terminals of a reception buffer circuit (corresponding to the reception buffer circuit described in the seventh embodiment) provided in the logic semiconductor chip LCH-1. With the configuration, a pair of differential signals from another logic semiconductor chip (for example, LCH-2 illustrated in FIG. 6) is supplied to a pair of input terminals of a reception buffer circuit via signal lines formed by conductive layers in the print substrate PBS, the package substrate PPS-1, and the like.

Each of the signal lines SSN-L30 and SSP-L30 is coupled to the delay element DLN as a component of the digital filter 1002P. In the ninth embodiment, the delay element DLN has the delay line SSD-L10 formed by the first conductive layer in the conductive layer HSB of the logic semiconductor chip LCH-1, one end of the delay line SSD-L10 is coupled to the signal line SSP-L30, and the other end of the delay line SSD-L10 is coupled to the signal line SSN-L30.

Coupling between the signal line SSP-L30 and the delay line SSD-L10 will be described with reference to FIG. 38. In FIG. 38, the wiring pattern LCH-L30(R) formed by the third conductive layer corresponds to the signal line SSP-L30 illustrated in FIG. 37. In FIG. 38, the wiring pattern LCH-L10 formed by the first conductive layer corresponds to the delay line SSD-L10. The signal line SSP-L30 (LCH-L30(R)) is coupled to the wiring pattern LCH-L20(R) formed by the second conductive layer via the contact CT1, and the wiring pattern LCH-L20(R) is coupled to one end of the delay line SSD-L10 (LCH-L10(R)) via the contact CT1. In FIG. 37, to avoid complication of the drawing, the wiring pattern LCH-L20(R) is not drawn.

Similarly, the signal line SSN-L30 is coupled to the other end of the delay line SSD-L10 (LCH-L10(R)). With the configuration, the delay line SSD-L10 disposed over the well region WEL to which the predetermined voltage Vs is supplied is coupled between the pair of signal lines SSN-L30 and SSP-L30 to which a pair of differential signals is supplied via the insulating film GIO.

In the ninth embodiment, the insulting film GIO is interposed between the wiring pattern LCH-L10(R) corresponding to the delay line SSD-L10 and the well region WEL to which the predetermined voltage Vs is supplied. Therefore, a MOS capacitive element using the insulating film GIO as a dielectric and using the delay line SSD-L10 and the well region WEL as electrodes is formed. The MOS capacitive element can be equivalently regarded as a MOS diode element. Consequently, when the delay line SSD-L10 is regarded as the equivalent circuit illustrated in FIG. 27B, by adjusting not only the resistance R of the wiring pattern LCH-L10(R) but also the capacitance C and the conductance G equivalently formed between the wiring pattern LCH-L10(R) and the well region WEL, the signal loss amount in the delay line SSD-L10 can be controlled. The insulating film GIO is formed by, for example, the gate insulating film of the MOSFET. In this case, since the dielectric constant of the silicon substrate is high, the delay amount per unit length of the delay line SSD-L10 can be increased, and the digital filter 1002P can be miniaturized.

Modification

Figure 39:
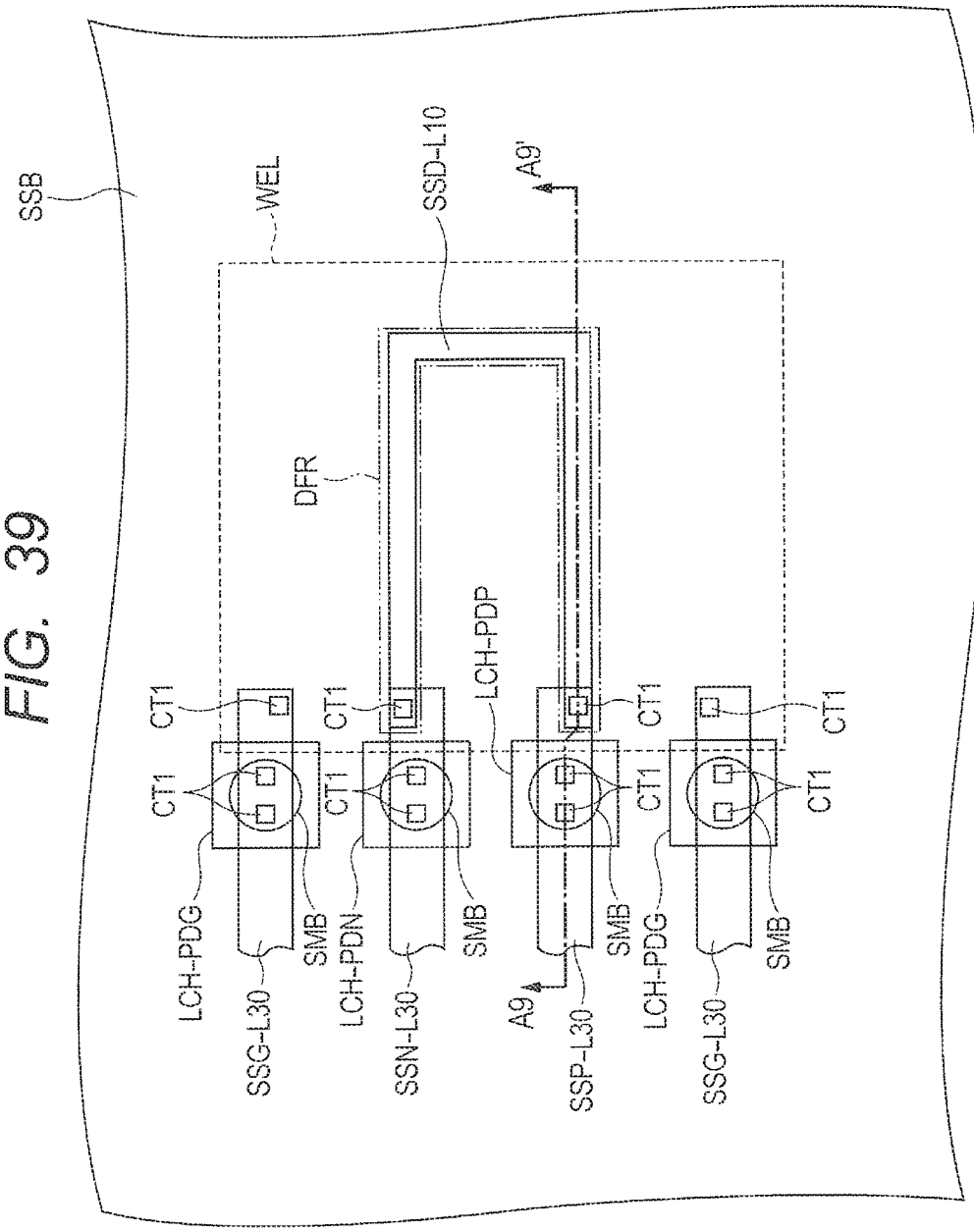
FIG. 39 is a plan view illustrating the structure of a digital filter according to a modification of the ninth embodiment.
Figure 40:
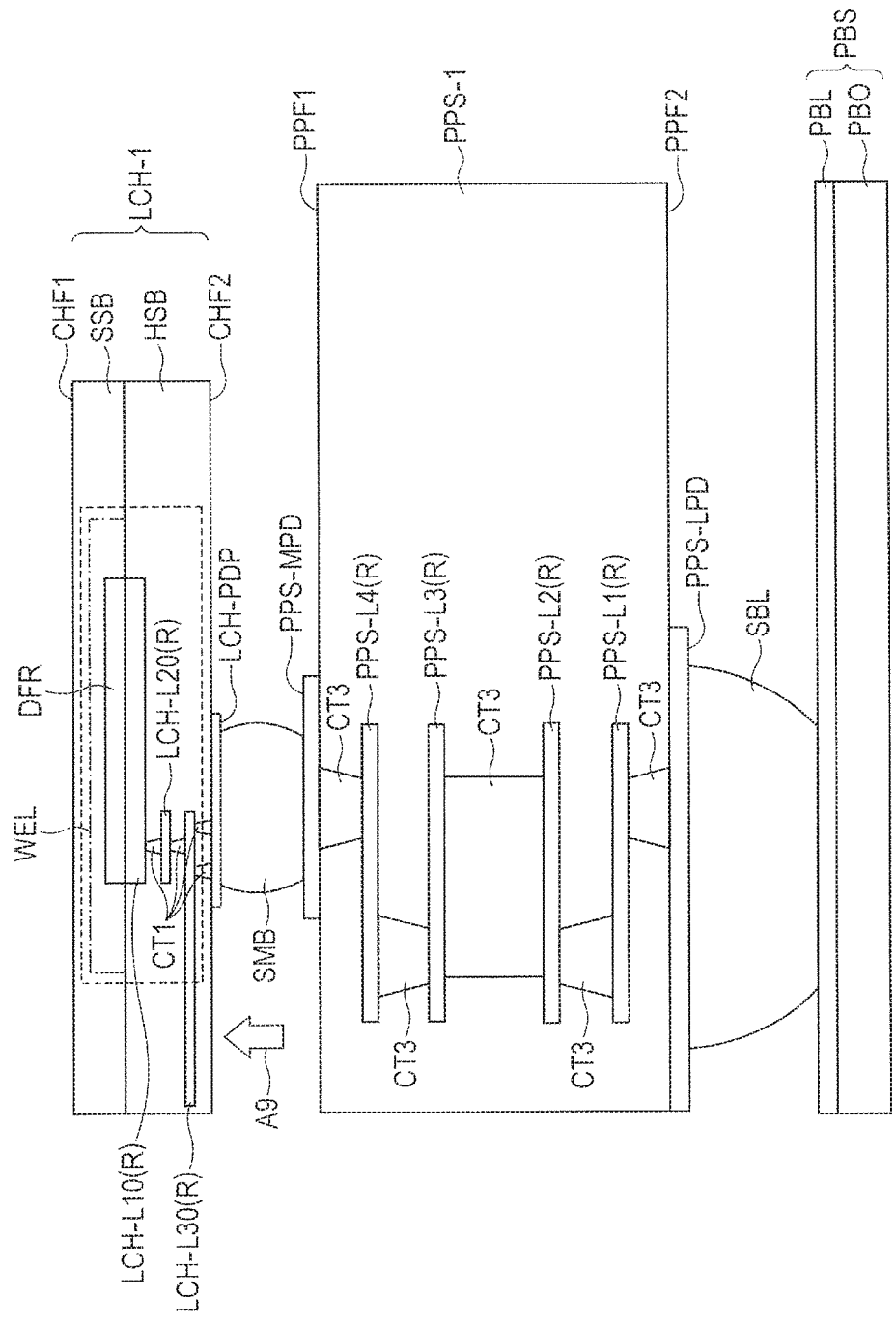
FIG. 40 is a cross section illustrating the structure of the digital filter according to the modification of the ninth embodiment.

FIGS. 39 and 40 are a plan view and a cross section illustrating the structure of a digital filter 1002P according to a modification of the ninth embodiment. Like FIG. 37, FIG. 39 is a plan view when the logic semiconductor chip LCH-1 is seen from the second main surface CHF2 side. The visual direction is expressed as the arrow A9 in FIG. 40. FIG. 40 is an A9-A9' cross section in FIG. 39. Like FIG. 38, FIG. 40 also illustrates the section of the package substrate PPS-1 and the print substrate PBS in the A9-A9' section.

Since FIGS. 39 and 40 are similar to FIGS. 37 and 38, the different points will be mainly described. In FIGS. 37 and 38, the predetermined voltage Vs is supplied to the well region WEL formed in the silicon substrate SSB, and the wiring pattern LCH-L10(R) disposed above the well region WEL via the insulating film GIO is used as the delay line SSD-L10.

In the modification illustrated in FIGS. 39 and 40, in the well region WEL to which the predetermined voltage Vs is supplied, a semiconductor region of a conduction type opposite to that of the well region WEL is formed. To the semiconductor region, the wiring pattern LCH-L10(R) is ohmic-coupled. The wiring pattern LCH-L10(R) is used as the delay line SSD-L10 as a component of the delay element DLN.

In FIG. 40, DFR indicates a semiconductor region formed in the well region WEL. For example, when the well region WEL is a P-type semiconductor region, the semiconductor region DFR is an N-type semiconductor diffusion region formed in the well region WEL. In plan view, the semiconductor region DFR is formed in a U shape as illustrated in FIG. 37. By the first conductive layer in the wiring layer HSB, the U-shaped wiring pattern LCH-L10(R) which overlaps the semiconductor region DFR is formed (in FIG. 39, indicated as delay line SSD-L10). The wiring pattern LCH-L10(R) is ohmic-coupled to the overlapped semiconductor region DFR (FIG. 40).

As illustrated in FIG. 40, one end of the wiring pattern LCH-L10(R) is coupled to the wiring pattern LCH-L30(R) as the signal line SSP-L30 via the contact CT1 and the wiring pattern LCH-L20(R) in the wiring layer HSB in the second layer. Similarly, the other end of the wiring pattern LCH-L10(R) is coupled to the wiring pattern as the signal line SSN-L30 via the contact CT1 and the wiring pattern in the second layer. In FIG. 39, to avoid complication of the diagram, the wiring pattern (for example, the wiring pattern LCH-L20(R)) formed by the second conductive layer is not drawn.

In the modification, since the semiconductor region DFR is formed in the well region WEL, a PN-junction diode element is formed by the semiconductor region DFR and the well region WEL. Since the predetermined voltage Vs is supplied to the well region WEL and the delay line SSD-L10(LCH-L10(R)) is ohmic-coupled to the semiconductor region DFR, the PN-junction diode element is coupled between the predetermined voltage Vs and the delay line SSD-L10. In the case of seeing the equivalent circuit (FIG. 27) of the delay element DLN, junction current flows in the PN junction diode. Consequently, the conductance G can be increased. Therefore, the signal loss in the delay element DLN can be increased, and the digital filter 1002P can be miniaturized. By controlling the inverse bias voltage supplied to the PN junction diode, the conductance G can be controlled, and the signal loss in the delay element DLN can be controlled.

Although relative permittivity of an oxide film is about 4, relative permittivity of silicon becomes about 12. Consequently, delay in the delay element DLN can be increased to about 1.7 times as the positive square root of (12/4), and the digital filter 1002P can be miniaturized.

In the ninth embodiment and its modification, when the resistance of the wiring pattern LCH-L10(R) is higher than a desired resistance value, for example, as illustrated in FIG. 16C, it is sufficient to couple a wiring pattern formed by the second conductive layer to the wiring pattern LCH-L10(R) in parallel.

In the ninth embodiment, the resistance R per unit length of the delay line SSD-L10 relative to the predetermined voltage Vs is made smaller than that of the signal line, and the conductance G per unit length of the delay line SSD-L10 to the predetermined voltage Vs is made higher.

Although the example of forming the digital filter in the logic semiconductor chip LCH-1 has been described, the invention is not limited to the example. For example, in the case of using a silicon interposer as the interposer INS-1, the well region WEL, the semiconductor region DFR, and the wiring pattern LCH-L10(R) described with reference to FIGS. 37 to 40 may be formed in the silicon interposer to configure the digital filter 1002P as described above.

Although the example of using the well region WEL as the electrode in the MOS capacitive element (equivalently, MOS diode element) has been described, the invention is not limited to the well region WEL but the silicon substrate SSB may be used. Further, the semiconductor region DFR configuring the PN junction diode element may be formed in, not the well region, but in the silicon substrate SSB.

Tenth Embodiment

Figure 41:
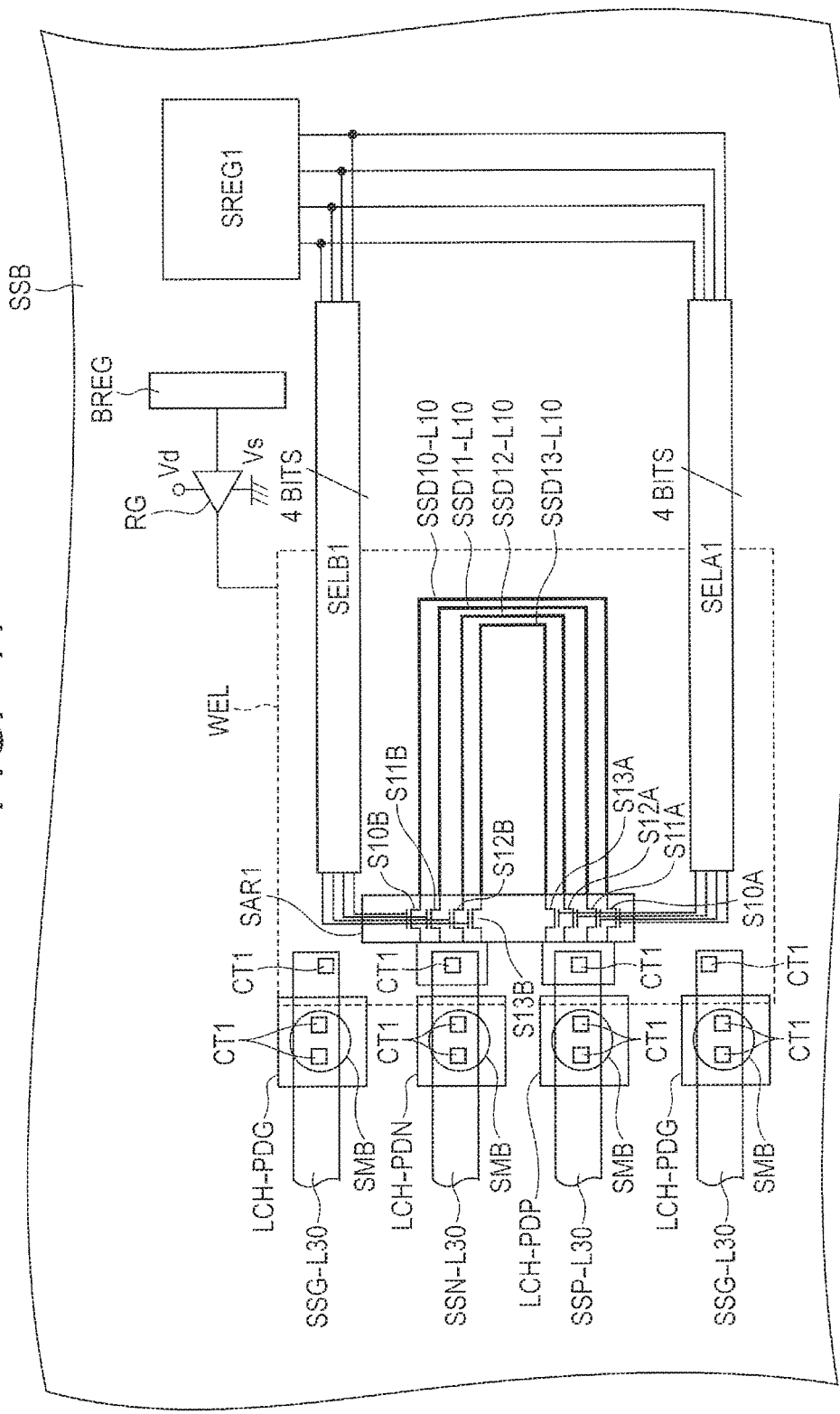
FIG. 41 is a block diagram illustrating the configuration of a semiconductor device according to a tenth embodiment.

FIG. 41 is a block diagram illustrating the configuration of a semiconductor device according to a tenth embodiment. In the tenth embodiment, as described in the ninth embodiment, the case that the digital filter 1002P is formed in the logic semiconductor chip LCH-1 will be described.

FIG. 41 is similar to FIG. 37 related to the ninth embodiment. First, the part of the same configuration of FIG. 41 as that of FIG. 37 will be described. The silicon substrate SSB, the well region WEL, the signal lines SSP-L30 and SSN-L30, the voltage wire SSG-L30, the microbump electrodes LCH-PDG, LCH-PDN, and LCH-PDP, the contact CT1, and the bump SMB in FIG. 41 are the same as those in FIG. 37. Consequently, their description will not be repeated.

In FIG. 37, above the well region WEL, the delay line SSD-L10 is disposed via the insulating film GIO, and the ends of the delay line SSD-L10 are coupled to the signal lines SSN-L30 and SSP-L30. On the other hand, in the tenth embodiment, a plurality of delay lines are disposed via the insulating film GIO above the well region WEL. Desired number of delay lines are selected from the plurality of delay lines, one end of each of the selected delay lines is coupled to the signal line SSP-L30, and the other end of the selected delay line is coupled to the signal line SSN-L30. Consequently, the selected number of delay lines are coupled in parallel between the signal lines SSP-L30 and SSN-L30. As a result, the digital filter 1002P having the characteristic of an arbitrary inverse transfer function can be provided.

FIG. 41 illustrates the case where the number of delay lines disposed above the well region via the insulating film GIO is four. In the diagram, reference numerals SSD10-L10 to SSD13-L10 are designated to the four delay lines. Ends of each of the delay lines SSD10-L10 to SSD13-L10 are coupled to the signal lines SSN-L30 and SSP-L30 via the contacts CT1 via a switch array SAR1.

The switch array SAR1 has MOSFETs S10A to S13A and MOSFETs S10B to S13B. The MOSFETs S10A to S13A and the MOSFETs S10B to S13B are paired and the number of pairs corresponding to the number of delay lines are provided. Specifically, the MOSFETs S10A and S10B are paired and the pair corresponds to the delay line SSD10-L10. The MOSFETs S11A and S11B are paired and the pair corresponds to the delay line SSD11-L10. Similarly, MOSFETs S12A and S12B are paired and the pair corresponds to the delay line SSD12-L10. The MOSFETs S13A and S13B are paired and the pair corresponds to the delay line SSD13-L10.

One end of the delay line SSD10-L10 is coupled to the signal line SSP-L30 via the MOSFET S10A in the corresponding pair, and the other end is coupled to the signal line SSN-L30 via the MOSFET S10B in the corresponding pair. One end of the delay line SSD11-L10 is coupled to the signal line SSP-L30 via the MOSFET S11A in the corresponding pair, and the other end is coupled to the signal line SSN-L30 via the MOSFET S11B in the corresponding pair. Similarly, one end of the delay line SSD12-L10 is coupled to the signal line SSP-L30 via the MOSFET S12A in the corresponding pair, and the other end is coupled to the signal line SSN-L30 via the MOSFET S12B in the corresponding pair. Further, one end of the delay line SSD13-L10 is coupled to the signal line SSP-L30 via the MOSFET S13A in the corresponding pair, and the other end is coupled to the signal line SSN-L30 via the MOSFET S13B in the corresponding pair.

The MOSFETs configuring the switch array SAR1 are set to the on state in accordance with delay line selection information stored in a delay line selection register SREG1. For example, in the case where the delay line selection information designates the delay line SSD10-L10, by selection signals SELA1 and SELB1 (each made of four bits) from the delay line selection register SREG1, the MOSFETs S10A and S10B configuring the pair corresponding to the delay line SSF-L10 are turned on, and the remaining MOSFETs S11A to S13A and S11B to S13B are turned off. In the case where the delay line selection information designates the delay lines SSD10-L10 and SSD12-L10, by the selection signals SELA1 and SELB1 from the delay line selection register SREG1, the MOSFETs S10A, S10B, S12A and S12B configuring the pairs corresponding to the delay lines are turned on, and the remaining MOSFETs S11A, S11B, S13A, and S13B are turned off. In such a manner, one or more of an arbitrary number of pairs of MOSFETs are turned on by the delay line selection information stored in the delay line selection register SREG1.

For example, when only the MOSFETs S10A and S10B are turned on, one end of the delay line SSD10-L10 is coupled to the signal line SSP-L30, and the other end of the delay line SSD10-L10 is coupled to the signal line SSN-L30. At this time, when the MOSFETs S12A and S12B are also turned on, one end of each of the delay lines SSD10-L10 and SSD12-L10 is coupled to the signal line SSP-L30, and the other end of each of the delay lines SSD10-L10 and SSD12-L10 is coupled to the signal line SSN-L30. In such a manner, one or more arbitrary delay lines are selected, one end of the one delay line or each of the plural delay lines is coupled to the signal line SSP-L30, and the other end is coupled to the signal line SSN-L30.

The delay lines SSD10-L10 to SSD13-L10 having a desired delay amount and a desired signal loss are provided. Delay line selection information of selecting one or more delay lines from the delay lines SSD10-L10 to SSD13-L10 is obtained in accordance with a proper loss amount of the delay element DLN, and the obtained delay line selection information is stored in a delay line selection register SREG1. Consequently, one or plural delay lines designated by the delay line selection information stored in the delay line selection register SREG1 is/are selected from the delay lines SSD10-L10 to SSD13-L10 and coupled between the signal lines SSP-L30 and SSN-L30.

The configuration illustrated in FIG. 41 is suitable to the case where the bit rate of differential signals propagating through the signal line is almost fixed. In this case, switching of delay lines by the delay line selection signal is used, for example, to adjust the loss amount of the delay element DLN. At this time, as will be described later in a modification, the delay amount of the delay element DLN is finely adjusted by adjusting bias information.

Since one or plural delay lines selected functions as the delay element DLN, in a case such that strength of equalization required changes, the inverse transfer function of the digital filter 1002P can be changed dynamically. Even at the same bit rate, for example, when the length of the signal line changes, attenuation which occurs in a signal channel between transmission and reception changes. When the attenuation increases, strong equalization operation is necessary. When the attenuation decreases, weak equalization operation is necessary. To make the equalization operation stronger, it is sufficient to select a delay line so that the loss amount of the delay element DLN decreases. On the other hand, to weaken the equalization operation, it is sufficient to select a delay line so that the loss amount of the delay element DLN increases.

Further, in the tenth embodiment, the voltage supplied to the well region WEL can be arbitrarily changed. Specifically, in the logic semiconductor chip LCH-1, in addition to the delay line selection register SREG1 and the switch array SAR1, a power supply circuit RG and a bias voltage register BREG are provided. On the basis of bias information stored in the bias voltage register BREG, the power supply circuit RG supplies, for example, as the bias voltage, a voltage between the predetermined voltage Vs and a voltage Vd whose voltage value is different from the predetermined voltage Vs to the well region WEL. By the operation, the voltage of the well region WEL can be set to an arbitrary voltage value. In the case of the equivalent circuit illustrated in FIG. 27B, the values of the capacitance C and the conductance G which are coupled in parallel to each other are changed by changing the bias voltage of the well region WEL. For example, in the case of equivalently regarding as a MOS diode element, by changing the bias voltage for inverse biasing the MOS diode element, the values of the capacitance C and the conductance G can be controlled. Therefore, the characteristic of the inverse transfer function of the delay element DLN can be changed.

In the tenth embodiment, by delay line selection information, the resistance R of the equivalent circuit illustrated in FIG. 27B is mainly changed. By the bias information, the capacitance C and the conductance G o the equivalent circuit are mainly changed. Consequently, the inverse transfer function can be adjusted with higher precision, and equalization can be performed with high precision.

Although the case of adjusting the delay element DLN by using both the delay line selection information and the bias information has been described in the tenth embodiment, the invention is not limited to the case. The delay element DLN may be adjusted by one of the delay selection information and the bias information. In the case of performing adjustment by the bias information, it is arranged not to supply the predetermined voltage Vs to the voltage wire SSG-L30 or arranged to electrically separate the voltage wire SSG-L30 and the well region WEL from each other.

Modification

Figure 42:
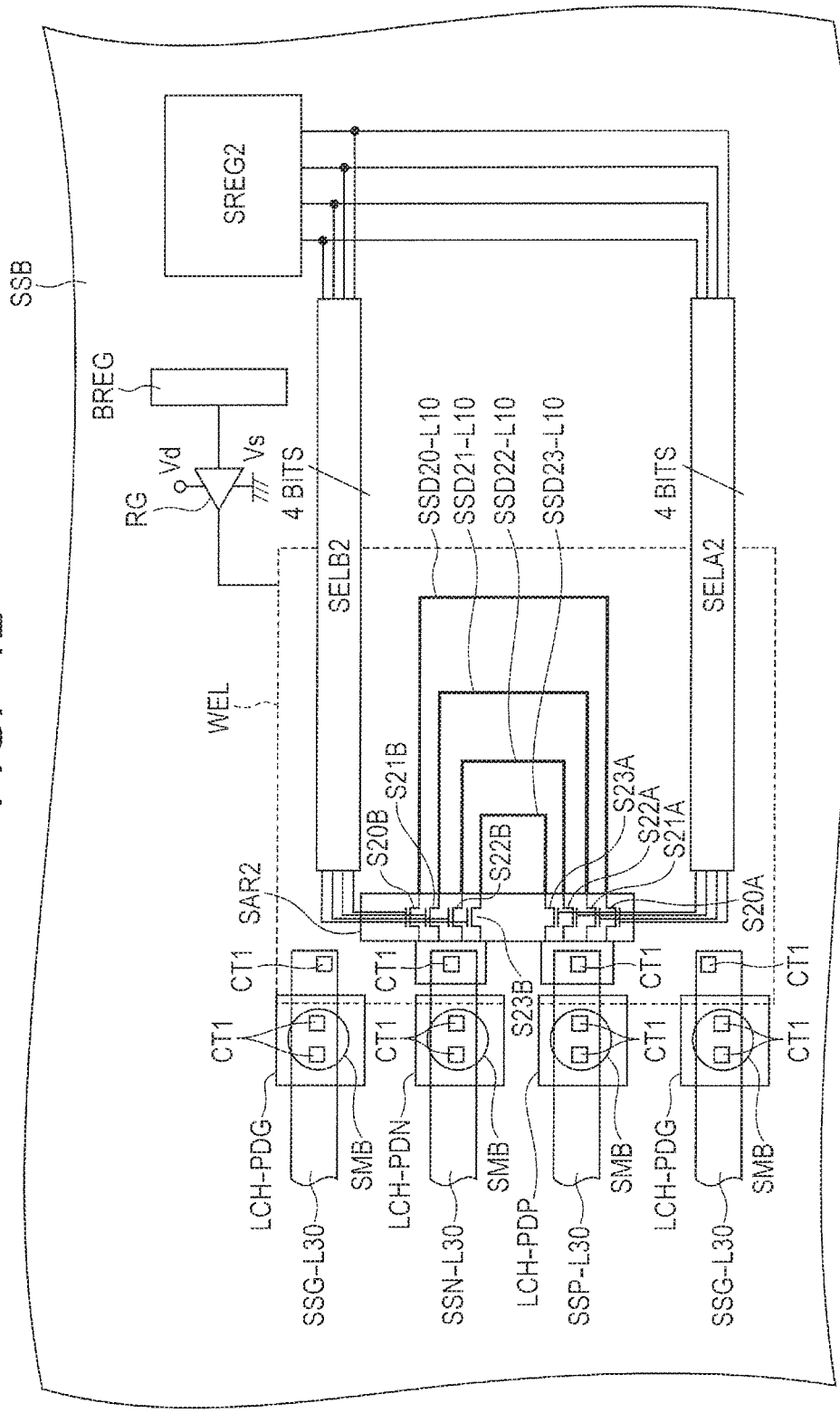
FIG. 42 is a block diagram illustrating the configuration of a semiconductor device according to a modification of the tenth embodiment.

FIG. 42 is a block diagram illustrating the configuration of a semiconductor device according to a modification of the tenth embodiment. Since FIG. 42 is similar to FIG. 41, only the different points will be mainly described. The parts different from FIG. 41 are a switch array, a delay line, and a delay line selection register. Since the other part is the same as that of FIG. 41, its description will not be repeated in principle.

The configuration illustrated in FIG. 41 is suitable to the case where the bit rate of differential signals is almost fixed. In this case, since the bit rate is almost fixed, switching of delay lines by a delay line selection signal is used to adjust, for example, the loss amount of the delay element DLN. The bias information is used to finely adjust the delay amount of the delay element DLN.

On the other hand, the modification is suitable to the case where they are a plurality of bit rates of differential signals, and the bit rate changes dynamically.

Also in the embodiment, like FIG. 41, delay lines SSD20-L10 to SSD23-L10 are disposed above the well region WEL via the insulating film GIO. Each of the delay lines SSD20-

L10 to SSD23-L10 is formed so as to have an appropriate delay amount and an appropriate loss amount in advance so that it operates the delay element DLN suited to each of bit rates. For example, the delay line SSD20-L10 is formed so that the delay line SSD20-L10 is suitable as the delay element DLN at a first bit rate. The delay line SSD21-L10 is formed so that the delay line SSD21-L10 is suitable as the delay element DLN at a second bit rate which is different from the first bit rate. Similarly, the delay line SSD22-L10 is formed so as to be adapted to a third bit rate, and the delay line SSD23-L10 is formed so as to be adapted to a fourth bit rate.

A switch array SAR2 has, like the switch array SAR1, a set of MOSFETs corresponding to the delay lines SSD20-L10 to SSD23-L10. In FIG. 42, a set corresponding to the delay line SSD20-L10 is comprised of MOSFETs S20A and S20B, and a set corresponding to the delay line SSD21-L10 is comprised of MOSFETs S21A and S21B. Similarly, a set corresponding to the delay line SSD22-L10 is comprised of MOSFETs S22A and S22B, and a set corresponding to the delay line SSD23-L10 is comprised of MOSFETs S23A and S23B.

One end of each of the delay lines SSD20-L10 to SSD23-L10 is coupled to the signal line SSP-L30 via the MOSFETs S20A to S23A of the corresponding set. On the other hand, the other end of each of the delay lines SSD20-L10 to SSD23-L10 is coupled to the signal line SSN-L30 via the MOSFETs S20B to S23B of the corresponding set.

In the modification, a delay line selection register SREG2 stores delay line selection information for selecting one of the delay lines SSD20-L10 to SSD23-L10. By selection signals SELA2 and SELB2 (each made of four bits) based on the delay line selection information, a delay line designated by the delay line selection information is selected, and the selected delay line is coupled between the signal lines SSP-L30 and SSN-L30 by the switch array SAR2.

For example, when the delay line SSD20-L10 is designated by the delay line selection information, the MOSFETs S20A and S20B configuring the set corresponding to the selection line SSD20-L10 are turned on by the selection signals SELA2 and SELB2, and the remaining MOSFETs S21A to S23A and S21B to S23B are turned off. When the delay line SSD22-L10 is designated by the delay line selection information, the MOSFETs S22A and S22B configuring the set corresponding to the selection line SSD22-L10 are turned on by the selection signals SELA2 and SELB2, and the remaining MOSFETs S20A, S21A, S23A, S20B, S21B, and S23B are turned off. In such a manner, only MOSFETs configuring a set are turned on.

By turning on the MOSFETs of the set corresponding to the delay line designated by the delay line selection information, only one delay line designated by the delay line selection signals in the delay lines SSD20-L10 to SSD23-L10 is electrically coupled between the signal lines SSN-L30 and SSP-L30.

Consequently, even the bit rate of the differential signal changes, for example, from a first bit rate to a third bit rate, by changing the delay line selection information stored in the delay line selection register SREG2 from the information designating the delay line SSD20-L10 corresponding to the first bit to the information designating the delay line SSD23-L10 corresponding to the third bit rate, equalization can be properly performed even when the bit rate changes.

As described in FIG. 41, by changing the bias information stored in the bias voltage register BREG, the delay amount of the delay element DLN can be finely adjusted at each bit rate. Also in the modification, in the case of performing the adjustment with the bias information, it is arranged not to supply the predetermined voltage Vs to the voltage wire SSG-L30 or arranged to electrically separate the voltage wire SSG-L30 and the well region WEL.

Although the example of configuring the delay element DLN by using the delay line disposed in the well region WEL via the insulating film GIO has been described in the tenth embodiment and its modification, the present invention is not limited to the example. For example, in the tenth embodiment and its modification, a delay line which is ohmic-coupled to the semiconductor region DEF formed in the well region WEL may be used as a delay line as described in the modification of the ninth embodiment.

From the viewpoint of controlling the delay element DLN, it can be regarded that the control circuit is comprised of the delay line selection register SREG1, the bias voltage register BREG, the power supply circuit RG, and the switch array SAR1 illustrated in FIG. 41. Similarly, it can be regarded that the control circuit is comprised also of the delay line selection register SREG2, the bias voltage register BREG, the power supply circuit RG, and the switch array SAR2 illustrated in FIG. 42.

In FIGS. 41 and 42, the delay element DLN has a plurality of delay lines. Since the time of signal delay in the delay element DLN, that is, a round-trip signal delay can be changed by the control circuit, the delay element DLN can be regarded as a variable delay element. In other words, it can be regarded that the delay time of the delay element DLN as a variable delay element is determined by the control circuit. In this case, by determining bias voltage supplied to the diode element included in the delay element DLN and/or a delay line coupled between the signal lines by the control circuit, the delay time of the variable delay element is determined.

Although the delay element DLN to which a pair of differential signals is supplied has been described as an example in the tenth embodiment, the delay line selection register, the bias voltage register, the power supply circuit, and the switch array described in the tenth embodiment can be also applied to the third or fourth embodiment. That is, they can be also applied to a delay element corresponding to a single-end signal. In this case, in the third or fourth embodiment, a plurality of delay lines are provided and a delay element is comprised of a delay line designated by the delay line selection information stored in the delay line selection register. In a manner similar to the tenth embodiment, a well region is formed in the silicon substrate SSB and, by adjusting the voltage of the well region by the power supply circuit and the bias voltage register, the delay amount of the delay element is adjusted.

The delay element DLN described in the first to sixth embodiments is coupled to a signal line. From the viewpoint of coupling to a signal line, the delay element can be considered as a kind of so-called short stubs. However, the delay element described in the embodiments is quite different from a short stub for the following reason.

A short stub does not function sufficiently when its loss is large. On the other hand, the delay element is set so that its loss becomes large. In the case of the equivalent circuit illustrated in FIG. 1B, the delay element is set so that the resistance R or the parallel conductance G becomes large. In principle, the length of a short stub is set to around ¼ of an electromagnetic wave length to the input signal frequency. On the other hand, the delay element is not directly related to the electromagnetic wave length and its length is not determined by the electromagnetic wave length. The length of the delay element is determined by, for example, time of a round-trip signal delay. The round-trip signal delay is also determined by a fraction of an integer of the one data width interval, not by the electromagnetic wave length.

Further, when a short stub functions as a short stub, the line length from a signal source to the short stub which is long enough to be regarded as a transmission path is necessary. For example, the line length from the signal source to the short stub has to be set to ¼ of the electromagnetic wave length. On the other hand, desirably, the delay element is coupled near the transmission buffer circuit (signal source) or the reception buffer circuit so that it is not regarded as a transmission path. That is, it is desirable to couple the delay element in a position where the delay element does not function as a short stub.

In the first to sixth embodiments, the example of forming the digital filter in the interposer or the semiconductor chip has been described. It is also possible to form the digital filter 1002 described in the first to sixth embodiments in a small-sized interposer and bury the small-sized interposer in the package substrate or the print substrate.

Although the example of wired-OR coupling the delay element DLN near a pair of input terminals of the reception buffer circuit has been described in the seventh to tenth embodiments, the present invention is not limited to the example. For example, one end of the delay element DLN may be wired-OR coupled to one of a pair of output terminals of the transmission buffer circuit, and the other end of the delay element DLN may be wired-OR coupled to the other output terminal of the transmission buffer circuit. In this case, before the components of differential signals are transmitted by a pair of signal lines, waveform shaping with the inverse transfer function to equalize transfer functions of the pair of signal lines is performed. Therefore, the waveform of the differential signal components with reduced distortion is supplied to a pair of input terminals of the reception buffer circuit. At this time, the components of the common mode signal are transmitted to a pair of input terminals of the reception buffer circuit without being equalized. As a result, the components of the common mode signal can be prevented from being erroneously recognized.

In the seventh and eighth embodiments, the example of using the wiring pattern formed in the interposer as the delay line has been described. However, the invention is not limited to the example. For example, the interposer INS-1 is not limited to a silicon interposer but may be an interposer using an organic substrate or glass substrate. The wiring pattern formed in the logic semiconductor chip may be used as a delay line. Further, a small-sized semiconductor chip (semiconductor chip for equalization) in which the delay line described in the seventh to tenth embodiments and the voltage wire disposed along the delay line is provided, and the semiconductor chip for equalization may be buried in the package substrate PPS-1 and/or the interposer INS-1. That is, the semiconductor chip for equalization may be disposed so as to be buried between the first main surface PPF1 and the second main surface PPF2 of the package substrate PPS-1. The semiconductor chip for equalization may be disposed so as to be buried between the first main surface INF1 and the second main surface of the interposer INS-1.

Supplemental Notes

In the specification, a plurality of inventions are disclosed. Some of them are described in the scope of claims but other inventions are also disclosed. Some representative ones will be described as follows.

(A) A semiconductor device comprises:
a pair of differential signal lines;
a first circuit which is coupled to an end of each of the pair of the differential signal lines and to/from which differential signals are supplied from/to the pair of differential signal lines; and
a delay element having one end which is wired-OR coupled to an end of one of the pair of differential signal lines and another end which is wired-OR coupled to an end of the other differential signal line of the pair of differential signal lines, and which shapes waveform of a differential signal at the end of the pair of differential signal lines.

(B) In the semiconductor device described in (A), the delay element has a delay line having a pair of ends, one end of the delay line is, as one end of the delay element, is wired-OR coupled to an end of one of the differential signal lines, and the other end of the delay line is, as the other end of the delay element, is wired-OR coupled to an end of the other differential signal line, and
the semiconductor device has a voltage wire which is disposed along the delay line and to which predetermined voltage is supplied.

(C) In the semiconductor device described in (B),
the delay line is set so that a round-trip signal delay between a signal input to the one end or the other end and an output signal output from the one end or the other end becomes twice or a fraction of an integer of time of one data with interval of the signal.

(D) The semiconductor device described in (A), further comprises a diode element, in which the delay element is comprised of the diode element.

(E) In the semiconductor device described in (A), the delay element is a variable delay element in which delay time can be changed, and
the semiconductor device includes a control circuit determining delay time of the variable delay element.

(F) In the semiconductor device described in (E), the semiconductor device has a diode element, the variable delay element includes the diode element, and bias voltage supplied to the diode element is set by the control circuit.

(G) In the semiconductor device described in (E), the variable delay element has a plurality of delay lines, and a delay line selected by the control circuit is coupled between ends of the pair of differential signal lines.

(H) A semiconductor device comprises:
a first semiconductor chip having a main surface over which a pair of electrodes to/from which differential signals are input/output; and
an interposer having a first main surface over which a pair of electrodes is formed and a second main surface which is opposed to the first main surface and over which a pair of second electrodes electrically coupled to the pair of the first electrodes is formed, and mounted so that a main surface of the first semiconductor chip faces the first main surface so that the pair of electrodes of the first semiconductor chip are coupled to the pair of first electrodes,
in which when differential signals are transmitted between the pair of second electrodes and the pair of electrodes, the differential signals are shaped by a delay line having one end which is wired-OR coupled to one of the pair of electrodes and the other end which is wired-OR coupled to the other electrode of the pair of electrodes, the differential signals are shaped.

(I) The semiconductor device described in (H), further comprises a voltage wire which is disposed along the delay line and to which predetermined voltage is supplied.

(J) In the semiconductor device described in (I), the delay line and the voltage wire are wires formed in the first semiconductor chip.

(K) In the semiconductor device described in (I), the delay line and the voltage wire are wires formed in the interposer.

(L) The semiconductor device described in (I), further comprises a semiconductor chip for equalization in which the delay line and the voltage wire are formed.

(M) In the semiconductor device described in (L), the semiconductor chip for equalization is disposed between the first and second main surfaces of the interposer.

(N) A semiconductor device comprises:

a first semiconductor chip having a main surface over which a pair of electrodes to/from which differential signals are input/output is formed;

a first interposer having a first main surface over which a pair of first electrodes is formed, a second main surface which faces the first main surface and over which a pair of second electrodes electrically coupled to the pair of first electrodes is formed, and mounted so that the main surface of the first semiconductor chip faces the first main surface so that the pair of electrodes of the first semiconductor chip is coupled to the first electrode;

a substrate having a main surface opposed to the second main surface of the first interposer, a pair of third electrodes formed over the main surface, a pair of fourth electrodes formed over the main surface, and a wiring pattern electrically coupling the pair of third electrodes and the pair of fourth electrodes; and a delay line having one end coupled to one of the pair of electrodes of the first semiconductor chip and another end coupled to the other electrode of the pair of electrodes of the first semiconductor chip, in which the pair of third electrodes is electrically coupled to the pair of second electrodes and, when a signal is transmitted between the set of fourth electrodes and the pair of electrodes of the first semiconductor chip, the differential signal is shaped by the delay line.

(O) The semiconductor device described in (N), further comprises:

a second semiconductor chip having a main surface over which a pair of electrodes is formed; and a second interposer having a first main surface over which a pair of fifth electrodes is formed and a second main surface which is opposed to the first main surface and over which a pair of sixth electrodes electrically coupled to the pair of fifth electrodes is formed, the main surface of the second semiconductor chip being mounted so as to be opposed to the first main surface so that the pair of electrodes of the second semiconductor chip is electrically coupled to the pair of fifth electrodes, in which a second main surface of the second interposer faces the main surface of the substrate, the pair of sixth electrodes of the second interposer is electrically coupled to the pair of fourth electrodes, the first semiconductor chip has a first circuit amplifying a signal from the pair of electrodes of the first semiconductor chip, and the second semiconductor chip has a second circuit outputting a serial signal to the pair of electrodes of the second semiconductor chip.

(P) The semiconductor device described in (O), further comprises a voltage wire which is disposed along the delay line and to which predetermined voltage is supplied.

Although the invention achieved by the inventors of the present invention has been concretely described on the basis of the embodiments, obviously, the present invention is not limited to the embodiments but can be variously changed without departing from the gist. For example, a logic semiconductor chip was described as a semiconductor chip. However, the semiconductor chip is not limited to a logic semiconductor chip. In addition to the digital filter described in the first to sixth embodiments, a semiconductor chip may be provided with an analog filter circuit and/or a digital filter circuit. In this case, by the analog filter circuit and/or the digital filter circuit, precision of restoration of signals can be further improved. For example, the eye patterns illustrated in FIGS. 9 and 10 can be made visible.

What is claimed is:

1. A semiconductor device comprising:
a signal line;
a first circuit which is coupled to an end of the signal line and to/from which a signal is supplied from/to the signal line; and
a delay element which is wired-OR coupled to an end of the signal line and which shapes a waveform of a signal at the end of the signal line,
wherein the signal line has a first signal line and a second signal line transmitting differential signals which change complementarily,
wherein the first circuit has a differential circuit coupled to the first and second signal lines, and
wherein the delay element has one end which is wired-OR coupled to an end of the first signal line and other end which is wired-OR coupled to an end of the second signal line.

2. The semiconductor device according to claim 1,
wherein the delay element has a delay line having one end which is wired-OR coupled to an end of the signal line and other end coupled to predetermined voltage, and
wherein the waveform of the signal at the end of the signal line is shaped by an output signal corresponding to the signal input to the one end.

3. The semiconductor device according to claim 2, wherein the delay line is set so that signal delay between a signal input to the one end and an output signal output from the one end becomes a fraction of an integer of time of one data width interval of the signal at the end of the signal line.

4. The semiconductor device according to claim 3, further comprising:
a second circuit supplying the signal to the signal line,
wherein the signal from the signal line is supplied to the first circuit.

5. The semiconductor device according to claim 3, further comprising:
a second circuit to which the signal is supplied via the signal line,
wherein the first circuit supplies the signal to an end of the signal line, and
wherein the delay line adjusts the signal at the end by the output signal, thereby supplying a shaped signal to the second circuit.

* * * * *